United States Patent
Kawata et al.

(10) Patent No.: US 6,410,365 B1
(45) Date of Patent: Jun. 25, 2002

(54) SEMICONDUCTOR DEVICE WITH TWO STACKED CHIPS IN ONE RESIN BODY AND METHOD OF PRODUCING

(75) Inventors: Youichi Kawata, Higashiyamato; Kouji Koizumi, Hinode-machi; Michiaki Sugiyama, Tokyo; Atsushi Fujishima, Kodaira; Yasuyuki Nakajima, Akishima; Takatoshi Hagiwara, Iruma, all of (JP)

(73) Assignees: Hitachi, Ltd., Tokyo; Hitachi ULSI Systems Co., Ltd., Kodaira, both of (JP)

( * ) Notice: Subject to any disclaimer, the term of this patent is extended or adjusted under 35 U.S.C. 154(b) by 0 days.

(21) Appl. No.: 09/322,915

(22) Filed: Jun. 1, 1999

(30) Foreign Application Priority Data

Jun. 1, 1998 (JP) .............................. 10-151254
Mar. 2, 1999 (JP) .............................. 11-053969

(51) Int. Cl.⁷ ............................... H01L 21/50
(52) U.S. Cl. ...................... 438/123; 438/124
(58) Field of Search ................. 438/107, 123, 438/124, 106, 109, 118, 121, 127

(56) References Cited

U.S. PATENT DOCUMENTS

| | | | |
|---|---|---|---|
| 5,068,712 A | | 11/1991 | Murakami et al. |
| 5,147,815 A | * | 9/1992 | Casto |
| 5,508,232 A | | 4/1996 | Ueda et al. |
| 5,527,740 A | * | 6/1996 | Golwalkar et al. |
| 5,530,286 A | | 6/1996 | Murakami et al. |
| 5,541,447 A | * | 7/1996 | Maejima et al. |
| 5,614,441 A | * | 3/1997 | Hosokawa et al. |
| 5,646,829 A | * | 7/1997 | Sota |
| 5,677,567 A | * | 10/1997 | Ma et al. |
| 5,793,108 A | * | 8/1998 | Nakanishi et al. |
| 5,894,107 A | | 4/1999 | Lee et al. |
| 6,252,299 B1 | * | 6/2001 | Masuda et al. |

FOREIGN PATENT DOCUMENTS

| | | |
|---|---|---|
| JP | 758281 | 3/1995 |
| JP | 1084071 | 3/1998 |

OTHER PUBLICATIONS

H. Nakanishi et al., "Development of High Density Memory IC Package by Stacking IC Chips," Proceedings of the 45th Electronic Components and Technology Conference, pp. 634–640, May, 1995.*

* cited by examiner

Primary Examiner—Olik Chaudhuri
Assistant Examiner—Stephen W. Smoot
(74) Attorney, Agent, or Firm—Antonelli, Terry, Stout & Kraus, LLP

(57) ABSTRACT

A semiconductor device according to this invention, wherein two semiconductor chips are sealed by one resin body using two lead frames, includes a wide part extending in the width direction of dam bars, the width of one dam bar being narrower than the width of another dam bar, and the two lead frames are joined by welding outside the resin body after sealing them with resin.

4 Claims, 53 Drawing Sheets

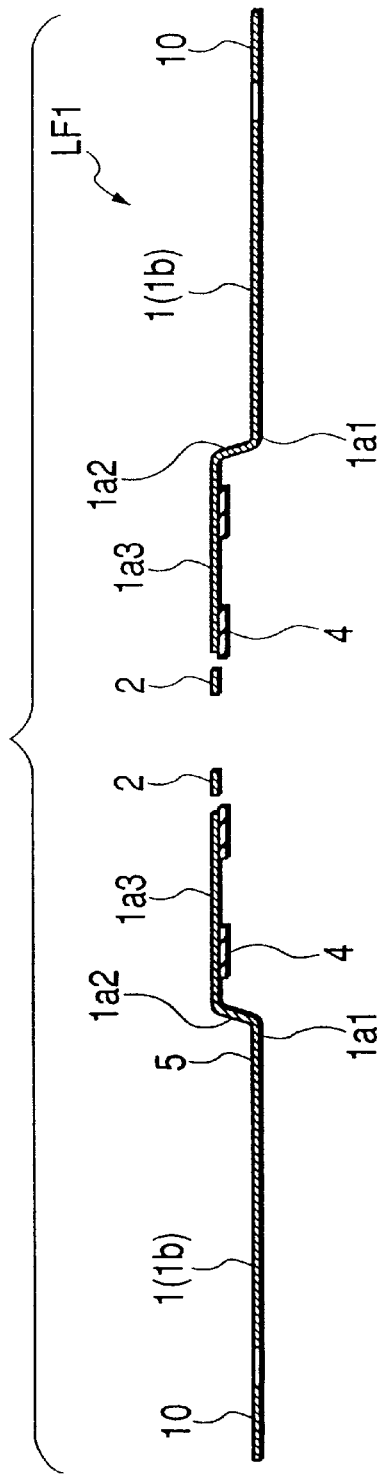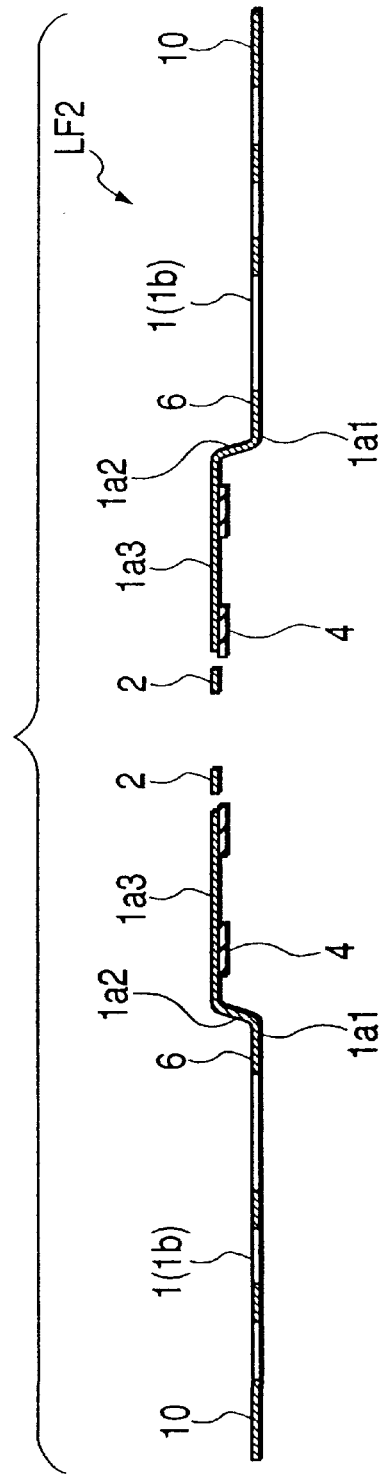

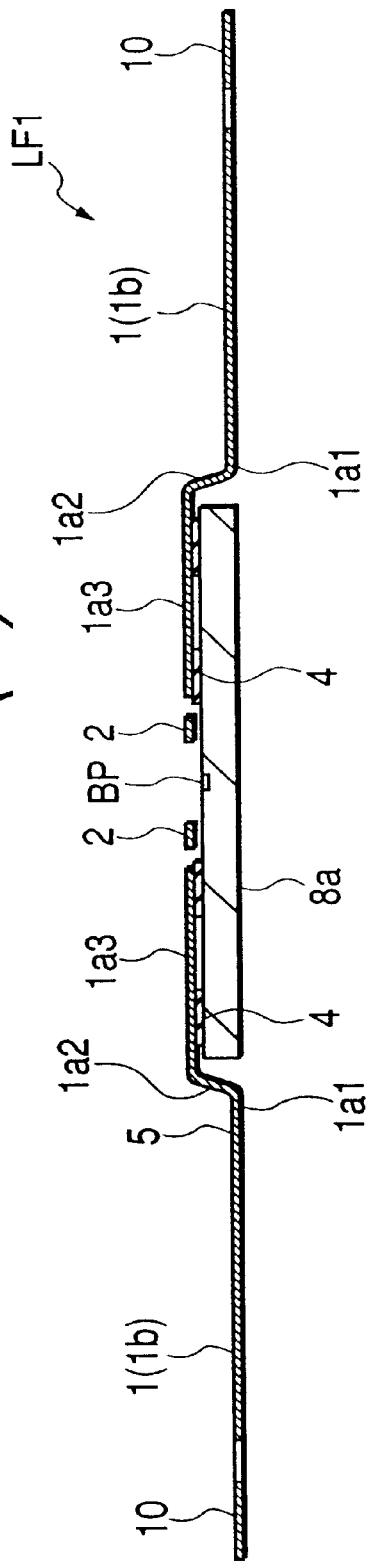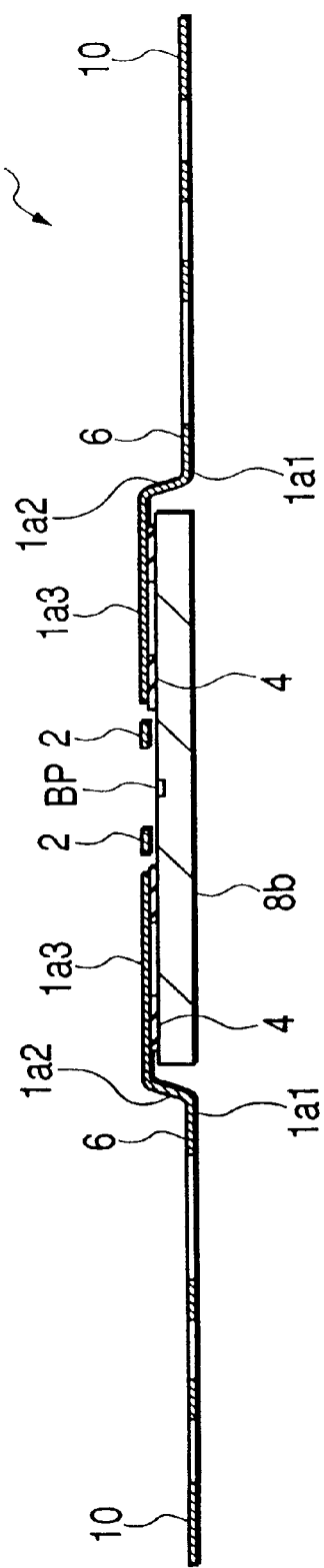

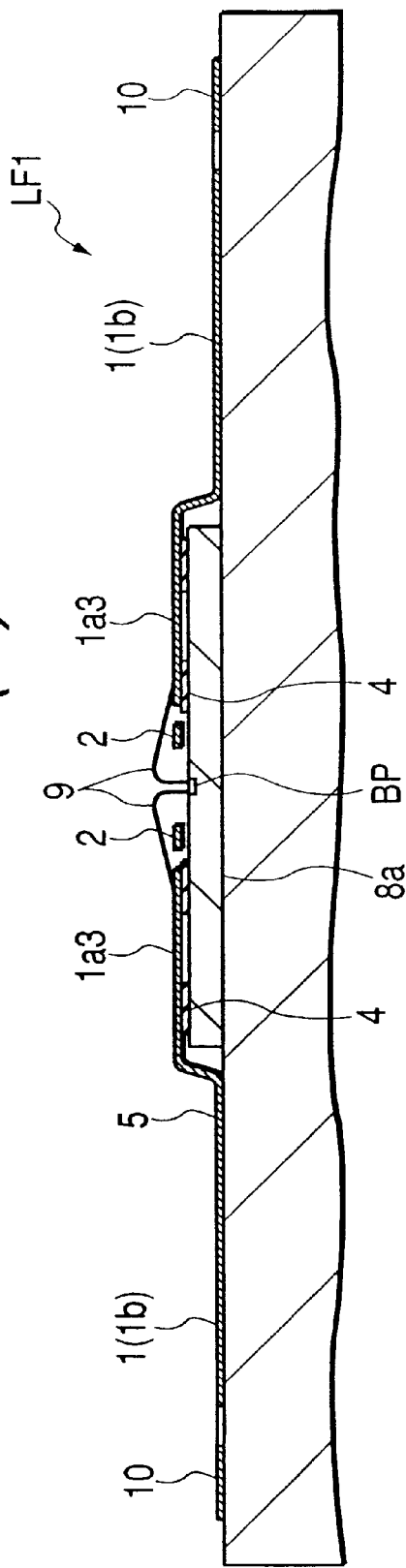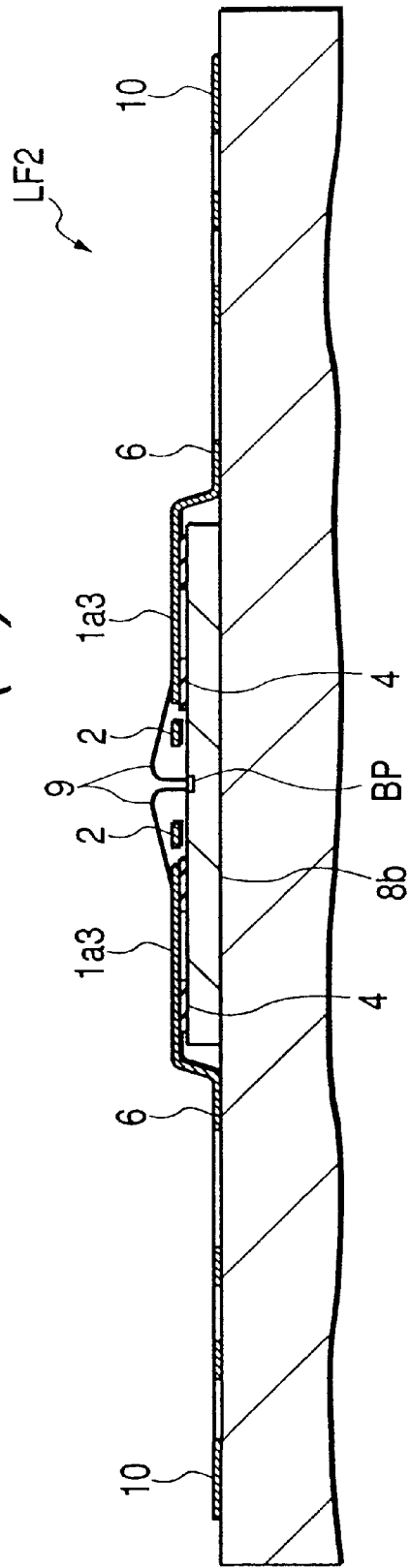

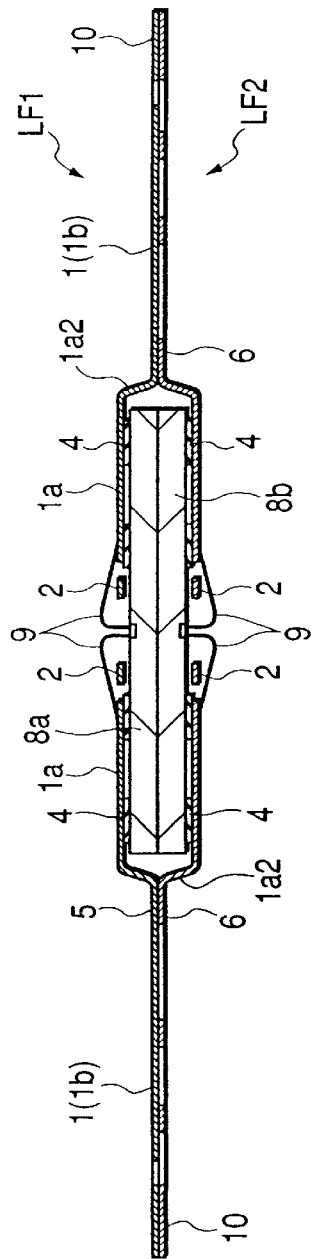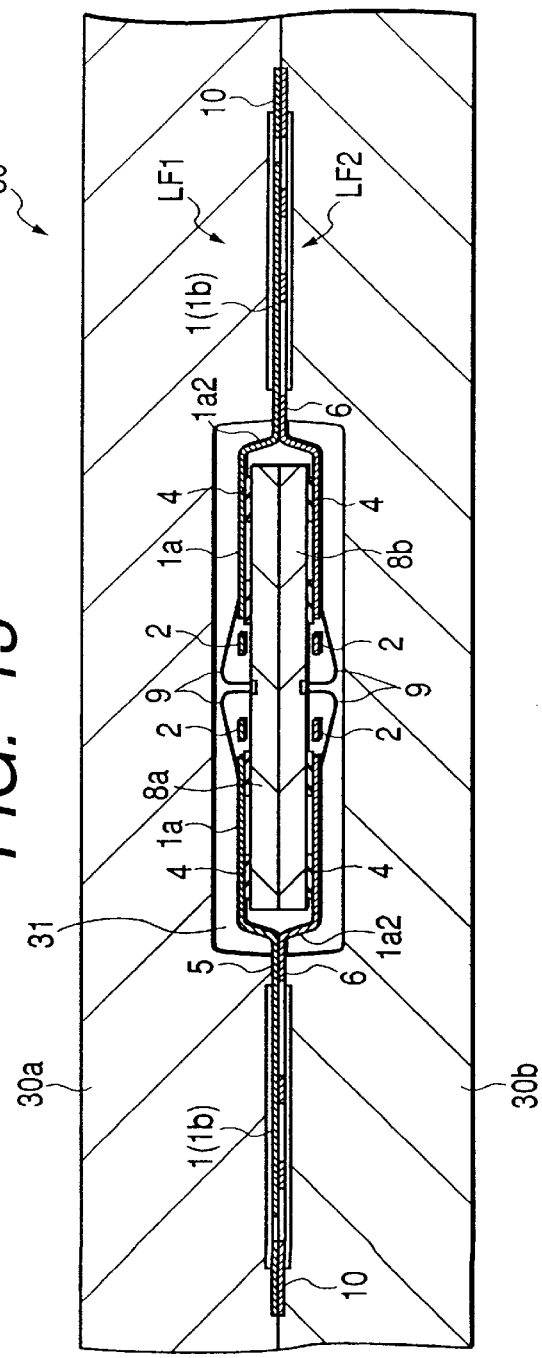

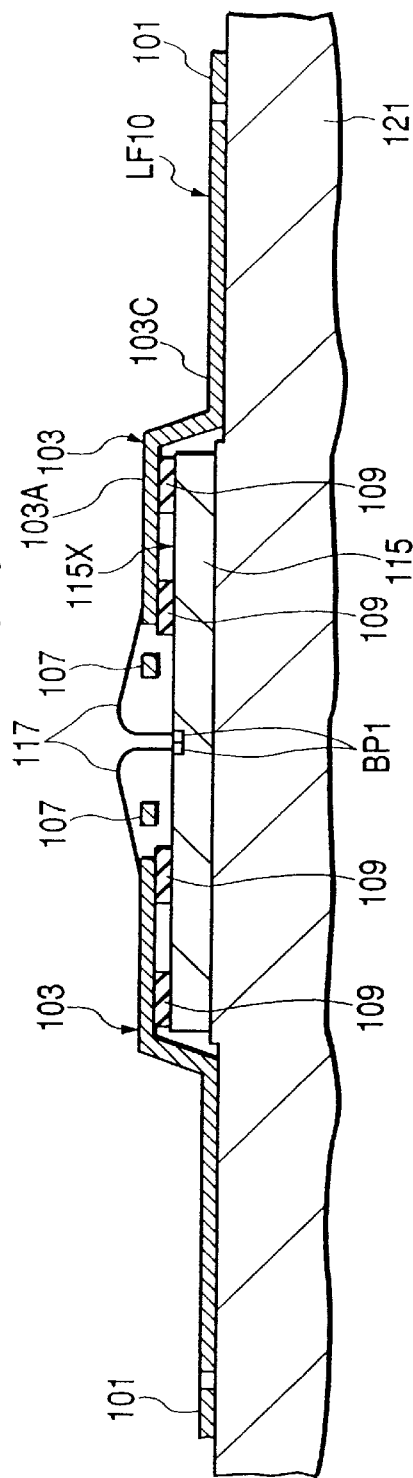
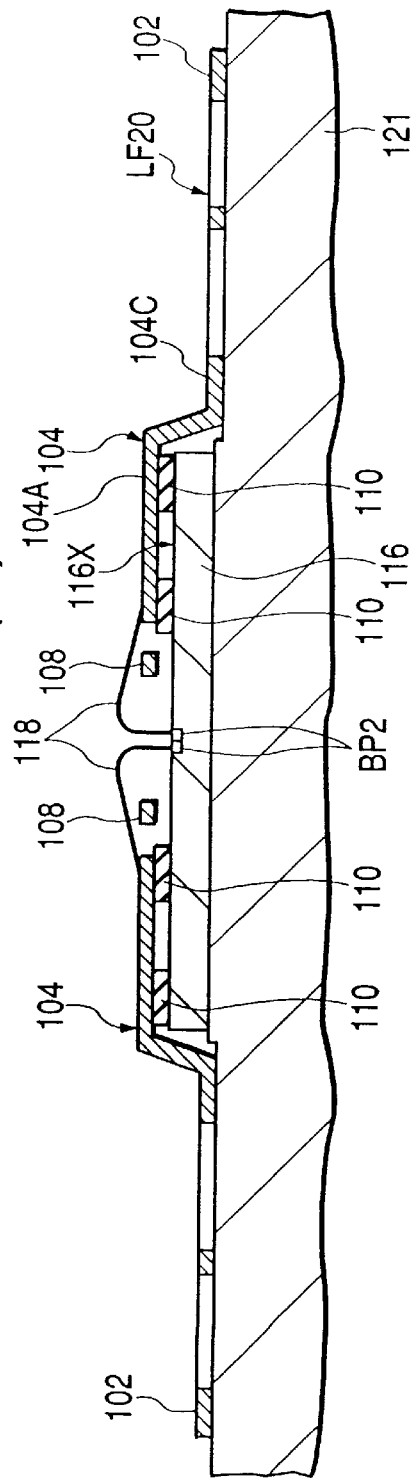
FIG. 36(A)
FIG. 36(B)

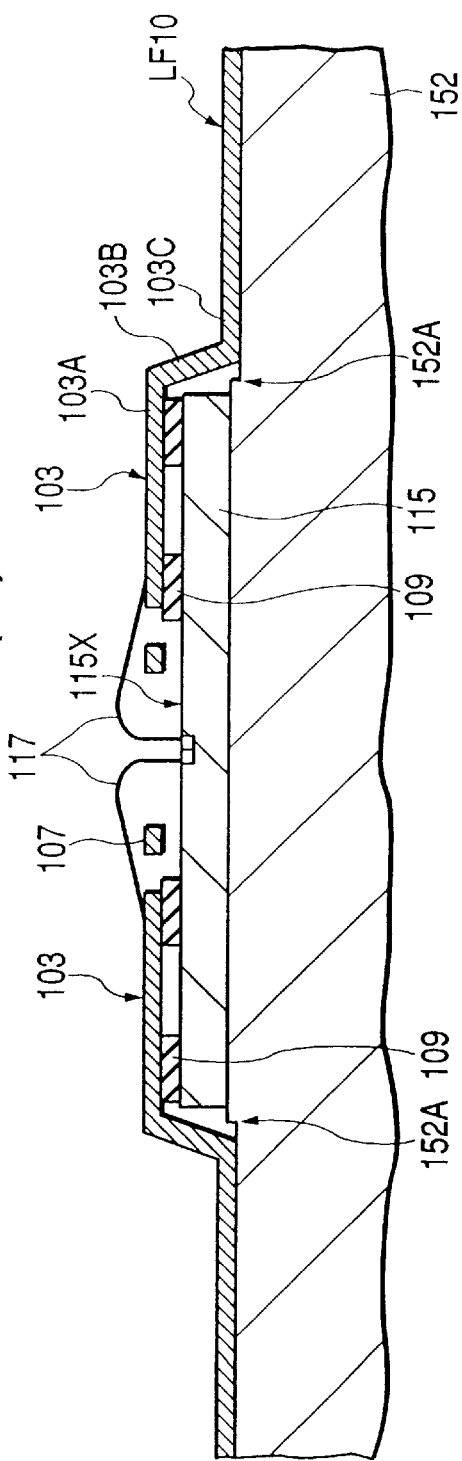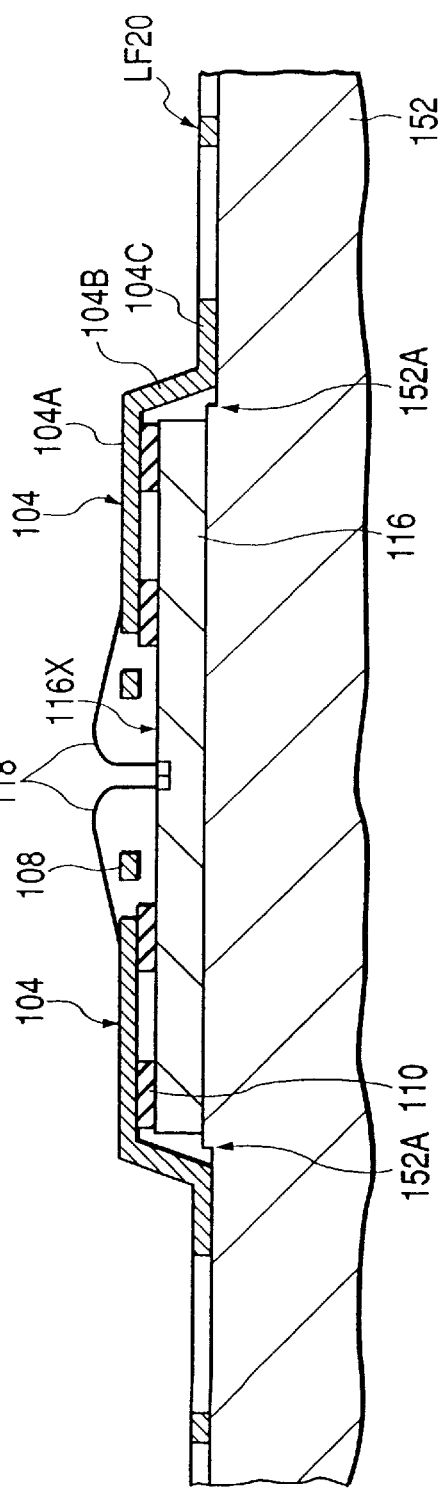

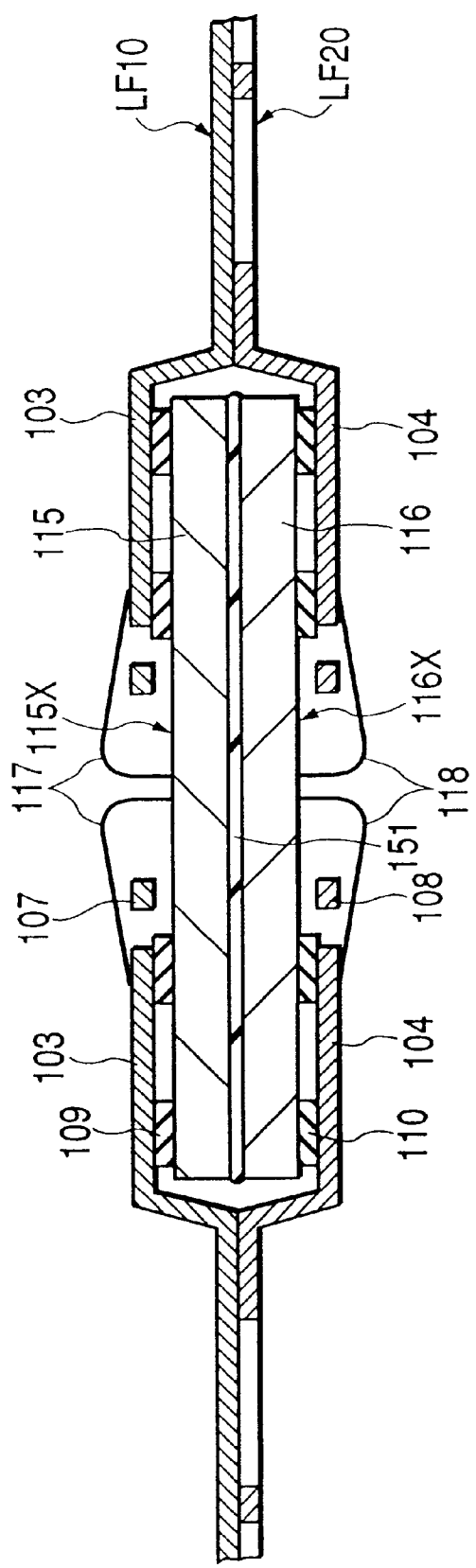

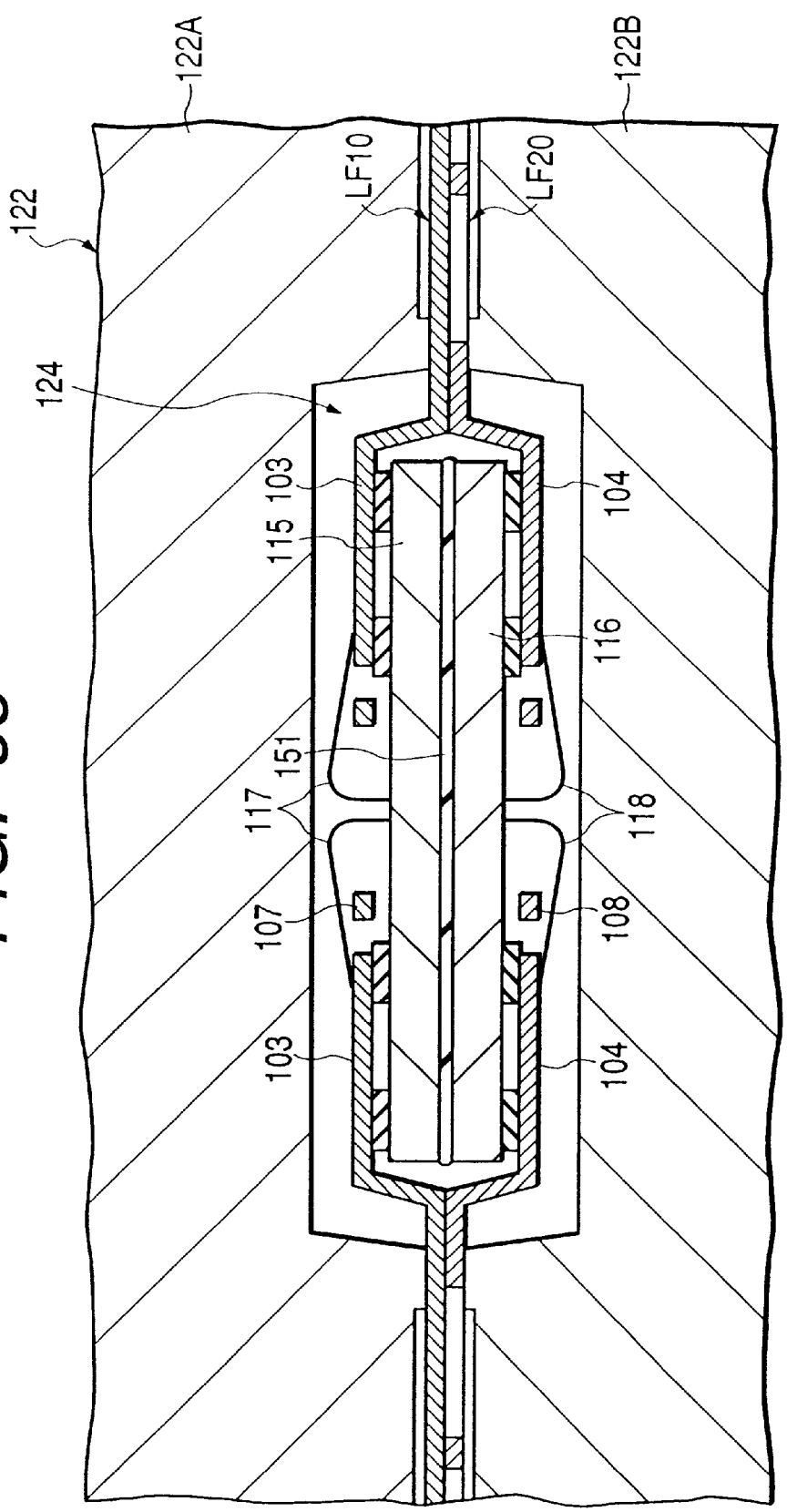

BACKGROUND

BACKGROUND

SEMICONDUCTOR DEVICE WITH TWO STACKED CHIPS IN ONE RESIN BODY AND METHOD OF PRODUCING

BACKGROUND OF THE INVENTION

This invention relates to a semiconductor device and a technique for producing a semiconductor device, and in particular to an effective technique for producing a semiconductor device by stacking two semiconductor chips, and sealing them by a single resin body.

With the trend towards larger capacities, semiconductor chips which incorporate storage systems such as DRAM (Dynamic Random Access Memory) and SRAM (Static Random Access Memory) are assuming larger flat sizes. In semiconductor devices wherein a semiconductor chip containing a storage circuit system is sealed by a resin body, a lead frame diepad (known also as a tab) is omitted, and a LOC (Lead on Chip) structure is used which can also be applied to large semiconductor chips. In an LOC structure, leads are disposed on the upper surface (i.e., a main surface) of upper and lower surfaces (a main surface and another main surface opposite to it) of a semiconductor chip. By adopting this LOC structure, a seal region can be retained for leads sealed by a resin body even when the flat size of the semiconductor chip increases, so increased flat size of the resin body is suppressed. A semiconductor device using an LOC structure is disclosed, for example, in Tokkai Hei 2-246125 published on Oct. 1, 1990 (corresponding to U.S. Pat. No. 5,068,712).

To achieve high packaging density of semiconductor chips comprising storage circuit systems, stacked semiconductor devices have been developed wherein two semiconductor chips having storage circuit systems of identical capacity are stacked, and the two chips are then sealed by one resin body. A stacked semiconductor device having an LOC structure is disclosed, for example, in Tokkai Hei 7-58281 (published on Mar. 3, 1995).

The stacked semiconductor device having an LOC structure disclosed in this publication essentially comprises a resin body, first and second semiconductor chips situated inside the resin body and having an electrode formed on a circuit-forming surface which is the upper surface (i.e., a main surface) of upper and lower surfaces (a main surface and another main surface opposite each other), a first lead extending inside and outside the resin body and bonded to the circuit-forming surface of the first semiconductor chip via an insulating film, and a second lead situated inside the resin body, bonded to the circuit-forming surface of the second semiconductor chip via an insulating film, and electrically connected to the electrode of the circuit-forming surface by an electrically conducting wire.

The first semiconductor chip and second semiconductor chip are both stacked so that their circuit-forming surfaces oppose each other leaving a predetermined gap. The first lead and second lead are laminated so that part of each is superimposed, and electrically and mechanically connected by welding with a laser.

The first lead comprises an inner lead part situated inside the resin body which runs across one side of the circuit-forming surface of the first semiconductor chip and extends over the circuit-forming surface of the first semiconductor chip, and an outer lead part bent into a J-shaped lead, which is one type of surface mounted packege.

The inner lead part of this first lead is bent so that the part which is bonded to the circuit-forming surface of the first semiconductor chip via an insulating film, is nearer to the circuit-forming surface of the chip than the part which runs across one side of the first semiconductor chip.

The second lead runs across one side of the circuit-forming surface of the second semiconductor chip and extends over the circuit-forming surface of the second semiconductor chip. This lead is bent so that the part which is bonded to the circuit-forming surface of the second semiconductor chip via an insulating film, is nearer to the circuit-forming surface of the chip than the part which runs across one side of the second semiconductor chip.

After welding with the laser, the other end of the second lead connected to the second semiconductor chip is cut inside the resin body before the transfer mold step, so it is not pulled out from the body. In other words, the outer lead which is pulled out of the body is used as a common outer connecting terminal for two semiconductor chips.

According to the aforesaid resin molded type semiconductor device, two semiconductor chips forming a memory LSI may be resin-sealed into one thin package, so a high-capacity package having effectively twice the storage capacity can be implemented in the same size as a package comprising one semiconductor chip which has been resin-sealed.

SUMMARY OF THE INVENTION

The inventor is developing a new stacked semiconductor device having an LOC structure suitable for thinner assemblies. This stacked semiconductor device has not yet been disclosed, however, it has the following construction as described in U.S. application Ser. No. 09/161,725 (filed on Sep. 29, 1998) submitted earlier by the Applicant.

The device comprises mainly a resin body, a first and second semiconductor chips situated inside the resin body and having an electrode formed on a circuit-forming surface which is the upper surface (i.e., a main surface) of upper and lower surfaces, a first lead extending inside and outside the resin body, bonded to the circuit-forming surface of the first semiconductor chip via an insulating film, and electrically connected to the electrode of the circuit-forming surface by an electrically conducting wire, and a second lead extending inside and outside the resin body, bonded to the circuit-forming surface of the second semiconductor chip via an insulating film, and electrically connected to the electrode of the circuit-forming surface by an electrically conducting wire.

The stacked semiconductor device of this invention may be, for example, a TSOP (Thin Small Outline Package). Two semiconductor chips, i.e., first and second semiconductor chips, which form memory LSI having the same storage capacities (e.g., a 64 Mbyte DRAM), are stacked on each other inside a package (resin body) formed by the transfer mold method, and are sealed with their lower surfaces (i.e., a main surface and another main surface facing away from each other) in contact.

The first lead and second lead are laminated so that part of each is superimposed, and electrically and mechanically connected by welding with a laser.

The first lead and second lead each comprise an inner lead part situated inside the resin body and an outer lead part situated outside the resin body. The inner lead parts of the first and second semiconductor chips comprise a first part which runs across one side of the circuit-forming surface of the semiconductor chip (first semiconductor chip in the case of the first lead and second semiconductor chip in the case of the second lead) and extends over the circuit-forming surface of the semiconductor chip, a second part which is bent from the first part towards the lower surface of the semiconductor chip, and a third part which extends from the second part in the same direction as the first part. The third parts of the first lead and second lead extend inside and outside the resin body, and are stacked on each other in an up/down direction. The outer lead part of the first lead is bent in a gull-wing lead shape, which is a type of surface mounted package. The outer lead part of the second lead is formed in a shorter length than that of the outer lead part of the first lead.

Hence, in the above stacked semiconductor, device, unlike the stacked semiconductor device of the aforesaid disclosure wherein element forming surfaces of two semiconductor chips are disposed opposing each other and an inner lead part is disposed in the gap between the two, the lower surfaces of two semiconductor chips are brought into contact with each other.

Therefore there is no gap between the two semiconductor chips, and the thickness of the resin body can be made thinner by a corresponding amount.

In other words, as there are no first leads or second leads between the first semiconductor chip and second semiconductor chip, the space between the two semiconductor chips can be made narrower compared to the case when the first lead and second lead are respectively disposed between the first semiconductor chip and second semiconductor chip as in a prior art stacked semiconductor device. Consequently, the thickness of the resin body can be reduced, and the stacked semiconductor device can be made thinner.

Regarding the floating capacitance between the semiconductor chips and leads, the floating capacitance between the leads disposed on the element-forming surface of the first semiconductor chip and the second semiconductor chip, and the floating capacitance between the leads disposed on the element-forming surface of the second semiconductor chip and the first semiconductor chip, are both eliminated, hence the floating capacitance applied to the leads is reduced by a corresponding amount and the signal propagation delay of the leads is improved.

In other words, as there is no first lead and second lead between the first semiconductor chip and second semiconductor chip, of the floating capacitances applied to the first lead (chip/lead capacitance), the floating capacitance produced by the second semiconductor chip is effectively eliminated compared to the case when the first lead and second lead are disposed between the first semiconductor chip and second semiconductor chip as in the prior art stacked semiconductor device, and of the floating capacitances applied to the second lead (chip/lead capacitance), the floating capacitance produced by the first semiconductor chip is effectively eliminated. Hence, the floating capacitance applied to the leads, i.e., the first lead and second lead, is reduced. As a result, the signal propagation delay of the leads is improved, and the electrical characteristics of the stacked semiconductor device are enhanced.

The first semiconductor chip is sealed by a resin fixed by the lead of the first lead frame, and the second semiconductor chip is sealed by a resin body fixed by the lead of the second lead frame. In other words, this resin-sealed semiconductor device is produced using two lead frames. Of these two lead frames, one of them does not have an outer lead part and has only an inner lead part. In other words, in this resin-sealed semiconductor device, the outer lead part of the other lead frame pulled out from the resin body isused as a common external connecting terminal for two semiconductor chips.

In the steps for producing this resin-sealed semiconductor device, the inner lead part of the lead of the first lead frame is first bonded to the element-forming surface of the first semiconductor chip, and the inner lead part of the lead of the second lead frame is bonded to the element-forming surface of the second semiconductor chip.

Next, the inner lead part of the lead of the first lead frame and a bonding pad formed on the element-forming surface of the first semiconductor chip are connected by wires, the inner lead part of the lead of the second lead frame and a bonding pad formed on the element-forming surface of the second semiconductor chip are connected by wires, the two lead frames are superimposed such that the lower surface of the first semiconductor chip and the lower surface of the second semiconductor chip are facing each other, these lead frames are pressed into a mold, and the first semiconductor chip and second semiconductor chip are sealed by a resin.

Next, a first lead frame dam bar and a second lead frame dam bar extending outside the package (resin body) are cut using a cutting die to form the outer lead parts of one lead frame.

According to the above method of production, the cutting of the two lead frames can be performed in one step, so the process can be shortened compared to the method of producing a package in the aforesaid disclosure where the outer lead part of one lead frame is cut before the mold step.

[1] However, in the above production method, two lead frames carrying a semiconductor chip are superimposed, inserted in a mold, and resin is injected into the mold cavity with one lead frame dam bar and the other lead frame dam bar clamped in an up/down direction by an upper clamp surface and a lower clamp surface. If the upper and lower mold clamp surfaces do not tighten the dam bar with sufficient force, one of the dam bars may displace towards the outside of the cavity due to the resin injection pressure, resin may leak outside the cavity through the gap which is then produced between one dam bar and the other dam bar, and this may cause molding defects.

In particular, in recent LSI lead frames, as the width and pitch of the lead are finer, the width of the dam bars is also narrower. As a result, it is difficult to ensure sufficient contact surface area between the clamp surfaces of the mold and the dam bars, so the tightening force of the clamp surfaces on the dam bars is insufficient, and the dam bars tend to displace due to the resin injection pressure.

One way of dealing with this problem might be to increase the width of the dam bars of the lead frames, but if this is done in the above production process where two superimposed dam bars are cut simultaneously, the load on the cutting mold increases, and its lifetime is reduced.

Further, the inventor discovered other problems in the course of developing the aforesaid stacked semiconductor device.

[2] This stacked semiconductor device is produced by an assembly process using two lead frames, therefore it is necessary to join the first lead supported in the first lead frame and the second lead supported in the second lead frame. Laser welding, which is suitable for micro-assembly, may effectively be used to join the first and second leads, however the following problems arise if laser welding is performed in the stage before forming the resin sealing body.

In laser welding, the join parts (weld parts) of the leads are irradiated by laser light and melted, so a large amount of molten material is scattered in the surrounding area by the laser irradiation. As the first semiconductor chip and second semiconductor chip are stacked with their lower surfaces facing each other, the scattered material produced by this melting flies onto the circuit-forming surfaces of the semiconductor chips.

When scattered material flies onto the circuit-forming surfaces of the semiconductor chips, since this material is at high temperature, it causes heat damage in the protective film formed on the circuit-forming surface of the semiconductor chips, so the interconnections underneath the protective film often break or short circuits are caused in adjacent interconnections. If a large number of such defects occur, a semiconductor chip becomes defective, and the yield of the stacked semiconductor device seriously declines. In particular, in semiconductor chips where the protecting film is formed of a polyimide resin to improve adhesion properties with the resin of the resin sealing body or the alpha ray resistance of DRAM, defects due to scattered material occur very easily.

Further, as the join parts of the leads are melted by laser welding, impurities contained in the leads (e.g., sulfur) become outer gases, adhere to the semiconductor chip surface, and cause chemical reactions which lead to the deterioration of the chip surface. If deterioration of the semiconductor chip surface occurs, the adhesion between the semiconductor chip and the resin of the resin body decreases remarkably, and peeling easily occurs at the interface between the two due to the thermal stress caused by the difference of thermal expansion coefficients. If this interface peeling should occur, moisture contained in the resin of the resin body accumulates in the peeling area, and the accumulated moisture may vaporize during a heat cycle test, which is an environmental test performed after the product is finished, or due to solder reflow heat when the chip is soldered to a circuit board. This causes cracks in the resin body, and leads to a decreased reliability of the stacked semiconductor device.

Further, lead frames are tending to become thinner as leads become finer, and warp in the leads occurs more easily due to mechanical strength insufficiency. If the leads become warped, a gap will occur between the join part of the first lead and the join part of the second lead causing solder defects. As a result the first lead and second lead must be restrained by a fixing tool, and productivity of the stacked semiconductor device decreases.

[3] In stacked semiconductor devices and also in ordinary semiconductor devices, to maintain solder leak properties during installation and to improve anticorrosion properties, outer leads must be plated with an electrically conducting film (plating film) comprising, for example, lead (Pb)-tin (Sn). This plating is generally electroplating comprising pre-processing such as a degreasing step, water rinsing step, polishing step and water rinsing step, and post processing such as a plating step, water rinsing step, neutralizing step, hot water rinsing step, and drying step. When plating is applied by electroplating comprising these steps, in a stacked semiconductor device, the plating is carried out with the two lead frames superimposed. Therefore, some processing fluid (reagent) from a previous stage is caught between the first lead frame and second lead frame due to capillary action, and a large amount of the processing fluid from the previous stage maybe carried over into processing fluids of subsequent stages. This carrying-over of processing fluid from a previous stage causes plating defects, and greatly reduces the yield of the stacked semiconductor device. Also, the processing fluid of subsequent stages must frequently be replaced, and productivity of the stacked semiconductor device declines.

[4] In the stacked semiconductor device, the resin sealed body is formed with two lead frames superimposed. Trailing leads for supporting the resin body in the lead frame are also formed in each of the two lead frames in such a position that they are superimposed.

Therefore, there are two adjacent surfaces of trailing leads inside the resin body, and as the two trailing leads are cut from the frame body of the lead frame after plating is carried out, the ends of the adjacent leads are left exposed from the resin body. If these adjacent surfaces are left exposed, moisture from outside easily penetrates the interior of the body through the surfaces, and easily corrodes the connecting parts between the electrodes and wires of the semiconductor chip, and the connecting parts between the inner lead parts of the leads and wires. This leads to decreased reliability of the stacked semiconductor chip.

[5] Stacked semiconductor devices are produced by an assembly processing two lead frames. In the first lead frame, the tips of the outer lead parts of first leads are supported in the frame body, and the intermediate parts of first leads are interconnected by dam bars and supported in the frame body by dam bars. In the second lead frame, the tips of the outer lead parts of second leads are interconnected by dam bars, and supported in the frame body by dam bars. In other words, in the second lead frame, there is nothing supported in the area specified by the dam bars and frame body, so rigidity is low and bending occurs easily. Therefore, when the second lead frame is transported in a step at a subsequent stage after fixing the inner lead parts of the second leads to the circuit-forming surface of the semiconductor chip, the chip tends to wobble and easily fall off the second lead frame, so yield of the stacked semiconductor device declines.

[6] In stacked semiconductor devices, the resin sealing body is formed by the transfer molding method which is suitable for mass production. The transfer molding method is a method for forming a resin body by pressure-injecting a resin into a mold cavity. The resin is generally an epoxy heat curing resin containing a large number of fillers to achieve lower stresses.

A semiconductor chip essentially comprises a semiconductor substrate, an insulating layer on a circuit-forming surface of this semiconductor substrate, a multi-layer interconnection layer comprising plural interconnection layers laminated on each other, and a surface protective film (final protective film) formed so as to cover this multi-layer interconnection layer, therefore the semiconductor chip is warped in a direction in which the lower surface of the chip bulges outwards. If two semiconductor chips are stacked with their lower surfaces facing each other in this state, a gap 172 will be formed between two semiconductor chips 171 which gradually widens from the center to the edges of the two semiconductor chips 171, as shown in FIG. 57.

Therefore, when the two semiconductor chips 171 and 171 are disposed in a cavity 176 of a mold 175, and a resin 177 is pressure-injected into the cavity 176 to form a resin body as shown in FIG. 58, the resin 177 permeates the gap between the two semiconductor chips 171. However, as the resin 177 contains fillers which are mixed with it, it cannot penetrate a gap which is narrower than the particle diameter of the fillers, so a space 178 is formed between the two semiconductor chips 171. If such a space 178 is formed between the two semiconductor chips 171, when a higher pressure than the injection pressure is used to remove bubbles enclosed in the resin after resin injection into the cavity 176 is completed, cracks will occur in the semiconductor chip 171 radiating out from the space 178, and this leads to a decrease in yield of the stacked semiconductor device.

It is therefore an object of this invention to provide a technique capable of improving the yield of a semiconductor device.

It is a further object of this invention to provide a technique capable of improving the productivity of a semiconductor device.

It is yet another object of this invention to provide a technique capable of improving the reliability of a semiconductor device.

It is yet another object of this invention to provide a technique for preventing displacement of a dam bar due to a resin injection pressure during molding, in the production a semiconductor device wherein two semiconductor chips are resin-sealed using two lead frames.

These and other aims and novel features of the present invention it will become apparent from the following detailed description and attached drawings.

The essential features of the invention disclosed in the present application will now be simply described.

[1] In the semiconductor device according to this invention, the lower surface of a first semiconductor chip and the lower surface of a second semiconductor chip are sealed in a package, wherein the inner lead parts of plural leads of a first lead frame fixed on the element-forming surface of the first semiconductor chip and a bonding pad formed on the element-forming surface of the first semiconductor chip, and the inner lead parts of plural leads of a second lead frame fixed on the element-forming surface of the second semiconductor chip and a bonding pad formed on the element-forming surface of the second semiconductor chip, are respectively electrically connected, and the width of a dam bar of the second lead frame exposed outside the package is less than the width of a dam bar of the first lead frame exposed outside the package.

[2] The method of producing a semiconductor device according to this invention comprises the following steps (a)–(d):

(a) providing a first lead frame comprising plural leads interconnected by a first dam bar, and
providing a second lead frame comprising plural leads interconnected by a second dam bar, wherein a dummy lead extending in the width direction is formed in the second dam bar, (b) fixing an inner lead part of a lead of the first lead frame on an element-forming surface of the first semiconductor chip, and fixing an inner lead part of a lead of the second lead frame on an element-forming surface of the second semiconductor chip, (c) electrically connecting the inner lead part of the lead of the first lead frame and a bonding pad formed on the element-forming surface of the first semiconductor chip, and electrically connecting the inner lead part of the lead of the second lead frame and a bonding pad formed on the element-forming surface of the second semiconductor chip, (d) sealing the first semiconductor chip and second semiconductor chip in the package with the first lead frame and second lead frame superimposed such that the lower surface of the first semiconductor chip and lower surface of the second semiconductor chip are facing each other, and (e) cutting the first dam bar of the first lead frame and cutting the second dam bar of the second lead frame exposed outside the package.

[3] In the method of producing the semiconductor device, which comprises a resin body, a first semiconductor chip and second semiconductor chip situated inside the resin sealing body and having an electrode formed on the upper surfaces of upper and lower surfaces, a first lead extending inside and outside the resin body and electrically connected to the electrode of the first semiconductor chip, and a second lead extending inside and outside the resin body and electrically connected to the electrode of the second semiconductor chip, the first lead and second lead are joined by welding after forming the resin body with the weld parts of the first lead and second lead superimposed.

The welding is performed by laser light from above either of the first lead or second lead.

[4] In the method of producing a semiconductor device, comprising a step for sealing the inner lead part of the first lead supported in the frame body of the first lead frame, the inner lead part of the second lead supported in the frame body of the second lead frame, the first semiconductor chip bonded to the inner lead part of the first lead and having an electrode electrically connected to the inner lead part of the first lead, and the second semiconductor chip bonded to the inner lead part of the second lead and having an electrode electrically connected to the inner lead part of the second lead, by a resin body, and further comprising a step for plating the outer lead parts of the first lead and second lead, the frame body of the second lead frame is removed after sealing with the resin and prior to plating.

[5] The method of producing a semiconductor device comprises the following steps:

preparing the first semiconductor chip and second semiconductor chip having an electrode formed on the upper surface of upper and lower surfaces, preparing a first lead frame comprising plural first leads situated in a region surrounded by the first frame body, wherein the ends of the outer lead parts are supported in the first frame body, and the intermediate parts are interconnected by the first dam bar and supported in the first frame body by the first dam bar, and comprising a trailing lead situated in a region surrounded by the first frame body and supported in the first frame body, preparing a second lead frame comprising plural second leads situated in a region surrounded by the second frame body, wherein the ends of the outer lead parts are interconnected by the second dam bar and supported in the second frame body by the second dam bar, bonding the inner lead parts of the first leads to the upper surface of the first semiconductor chip, and bonding the inner lead parts of the second leads to the upper surface of the second semiconductor chip, electrically connecting an electrode of the first semiconductor chip to the inner lead parts of the first leads by an electrically conducting wire, and electrically connecting an electrode of the second semiconductor chip to the inner lead parts of the second leads by an electrically conducting wire, and sealing the first semiconductor chip, second semiconductor chip, inner lead parts of the first leads, inner lead parts of the second leads, first electrically conducting wire, second electrically conducting wire and trailing lead by a resin body with the first lead frame and second lead frame superimposed such that the lower surfaces of the first semiconductor chip and second semiconductor chip are facing each other.

[6] The method of producing a semiconductor device comprises the following steps:

preparing the first semiconductor chip and second semiconductor chip having an electrode formed on the upper surface of upper and lower surfaces, preparing a first lead frame comprising plural first leads situated in a region surrounded by the first frame body, wherein the ends of the outer lead parts are supported in the first frame body, and the intermediate parts are interconnected by the first dam bar and supported in the first frame body by the first dam bar, preparing a second lead frame comprising plural second leads situated in a region surrounded in the second frame body, wherein the ends of the outer lead parts are interconnected by the second dam bar and supported in the second frame body by the second dam bar, and comprising a reinforcing lead situated in a region surrounded by the second frame body, and supported by the second dam bar and second frame body, bonding the inner lead parts of the first leads to the upper surface of the first semiconductor chip, and bonding the inner lead parts of the second leads to the upper surface of the second semiconductor chip, electrically connecting an electrode of the first semiconductor chip to the inner lead parts of the first leads by an electrically conducting wire, and electrically connecting an electrode of the second semiconductor chip to the inner lead parts of the second leads by an electrically conducting wire, and sealing the first semiconductor chip, second semiconductor chip, inner lead parts of the first leads, inner lead parts of the second leads, first electrically conducting wire and second electrically conducting wire by a resin body with the first lead frame and second lead frame superimposed such that the lower surfaces of the first semiconductor chip and second semiconductor chip are facing each other.

[7] In the method of producing a semiconductor device, comprising a resin body formed by a large number of fillers, first semiconductor chip and second semiconductor chip having an electrode formed on the upper surface of upper and lower surfaces, first lead extending inside and outside the resin body and electrically connected to the first semiconductor chip, second lead extending inside and outside the resin body and electrically connected to the second semiconductor chip, the first semiconductor chip and second semiconductor chip being laminated with their lower surfaces facing each other, the first semiconductor chip, second semiconductor chip, inner lead part of the first lead, inner lead part of the second lead, first electrically conducting wire and second electrically conducting wire are disposed inside the cavity of a mold with a damping material filled between the lower surface of the first semiconductor chip and the lower surface of the second semiconductor chip, and a resin is pressure-injected into the cavity to form the resin body.

[8] In the method of producing a semiconductor device, comprising a resin body formed by a large number of fillers, first semiconductor chip and second semiconductor chip having an electrode formed on the upper surface of upper and lower surfaces, first lead extending inside and outside the resin body and electrically connected to the first semiconductor chip, second lead extending inside and outside the resin body and electrically connected to the second semiconductor chip, the first semiconductor chip and second semiconductor chip being laminated with their lower surfaces facing each other, the first semiconductor chip, second semiconductor chip, inner lead part of the first lead and inner lead part of the second lead are disposed inside the cavity of a mold leaving a gap wider than the maximum particle diameter of the fillers between the lower surface of the first semiconductor chip and the lower surface of the second semiconductor chip, and the resin is pressure-injected into the cavity to form the resin sealing body.

In the aforesaid means [1], [2], mold defects wherein resin leaks outside the cavity due to deformation of the dam bars as a result of pressure injection of the resin, are definitively prevented, so production yield of the semiconductor device using two lead frames is improved. The life of the mold is also lengthened.

The width of the dam bar can also be made narrower, so stress in the dam bar cutting mold is reduced, and its life is lengthened. Further, as the surface area of the cut surface of the dam bar is smaller, the amount of cut burrs and the amount of solder plating scrap can be reduced, so reliability of the semiconductor device using two lead frames is improved.

According to the aforesaid means [3], the upper surfaces (circuit-forming surfaces) of the first semiconductor chip and second semiconductor chip are covered by resin when the first lead and second lead are welded, so defects of the first semiconductor chip and second semiconductor chip due to scattering of material (high temperature molten material) during welding are prevented. As a result, production yield of the semiconductor device is improved.

Further, as the upper surfaces (circuit-forming surfaces) of the first semiconductor chip and second semiconductor chip are covered by resin when the first lead and second lead are welded, surface deterioration of the first semiconductor chip and second semiconductor chip due to adhesion of out-gas (vapors of impurities, e.g., sulfur, contained in the leads) is prevented, and decrease of adhesive force between the semiconductor chip and resin body is suppressed. As a result, peeling at the interface between the two due to thermal stress caused by a difference of the heat expansion coefficients of the semiconductor chip and the resin body, buildup of moisture in the resin of the seal in the peeling area, and expansion of accumulated moisture upon vaporization due to solder reflow heat during thermal cycle tests which are environmental tests performed on the finished product or during soldering of components on the circuit board, leading to cracks in the resin, can be prevented, so the reliability of the semiconductor device is enhanced.

The join parts of the first lead and second lead are maintained close to each other by the resin body, so there is no need to restrain the first lead and second lead by a fixing tool. This leads to improved productivity of the semiconductor device.

According to the aforesaid means [4], when plating of the outer lead parts of the first and second leads is performed, the amount of processing fluid (reagent) carried over to subsequent stages from a previous stage can be reduced, so plating defects due to carrying over of processing fluid are suppressed. As a result, the production yield of the semiconductor device is improved.

Further, due to the lesser amount of processing fluid (reagent) carried over to subsequent stages from a previous stage, the number of times processing fluid has to be replaced in each of the subsequent stages is also reduced, and as a result, the production yield of the semiconductor device is improved.

According to the aforesaid means [5], as there are no adjacent surfaces due to two superimposed trailing leads inside the resin body, moisture does not penetrate the resin body from outside through adjacent surfaces, and corrosion of the contact between the electrodes of the semiconductor chip and wires, and of the contact between the inner lead parts of the leads and wires, is suppressed. Hence, reliability of the semiconductor device is enhanced.

According to the aforesaid means [6], the rigidity of the second lead frame is improved by the reinforcing lead, so wobbling of the semiconductor chip causing it to fall off from the second lead frame when the second lead frame is transported in a subsequent stage after bonding the inner lead part of the second lead frame to the circuit-forming surface of the semiconductor chip, is suppressed. As a result, the production yield of the semiconductor device is improved.

According to the aforesaid means [7], a damping material is filled between the lower surface of the first semiconductor chip and the lower surface of the second semiconductor chip, so resin does not penetrate the space between the lower surfaces of the semiconductor chips. As no space due to the fillers mixed in the resin is formed between the first semiconductor chip and second semiconductor chip, cracks in the first and second semiconductor chips which might originate from such a space when a pressure higher than the resin injection pressure is applied after injecting resin into the cavity to remove bubbles trapped in the resin, are prevented. As a result, the production yield of the semiconductor device is improved.

According to the aforesaid means [8], resin passes more easily between the lower surface of the first semiconductor chip and the lower surface of the second semiconductor chip when the resin body is formed, so no space due to the fillers mixed in the resin is formed between the lower surface of the first semiconductor chip and the lower surface of the second semiconductor chip. Therefore, cracks in the first and second semiconductor chips which might originate from such a space when a pressure higher than the resin injection pressure is applied after injecting resin into the cavity to remove bubbles trapped in the resin, are prevented, and as a result, the production yield of the semiconductor device is improved.

BRIEF DESCRIPTION OF THE DRAWINGS

FIG. 3 is a sectional view of a first lead frame along a line III—III in FIG. 1.

FIG. 4 is a sectional view of a second lead frame along a line IV—IV on FIG. 2.

FIG. 8(a) is a sectional view of the first lead frame showing the method of producing the semiconductor device according to the first embodiment of this invention, and FIG. 8(b) is a sectional view of the second lead frame showing the method of producing the semiconductor device according to the first embodiment of this invention.

FIGS. 11(a) and 11(b) are sectional views showing the method of producing of the semiconductor device according to the first embodiment of this invention.

FIG. 12 is a sectional view showing the method of producing the semiconductor device according to the first embodiment of this invention.

FIG. 13 is a sectional view of the essential parts of a mold showing the method of producing the semiconductor device according to the first embodiment of this invention.

FIG. 36 is a sectional view of essential parts for the purpose of describing a wire bonding step in the production of the semiconductor device according to the fourth embodiment of this invention.

FIG. 51 is a sectional view of essential parts for the purpose of describing a wire bonding step in the production of the semiconductor device according to the fifth embodiment of this invention.

FIG. 52 is a sectional view of essential parts showing a state where first and second lead frames are superimposed in the production of the semiconductor device according to the fifth embodiment of this invention.

FIG. 53 is a sectional view of essential parts for the purpose of describing a sealing step in the production of the semiconductor device according to the fifth embodiment of this invention.

DESCRIPTION OF THE PREFERRED EMBODIMENTS

Figure 1:
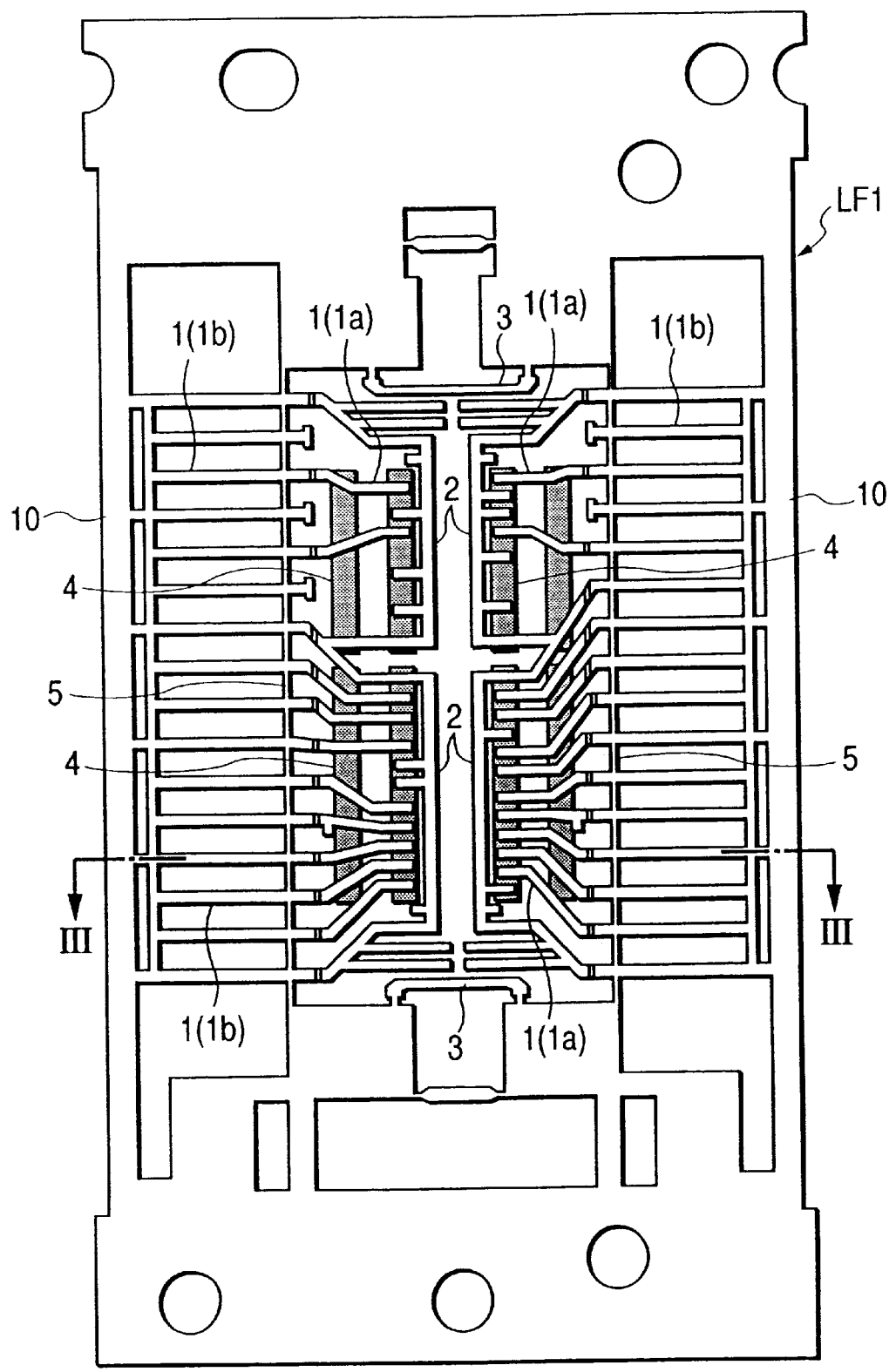
FIG. 1 is a plan view of a first lead frame used in the first embodiment of this invention.

The embodiments of this invention will hereafter be described in detail referring to the drawings.

In all the drawings, identical symbols will be assigned to the same components and their description will not be repeated.

(Embodiment 1)

Figure 2:
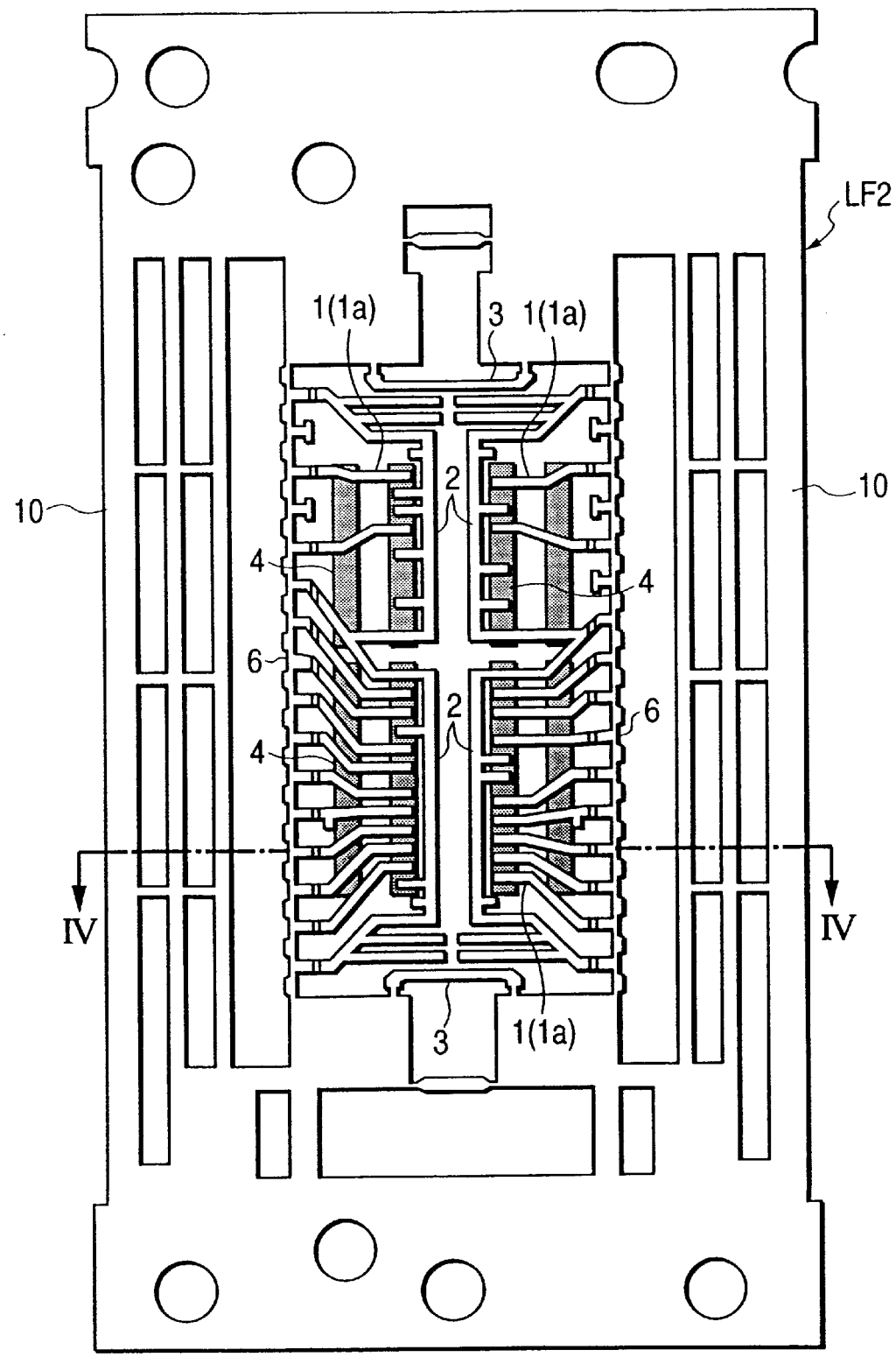
FIG. 2 is a plan view of a second lead frame used in the first embodiment of this invention.

FIG. 1 is a plan view of a first lead frame LFI used for producing the semiconductor device of this embodiment, and FIG. 2 is a plan view of a second lead frame LF2 used for producing this semiconductor device.

The semiconductor device of this embodiment is manufactured using the two lead frames LF1 and LF2 shown in FIGS. 1 and 2.

As shown in FIG. 1, the first lead frame LF1 comprises plural (e.g., 32) leads 1, four bus bar leads 2, two supporting leads 3 and plural (e.g., 8) insulating films 4 in an area surrounded by a frame body 10.

Of the thirty-two leads 1 formed in the above-mentioned lead frame LF1, a group of sixteen leads arranged in a row along one side (left-hand side of the drawing) of the frame body 10 extending in the vertical direction of the drawing are interconnected by one dam bar 5 which extends parallel to this frame body 10. In other words, this lead frame LF1 has a bi-directional lead arrangement in which the plural leads 1 are arranged in two rows in the vertical direction of the figure.

The above-mentioned dam bar 5 is a member for preventing leakage of solder resin to the exterior of a cavity when a package is transfer molded in a production process described later. Parts of the leads 1 which are situated further outside than the dam bar 5 (frame body 10 side) comprise outer lead parts 1b, and parts situated further inside than the dam bar 5 comprise inner lead parts 1a.

Four bus bar leads 2 which extend in the vertical direction of the figure are arranged substantially in the center of the area surrounded by the aforesaid rectangular frame body 10. Of these four bus bar leads 2, two are connected to the three leads 1 disposed at the two ends and in the center of the group of sixteen leads which extends along one side (left-hand side in the drawing) of the frame body 10 extending in the vertical direction of the drawing, and are formed in one piece with the inner lead parts 1a of these leads 1. The three leads 1 connected with these two bus bar leads 2 comprise power supply potential terminals fixed at a power supply potential (Vcc) of, for example, 5V.

The remaining two of the four bus bar leads 2 are connected to the three leads 1 disposed at both ends and in the center of a group of sixteen leads arranged along the other side (left-hand side of the drawing) of the frame body 10 extending in the vertical direction of the drawing, and are formed in one piece with the inner lead parts 1a of these leads 1. The three leads 1 connected with these two bus bar leads 2 comprise reference potential terminals fixed at a reference potential (Vss) of, for example, 0V.

Apart from the leads 1 connected to the bus bar leads 2 (power supply potential terminals and reference potential terminals), the remaining leads 1 are signal terminals or open (NC) terminals. The signal terminals comprise a data input/output terminal, address input terminal, row address strobe terminal, column address strobe terminal, read/write enable terminal and output enable terminal. The inner lead parts 1a of the open terminals have a shorter length compared to the inner lead parts 1a of the other terminals.

Short strips of insulating film 4 comprising a polyimide resin or the like are bonded to the lower surface of the inner lead parts 1a across a plurality of the leads 1. The element-forming surface of a first semiconductor chip is joined to the lower surfaces of these insulating films 4 by a production process described later. That is, the lead frame LF1 has an LOC structure wherein the inner lead parts 1a are disposed on the element-forming surface of the semiconductor chip.

FIG. 3 is a sectional drawing of the lead frame L1P1 along a line III—III in FIG. 1. The inner lead parts 1a of the leads 1 which comprise terminals other than open terminals comprise, in order from the side nearest the dam bar 5, parts 1a1 which extend parallel to the lower surface of the lead frame LF1, parts 1a2 which are bent upwards, and parts 1a3 which extend parallel to the first parts 1a1. The parts 1a3 are the parts disposed on the element-forming surface of the semiconductor chip in a production process described later, and the insulating films 4 described above are bonded to their lower surface.

As shown in FIG. 2, the second lead frame LF2 comprises plural (e.g., 32) leads 1, four bus bar leads 2 and two supporting leads 3 in an area surrounded by a frame body 10. This lead frame LF2 has a similar structure to that of the aforesaid lead frame LF1 excepting that all the leads 1 comprise only the inner lead parts 1a and have no outer lead parts 1b.

Specifically, of the thirty-two leads formed in the lead frame LF2, a group of sixteen leads arranged along one side (left-hand side in the drawing) of the frame body 10 extending in the vertical direction of the drawing are interconnected by one dam bar 6 which extends parallel to this frame body 10. Likewise, the group of sixteen leads arranged on the other side (right-hand side of the drawing) of the frame body 10 extending in the vertical direction of the drawing are interconnected by the dam bar 6 which extends parallel to this frame body 10.

Four of the bus bar leads 2 which extend in the vertical direction of the drawing are arranged substantially in the center of the area surrounded by the frame body 10 of the above-mentioned rectangle. Of these four bus bar leads 2, two are connected to the three leads 1 disposed at the two ends and in the center of a group of sixteen leads which extends along one side (left-hand side in the drawing) of the frame body 10 extending in the vertical direction of the drawing, and are formed in one piece with the inner lead parts 1a of these leads 1. The three leads 1 connected with these two bus bar leads 2 comprise reference potential terminals (Vss).

The remaining two of the four bus bar leads 2 are connected to the three leads 1 disposed at both ends and in the center of a group of sixteen leads arranged along the other side (right-hand side of the drawing) of the frame body 10 extending in the vertical direction of the drawing, and are formed in one piece with the inner lead parts 1a of these leads 1. The three leads 1 connected with these two bus bar leads 2 comprise power supply potential terminals (Vcc).

Apart from the leads 1 connected to the bus bar leads 2 (power supply potential terminals and reference potential terminals), the remaining leads 1 are signal terminals or open (NC) terminals. The signal terminals comprise a data input/output terminal, address input terminal, row address strobe terminal, column address strobe terminal, read/write enable terminal and output enable terminal. The inner lead parts 1a of the open terminals have a shorter length compared to the inner lead parts 1a of the other terminals.

Short strips of insulating film 4 comprising a polyimide resin or the like are bonded to the lower surface of the inner lead parts 1a across a plurality of the leads 1. The element-forming surface of a second semiconductor chip is joined to the lower surfaces of these insulating films 4 by a production process described later. In other words, the lead frame LF2 has an LOC structure.

FIG. 4 is a sectional view of the lead frame LF2 along a line IV—IV of FIG. 2. The inner lead parts 1a of the leads 1 which comprise terminals other than open terminals comprise, in order from the side nearest the dam bar 6, parts 1a1 which extend parallel to the lower surface of the lead frame LF2, parts 1a2 which are bent upwards, and parts 1a3 which extend parallel to the first parts 1a1, as in the case of the aforesaid lead frame LF1. The parts 1a3 are the parts disposed on the element-forming surface of the semiconductor chip in a production process described later, and the insulating films 4 described above are bonded to their lower surface.

As described later, the first lead frame LF1 and second lead frame LF2 are used with their lower surfaces superimposed. Therefore, the left-right orientation of the terminals of the lead frame LF1 shown in FIG. 1 is the reverse of that of the terminals of the lead frame LP2 shown in FIG. 2 so that similar terminals may overlap near the dam bars 5 when the lower surfaces of the lead frames LF1 and LF2 are superimposed.

Figure 5A:
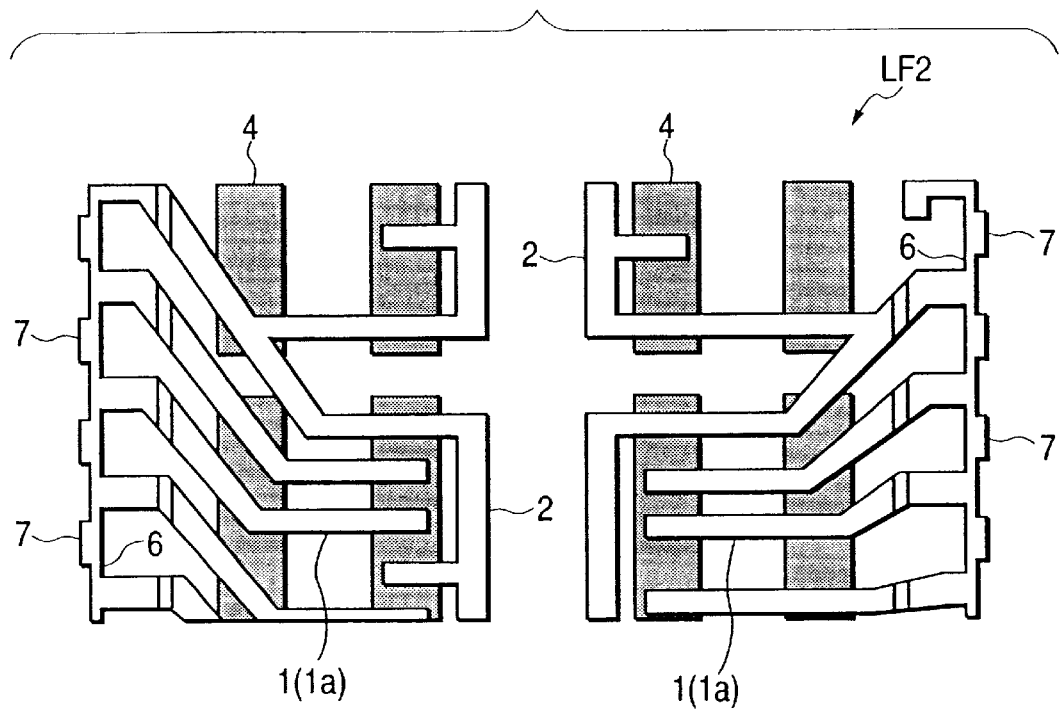
FIG. 5(a) is a plan view showing an enlargement of part of a second lead frame used in the first embodiment of this invention.
Figure 5B:
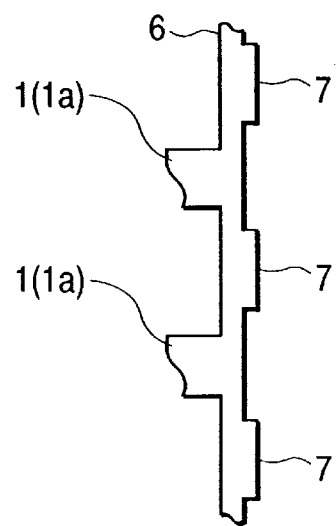
FIG. 5(b) is a plan view showing a further enlargement of part of FIG. 5(a).

FIG. 5(a) is a plan view showing an enlargement of part of the second lead frame LF2 shown in FIG. 2, and FIG. 5(b) is a plan view showing a further enlargement of part of FIG. 5(a) (near the dam bar 6).

As shown in the drawing, a short dummy lead 7 (i.e., a broad part) which extends in the width direction of this dam bar 6 is formed on the side of the dam bar 6 of the lead frame LF2. Although there is no particular limitation, this dummy lead 7 is formed in all the spaces between the leads 1, and it is disposed on the opposite side of the dam bar 6 to the side on which the inner lead parts 1a are disposed. As shown by the enlargement in FIG. 5(b), the dummy lead 7 is formed so that its width is a little less than that of the space between the leads 1. That is, the dummy lead 7 is formed only in the center of the space between the leads 1, and is not formed at the both ends of the space (near the lead 1). Hence, the dam bar 6 is wider by the length of the dummy lead 7 in the center of the space between the leads 1, and is narrower at both ends of the space (near the leads 1). The width of the dam bar 6 at the ends of the spaces between the leads 1 is narrower than the width of the dam bar 5 of the aforementioned first lead frame LF1, and the width of the dam bar 6 in the center of the space is wider than the width of the dam bar 5 of the first lead frame LF1.

To manufacture the first lead frame LF1 and the second lead frame LF2 having the aforesaid construction, a thin plate of iron (Fe)-nickel (Ni) alloy such as 42 alloy or copper (Cu) is etched to form the pattern of the leads 1, bus bars 2 and dam bar 5 (6), the inner lead parts 1a of the leads 1 are bent as shown in FIG. 3 (FIG. 4) by pressing, and the insulating film 4 is bonded to the lower surface of the inner lead parts 1a. It should be noted that although the real lead frames LF1 and LF2 have a multiple configuration wherein about five semiconductor chips can respectively be mounted, FIG. 1 and FIG. 2 both show an area for one semiconductor chip.

As an example of the dimensions of the main parts of the above-mentioned lead frames LF1, LF2, the thickness of the plate which comprises the lead frames LF1 and LF2 is 0.1 mm, the width of the leads 1 near the dam bar 5 (6) is 0.4 mm and the pitch of the lead is 1.27 mm. Therefore, the space (s) between the leads 1 near the dam bar 5 (6) is 0.87 mm. Further, the width of the dam bar 5 of the first lead frame LF1 is 0.15 mm, while the width of the dam bar 6 of the second lead frame LF2 is 0.13 mm at the ends of the spaces between the leads 1 (near the leads 1) and 0.23 mm in the center of the spaces (in which the dummy lead 7 is formed). The length of the dummy lead 7 formed on the side of the dam bar 6 is 0.1 mm, and its width is 0.55 mm.

As described above, in the case of the second lead frame LF2, the width of the dam bar 6 at both ends of the spaces between the leads 1 (near the leads 1) is narrower than the width of the dam bar 5 of the first lead frame LF1. In these example dimensions, whereas the width of the dam bar 6 near the leads 1 is 0.13 mm, the width of the dam bar 5 of the first lead frame LF1 is 0.15 mm. The difference (0.15 mm−0.13 mm=0.02 mm) in the width of these dam bars 5 and 6 is equal to the maximum value of mismatch in the width direction produced between the dam bar 5 of the lead frame LF1 and the dam bar 6 of the lead frame LF2 when the lead frames LF1, LF2 are superimposed and positioned in a mold in the resin body transfer mold step described later. That is, the width of the dam bar 6 of the second lead frame LF2 near the leads 1 is specified so that it does not extend beyond the dam bar 5 of the first lead frame LF1 when the lead frames LF1, LF2 are positioned in the mold. On the other hand, in the center of the space between the leads 1, due to the dummy lead 7 formed in the dam bar 6 of the second lead frame LF2, the tip of the dummy lead 7 does extend beyond the dam bar 5 of the first lead frame LF1 when the lead frames LF1, LP2 are superimposed.

Next, the method of producing the semiconductor device using the above-mentioned lead frames LF1 and LF2 will be described in step sequence referring to FIG. 16 to FIG. 19.

Figure 6:
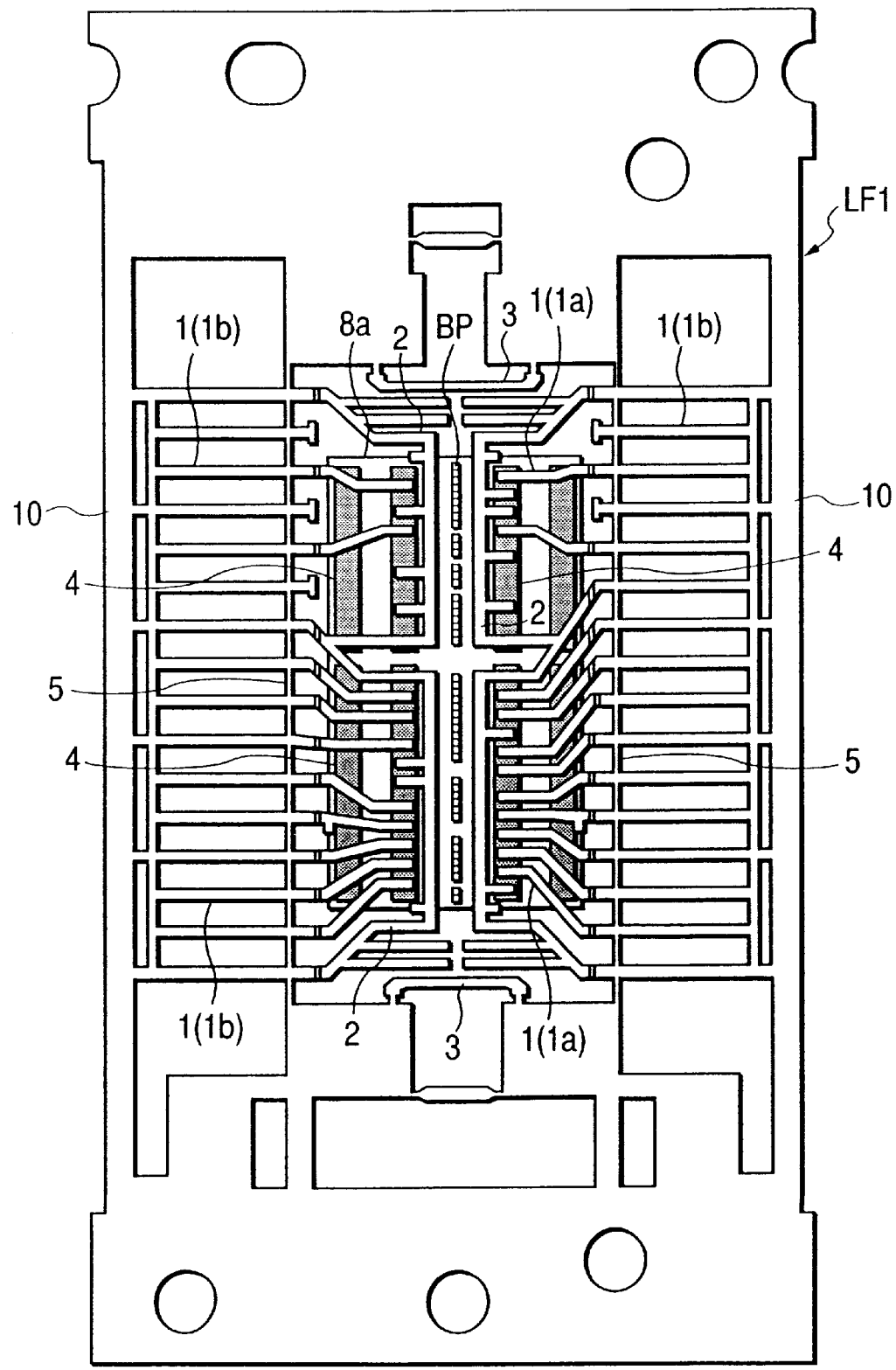
FIG. 6 is a plan view of the first lead frame showing the method of producing of the semiconductor device according to the first embodiment of this invention.
Figure 7:
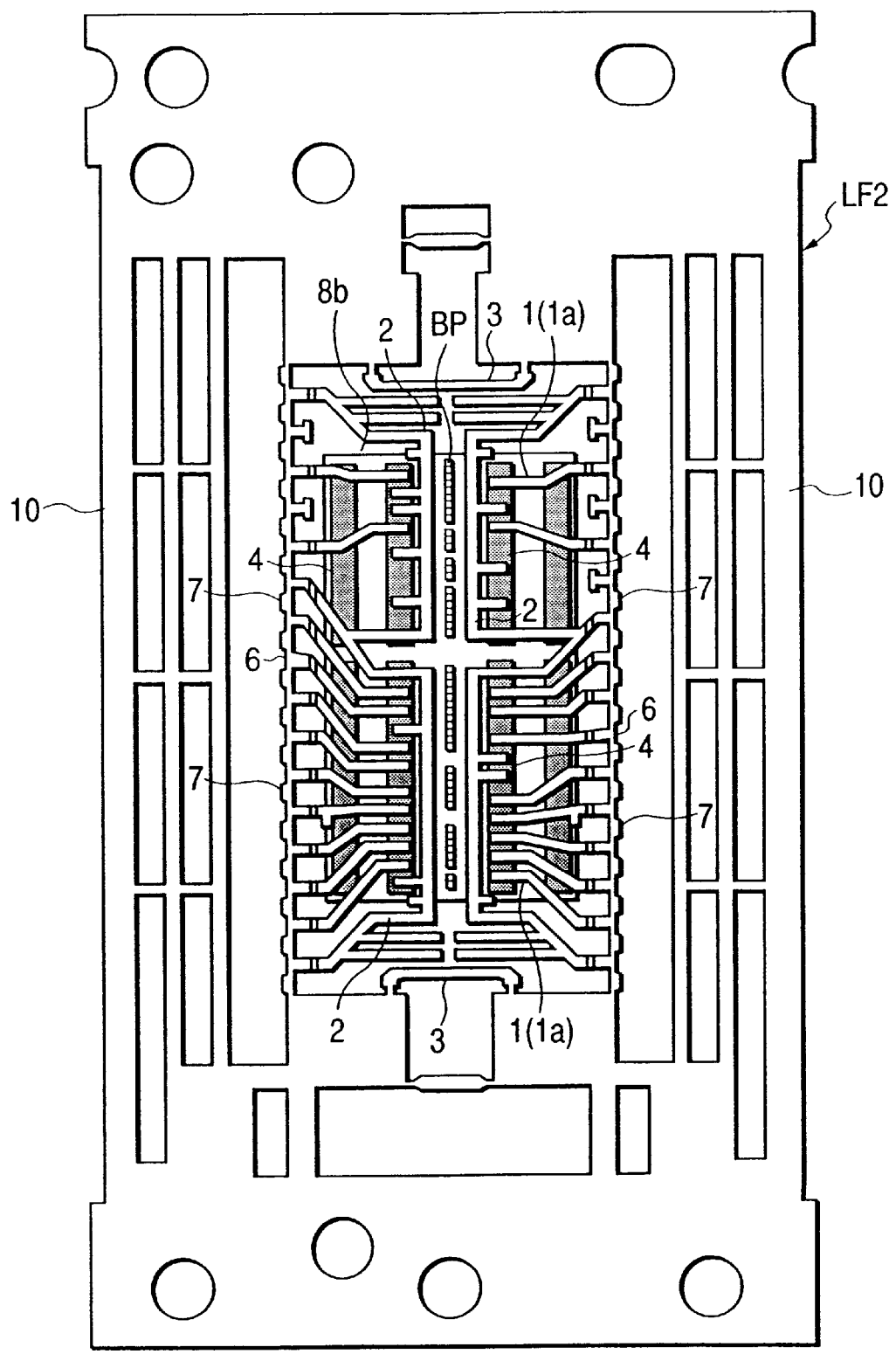
FIG. 7 is a plan view of the second lead frame showing the method of producing of the semiconductor device according to the first embodiment of this invention.

First, the lead frames LF1, LF2 and two semiconductor chips 8a, 8b are taken, the first semiconductor chip 8a is mounted on the first lead frame LF1, as shown in FIGS. 6 and 8(a), and the second semiconductor chip 8b is mounted on the second lead frame LF2, as shown in FIGS. 7 and 8(b).

The two aforesaid semiconductor chips 8a and 8b which comprise single crystal silicon are of identical dimensions, and a 64-megabit DRAM is formed on their element-forming surfaces. In the center of these element-forming surfaces, plural bonding pads BP which are formed by exposing part of aluminum (Al) interconnections, are formed. These bonding pads BP are arranged in one row in the length direction of the semiconductor chip 8a (8b). The above DRAM circuit pattern and the arrangement of the bonding pads BP are identical for the first semiconductor chip 8a and second semiconductor chip 8b. That is, the two semiconductor chips 8a, 8b have identical dimensions and an identical structure.

To mount the first semiconductor chip 8a in the first lead frame LF1, the element-forming surface of the semiconductor chip 8a is bonded to the lower surface of the insulating film 4 which is joined to the third part 1a3 of the inner lead part 1a of the lead 1a, as shown in FIG. 8(a). Similarly, to mount the second semiconductor chip 8b in the second lead frame LF2, the element-forming surface of the semiconductor chip 8b is bonded to the lower surface of the insulating film 4 which is joined to the third part 1a3 of the inner lead part 1a of the lead 1, as shown in FIG. 8(b).

Figure 9:
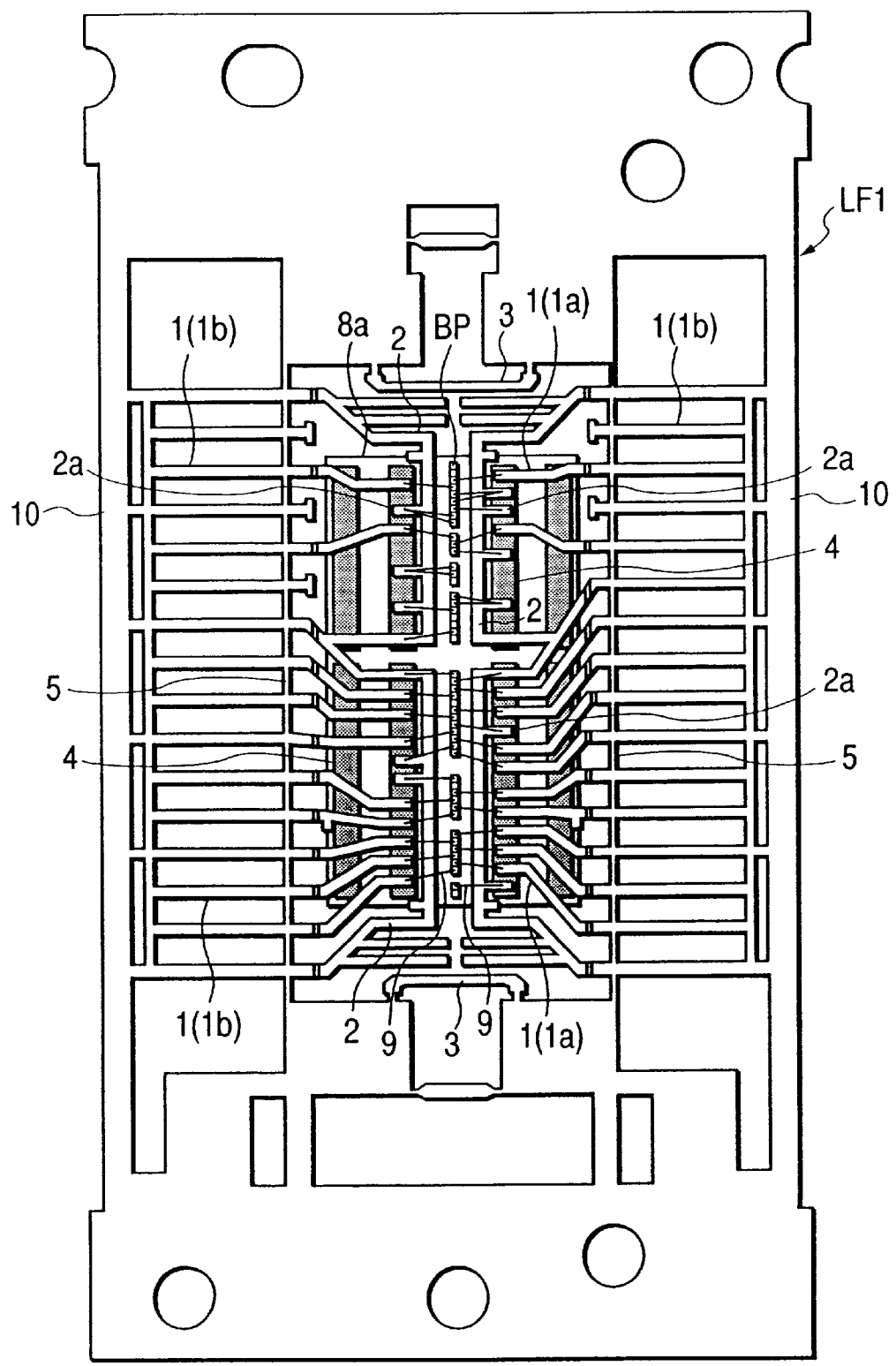
FIG. 9 is a plan view of the first lead frame showing the method of producing of the semiconductor device according to the first embodiment of this invention.
Figure 10:
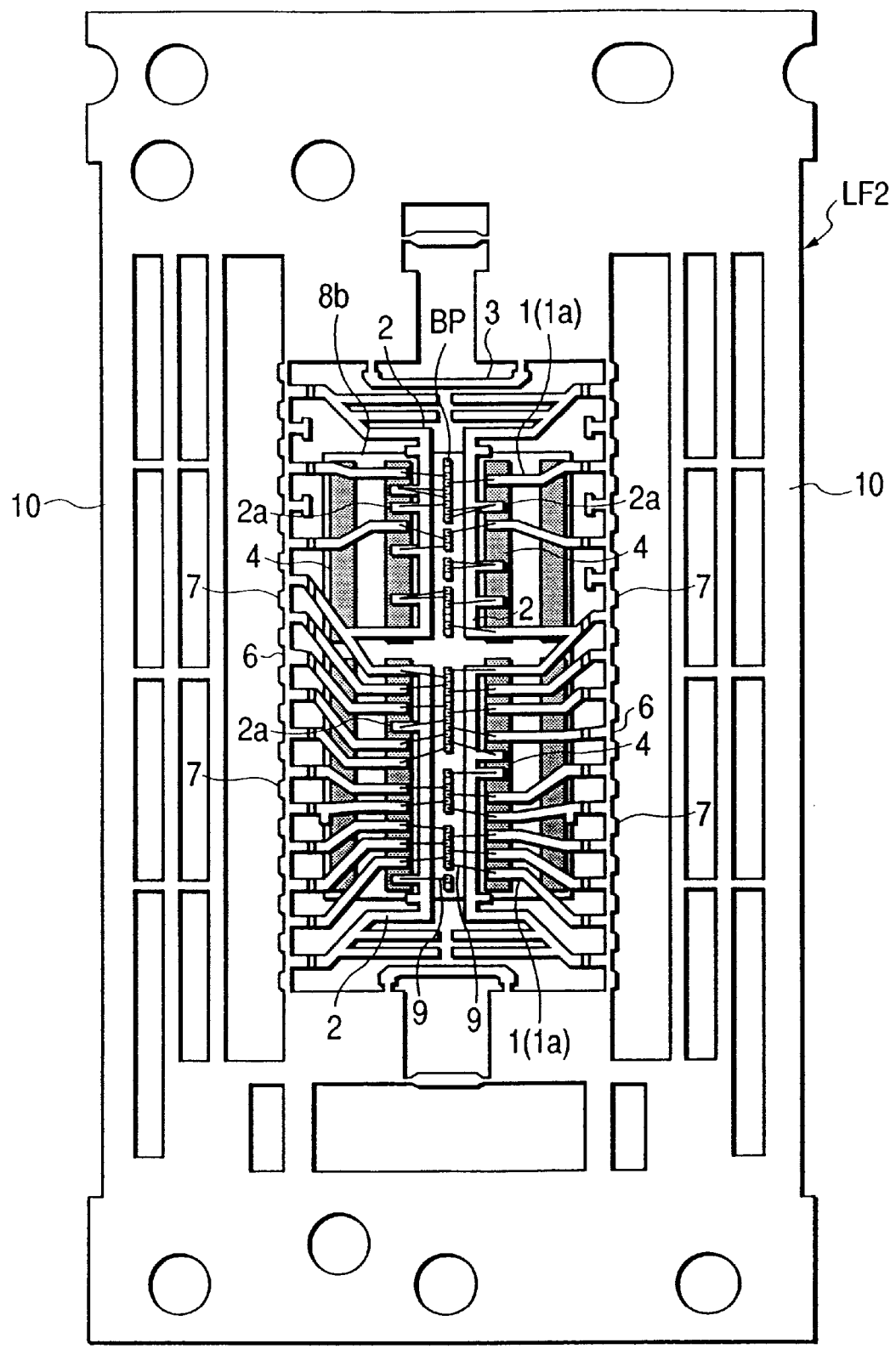
FIG. 10 is a plan view of the second lead frame showing the method of producing of the semiconductor device according to the first embodiment of this invention.

Next, the leads 1 of the lead frame LF1 and the bonding pads BP of the semiconductor chip 8a are electrically connected by wires 9, as shown in FIGS. 9 and 11(a). Also, the leads 1 of the lead frame LF2 and the bonding pads BP of the semiconductor chip 8b are electrically connected by the wires 9, as shown in FIGS. 10 and 11(b). The wires 9 may for example be gold (Au) wire. The wires 9 may be connected by wire bonding using, for example, thermocompression bonding and ultrasonic vibration.

As the semiconductor chip 8a is already fixed to the lead frame LF1 by the above-mentioned wire bonding process, connections of the wires 9 may be made smoothly with the semiconductor chip 8a and the lead frame LF1 mounted on a heat stage 20, as shown in FIG. 11(a). Likewise, as the semiconductor chip 8b is already fixed to the lead frame LF2, the connections of the wires 9 may be made smoothly with the semiconductor chip 8b and the lead frame LF1 mounted in the heat stage 20, as shown in FIG. 11(b).

In the semiconductor chips 8a and 8b, the connections of the leads 1 which comprise signal terminals and the bonding pads BP by the wires 9 are made by jumping over the bus bar leads 2, as shown in FIGS. 11(a) and 11(b). In this process, the ends of the wires 9 are joined to the third parts 1a3 of the inner lead parts 1a. As the insulating film 4 is joined to the lower surface of this third part 1a3, the impact of bonding given to the element-forming surface is absorbed by the insulating film 4.

In the semiconductor chips 8a and 8b, the connections of the bus bar leads 2 which comprise power supply (reference) potential terminals and the bonding pads BP by the wires 9, are made by joining the ends of the wires 9 to branch leads 2a formed in a part of each bus bar lead 2, as shown in FIGS. 9 and 10. As shown in the drawing, the ends of the branch leads 2a extend in a direction away from the bonding pads BP. Hence, the length of the wire 9 of which one end is connected to the branch lead 2a, is substantially equal to the length of the wire 9 of which one end is connected to the inner lead part 1a of the lead 1 comprising a signal terminal, so the wires 9 have good bondability. Moreover, as shown in the drawing, the insulating film 4 is joined to the lower surface of the branch lead 2a, so the impact of bonding given to the element-forming surface of the semiconductor chip 8a (8b) is absorbed with the insulating film 4.

Next, as shown in FIG. 12, the two lead frames LF1, LF2 are superimposed so that the lower surfaces of the two semiconductor chips 8a, 8b are in contact. Contact of the lower surfaces of the two semiconductor chips 8a, 8b is maintained by the elasticity of the inner lead parts 1a which are bent in the center (second parts 1a2). Also, in the lead frame LP1 and the lead frame LF2, the frame bodies 10, the first parts 1a1 of the inner lead parts 1a and the dam bars 5, 6 are in contact. In the two semiconductor chips 8a and 8b, these lower surfaces may also be fixed using an adhesive.

Next, these components are positioned between an upper die 30a and lower die 30b of a mold 30 with the lower surfaces of the two lead frames LF1, LF2 superimposed, as shown in FIG. 13. In this process, the semiconductor chips 8a, 8b, the inner lead parts 1a of the leads 1 of the lead frames LF1, LF2, the insulating film 4 and the wires 9, are arranged inside a cavity 31 formed by the upper die 30a and lower die 30b.

Figure 14A:
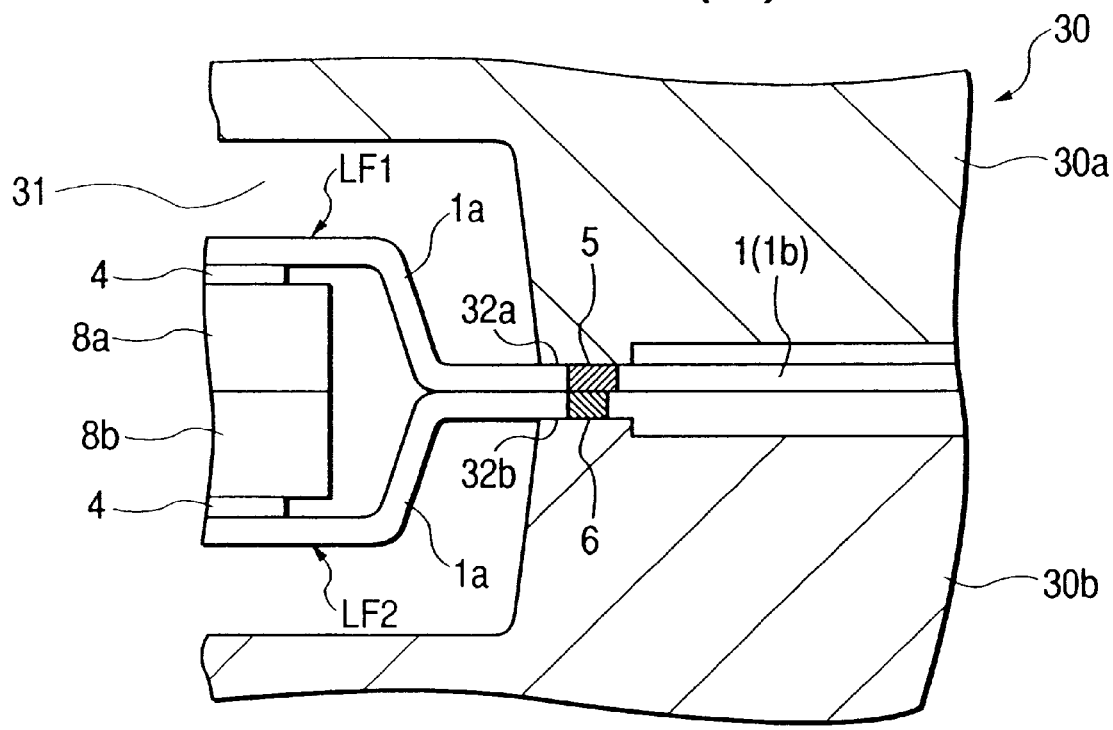
FIGS. 14(a) and 14(b) are sectional views of the essential parts of the mold showing the method of producing the semiconductor device according to the first embodiment of this invention.
Figure 14B:
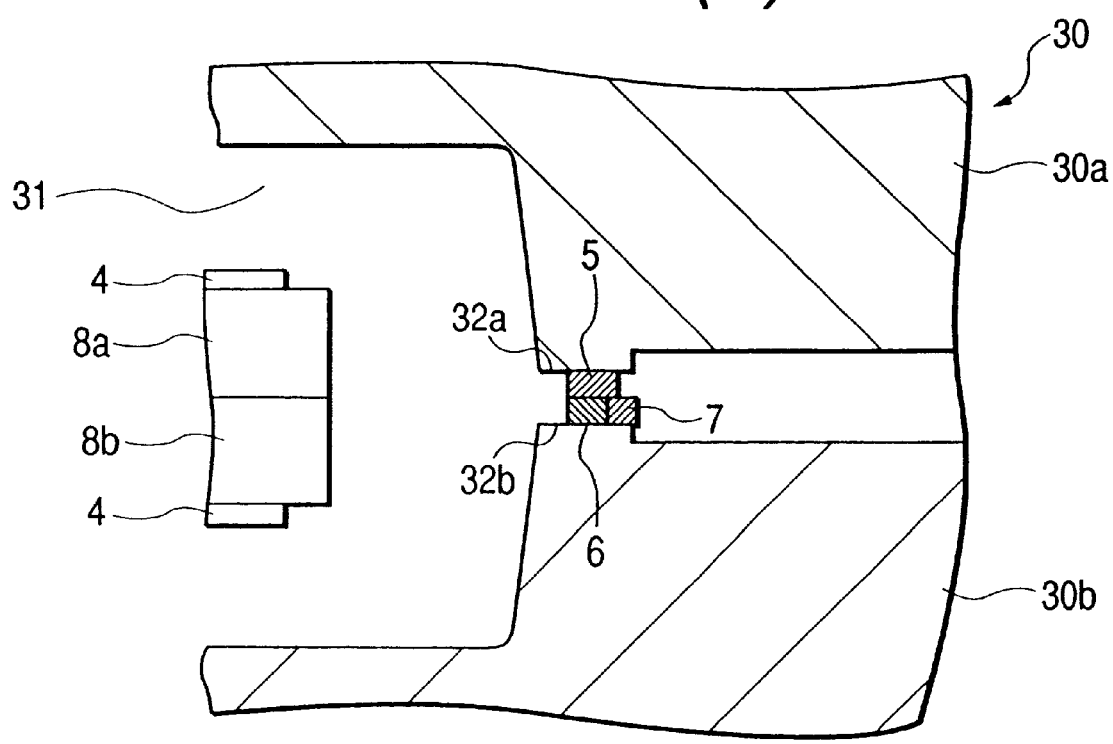
Figure 15:
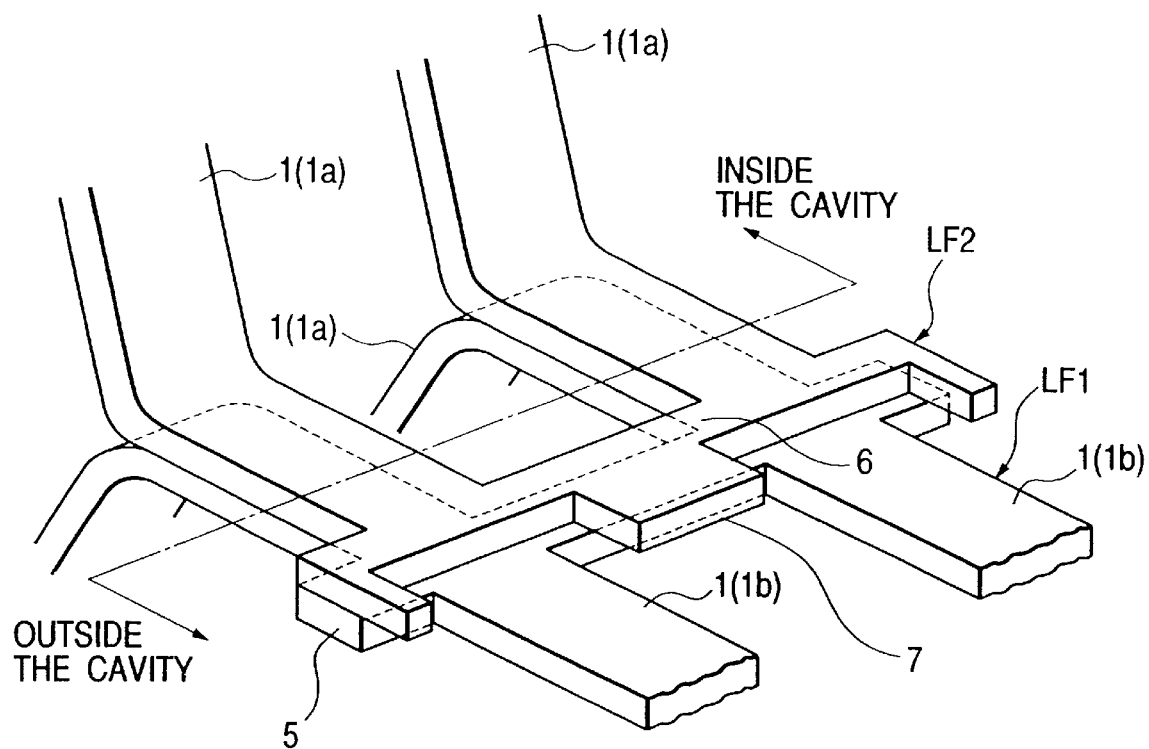
FIG. 15 is a perspective view the overlap state of dam bars at the edge of the cavity of the mold.

FIGS. 14(a) and 14(b) are sectional drawings showing an enlargement of the edge of the above-mentioned cavity 31. FIG. 14(a) shows a cross-section through the center line of the outer lead parts 1a of the leads 1 formed in the lead frame LF1, and FIG. 14(b) shows a cross-section through the center region of the space between the leads 1 (region in which the dummy lead 7 of the dam bar 6 of the lead frame LF2 is formed). FIG. 15 is a perspective view showing the overlap state of the dam bars 5 and 6 at the edge of the above-mentioned cavity 31. It should be noted that in FIG. 15, the arrangement of the upper and lower surfaces of the lead frames LF1, LF2 is the reverse of that in FIG. 14.

As shown in the drawing, the lead frames LF1 and LF2 are fixed in the mold 30 by the pressing of the darn bars 5, 6 and the leads 1 near to them from a vertical direction by a clamp surface 32a of the upper die 30a, and a clamp surface 32b of the lower die 30b. In the region in which the dummy lead 7 is not formed in the dam bar 6 of the lead frame LF2, the width of the dam bar 6 is narrower than that of the dam bar 5, so the contact area of the clamp surface 32b of the lower die 30b and the dam bar 6 is small, as shown in FIG. 14(a). However, in the region in which the dummy lead 7 is formed on the side of the dam bar 6, both the dam bar 6 and the dummy lead 7 come in contact with the clamp surface 32b of the lower die 30b, as shown in FIG. 14(b). That is, by forming the dummy lead 7 on the side wall of the dam bar 6, the contact area of the clamp surface 32b of the lower die 30b and the dam bar 6 effectively increases although the width of the dam bar 6 is narrower.

Next, although not shown, a package (resin body) 11 is formed by pressure injection of resin into the cavity 21 through a runner and a gate from a pot of the mold 30. The resin which forms the resin body 11 may for example comprise an epoxy resin which a phenol type curing agent, silicone rubber and filler have been added.

According to this embodiment wherein the dummy lead 7 is formed in the dam bar 6 which is one of dam bars of the two lead frames LF1, LF2 used for producing the resin-sealed semiconductor device, the contact area between the clamp surface 32b of the mold 30 and the dam bar 6 is maintained although the width of the dam bar 6 is made narrower, so the dam bar 5 of the lead frame LF1 and the dam bar 6 of the lead frame LF2 are firmly fixed between the clamp surface 32a of the upper die 30a, and the clamp surface 32b of the lower die 30b. Thereby, deformation of the dam bar 6 of narrow width towards the outside of the cavity 21 due to pressure when resin is injected into the cavity 21 of the mold 30, is prevented, and molding defects due to leakage of resin outside the cavity 21 through the gap between the dam bar 5 and the dam bar 6, are completely prevented.

Moreover, by preventing deformation of the dam bar 6 due to the injection pressure of resin, wear on the clamp surfaces 32a, 32b of the mold 30 is reduced, and scatter in the clamping force of the dam bars 5 and 6 due to the distortion of the mold is also suppressed, hence repair costs for the mold 30 are reduced and its lifetime is extended.

Figure 16:
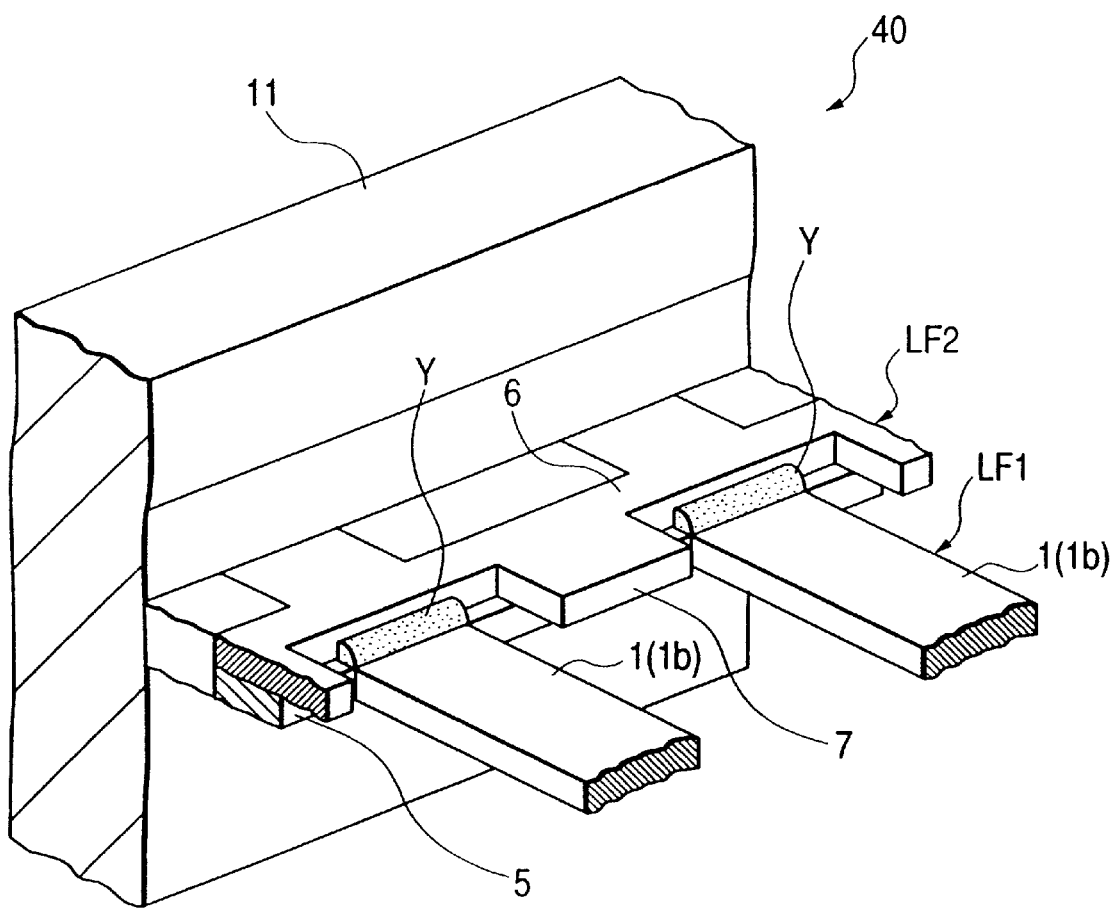
FIG. 16 is a perspective view of an enlargement of essential parts showing the method of producing the semiconductor device according to the first embodiment of this invention.

Next, after removing the lead frames LF1, LF2 from the mold 30, as shown in FIG. 16, the lateral surfaces (parts shown by a letter Y in the diagram) of the dam bar 5 of the lead frame LF1 and the dam bar 6 of the lead frame LF2 which are exposed on the side of the resin body 11 are joined, for example by seam welding with a laser.

Figure 17:
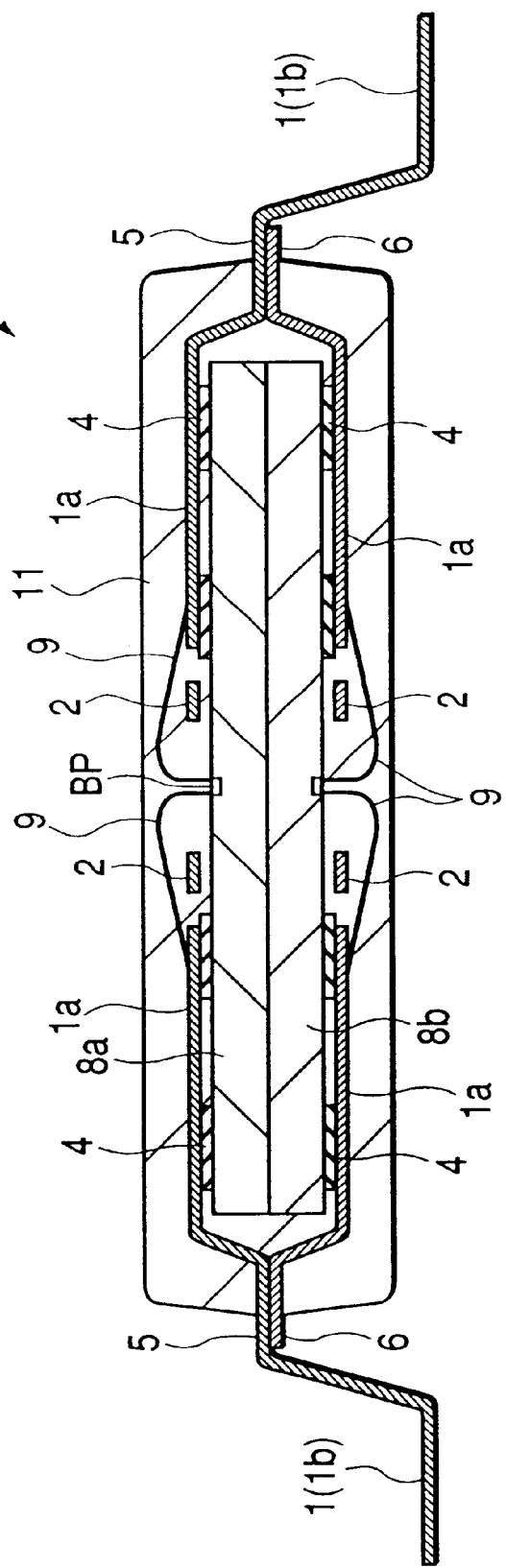
FIG. 17 is a sectional view of the semiconductor device according to the first embodiment of this invention.

Next, after solder plating the upper surfaces of the lead frames LF1 and LF2 exposed from the side of the resin body 11, unnecessary parts (of the dam bars 5, 6 and the frame body (10) of the lead frames LF1, LF2 are cut off, resin that remained in the gaps between the side of the package 11 and the dam bars 5, 6 is removed (deburring), and the outer lead parts 1b of the leads 1 are formed into, for example, a gull-wing shape to give a TSOP 40, a finished product in which the two semiconductor chips 8a, 8b are sealed as shown in FIG. 17.

Figure 18A:
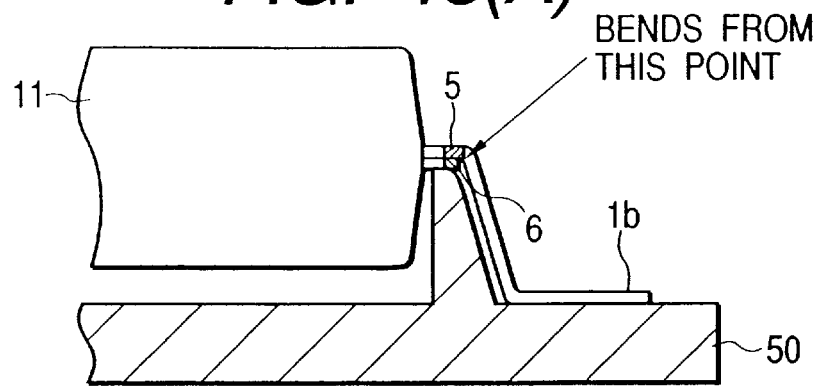
FIGS. 18(a), 18(b) and 18(c) are descriptive drawings showing a lead cutting and shaping method.
Figure 18B:
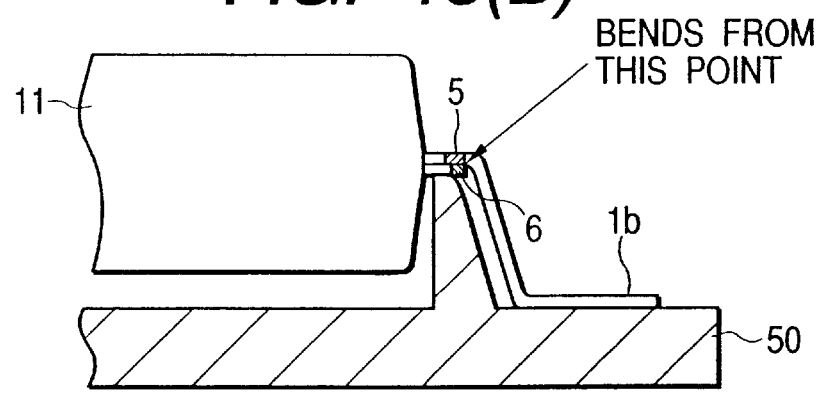

Cutting of unnecessary parts (the dam bars 5 and 6 and frame body 10) of the lead frames LF1, LF2 and shaping of the outer lead parts 1b are simultaneously performed with the lower parts of the dam bars 5 and 6 supported in the R part of a cutting die 50, as shown in FIGS. 18(a) and 18(b). In this process, the outer lead parts 1b of the lead frame LF1 are bent towards the dam bar 6 of the lead frame LF2. As a result, the effective length of the outer lead parts 1b is longer compared to the case where they are bent in the opposite direction to the dam bar 6, so that, when the TSOP 40 is mounted on a printed circuit board, stress on solder connections due to a difference in the coefficient of thermal expansion of the TSOP 40 and the printed circuit board, is easily absorbed by deformation of the outer lead parts 1b, and the connection reliability of the TSOP 40 improves.

Figure 18C:
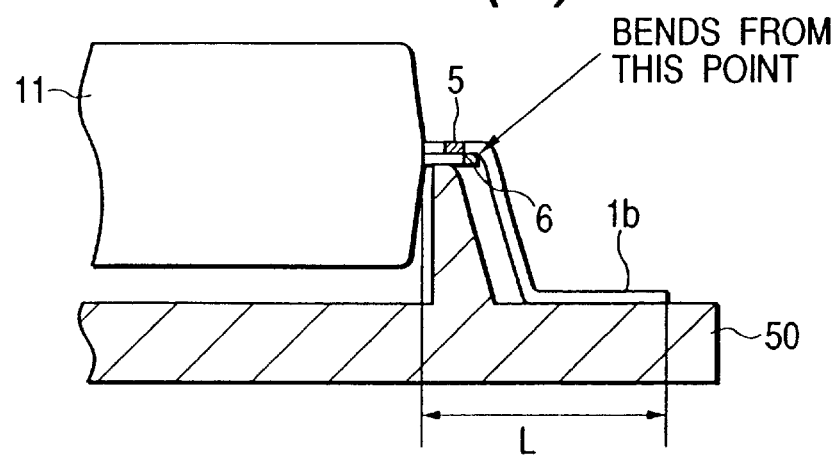

Moreover, by making the width of the dam bar 6 of the lead frame LF2 narrower than the width of the dam bar 5 of the lead frame LF1, the outer side face of the dam bar 6 is disposed further inside than the outer side face of the dam bar 5, as shown in FIG. 18(a). Even if a mismatch occurs between the two lead frames LF1 and LF2, the outer side face of the dam bar 6 is never disposed further outside than the outer side of the dam bar 5, as shown in FIG. 18(b). Therefore, when the outer lead parts 1b are bent towards the dam bar 6, the lower surfaces of the outer lead parts 1b are bent toward the outer side face of the dam bar 5, or further inside. Conversely, if the outer side face of the dam bar 6 were disposed further outside than the outer side face of the dam bar 5, the lower surfaces of the outer lead parts 1b would be bent further outside than the outer side face of the dam bar 5 as shown in FIG. 18(c), so the length (L) from the side of the resin body 11 to the ends of the outer lead parts 1b would exceed the specification of the TSOP.

Figure 19:
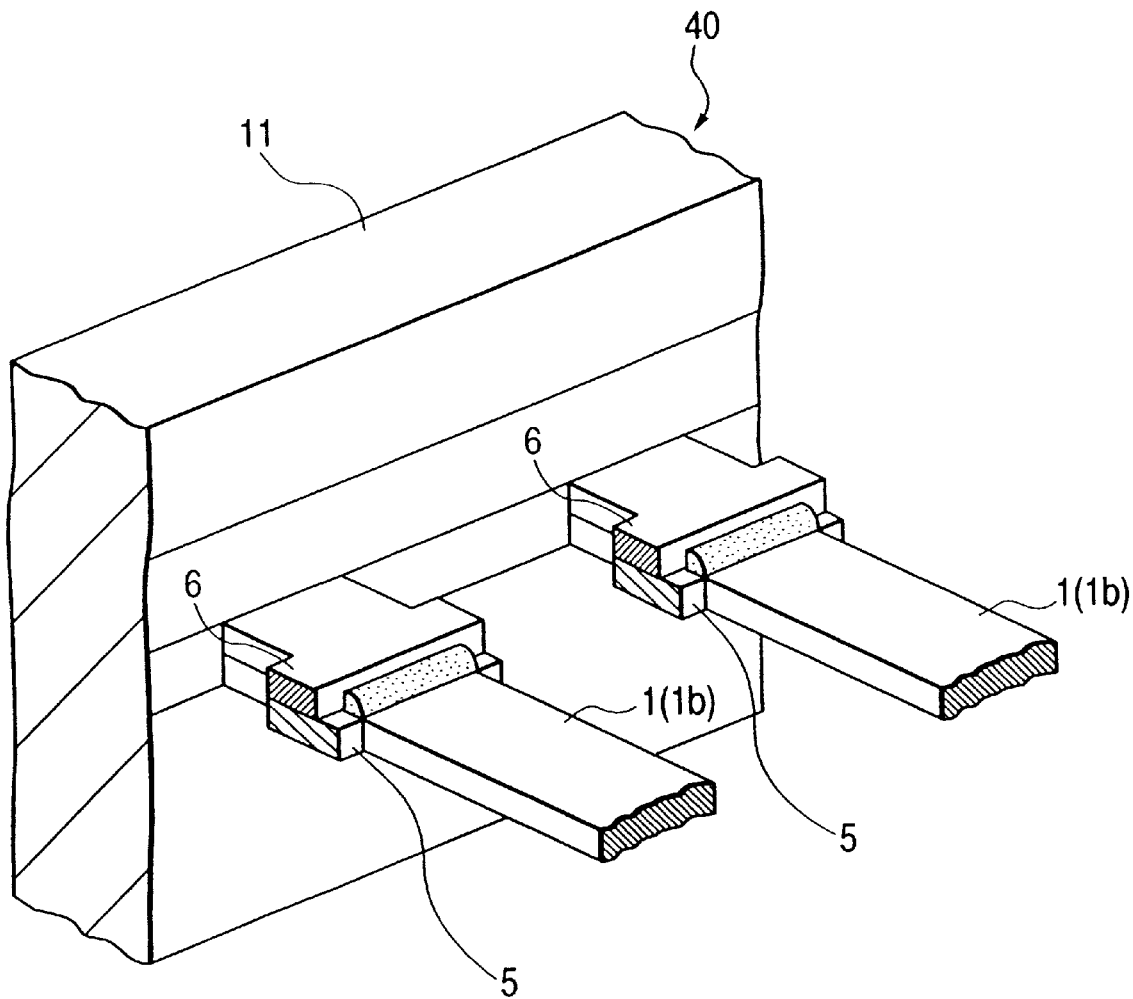
FIG. 19 is a perspective view of an enlargement of essential parts showing the method of producing the semiconductor device according to the first embodiment of this invention.

The cutting of the dam bars 5 and 6 using the above-mentioned cutting die 50 is performed in the region where the width of the dam bar 5 is narrow (region in which the dummy lead 7 is not formed), as shown in FIG. 19. Hence, the stress on the cutting die 50 is reduced even when the two dam bars 5 and 6 are cut simultaneously, so repair costs of the cutting die 50 are reduced and its lifetime is extended. Also, cutting burrs and the amount of solder plating waste formed on the cut surfaces of the dam bars 5 and 6 are reduced, short-circuits between leads is prevented, and the TSOP40 can be made more compact.

Figure 20:
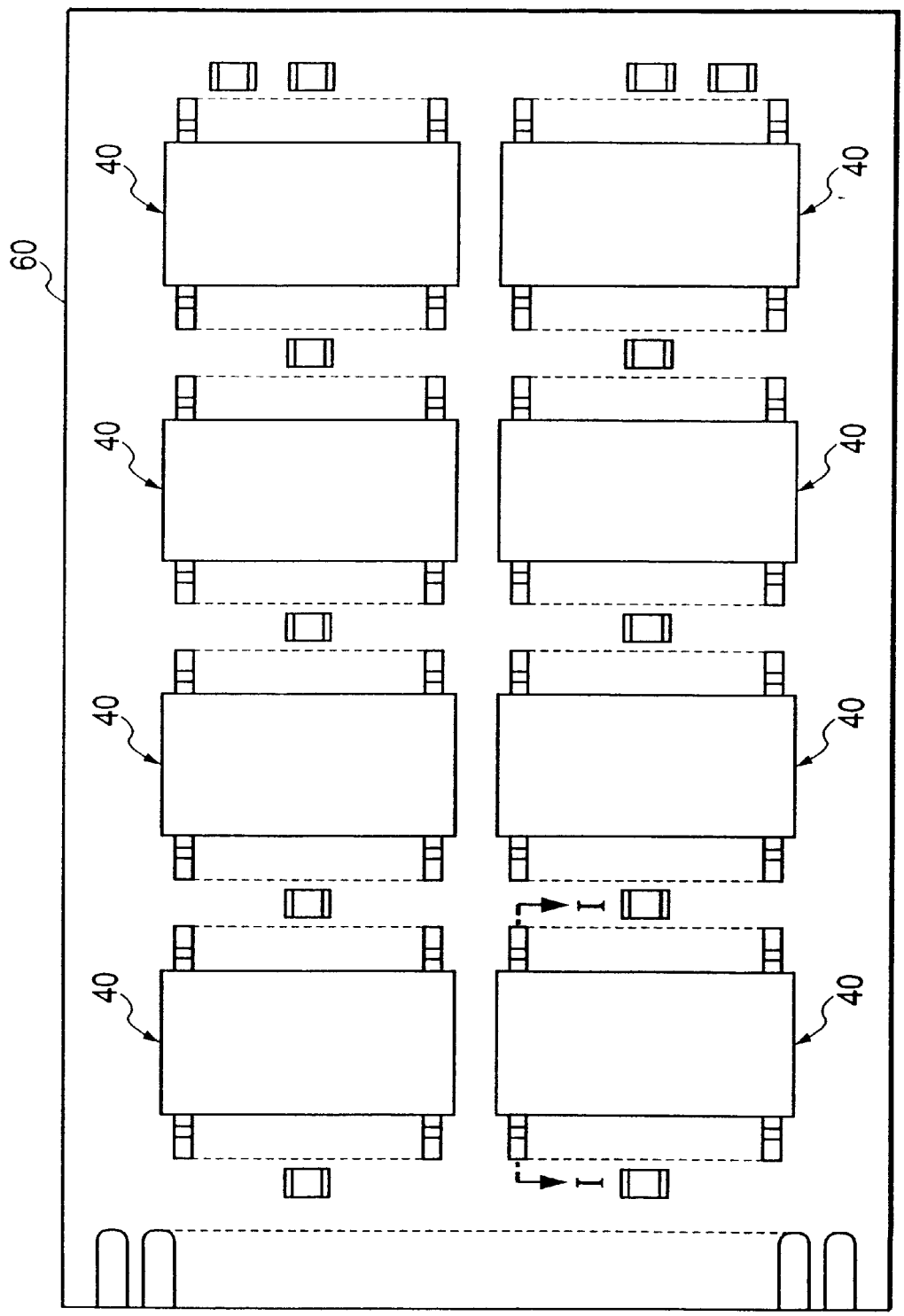
FIG. 20 is a plan view showing the state where the semiconductor device according to the first embodiment of this invention is mounted on a printed circuit board.
Figure 21:
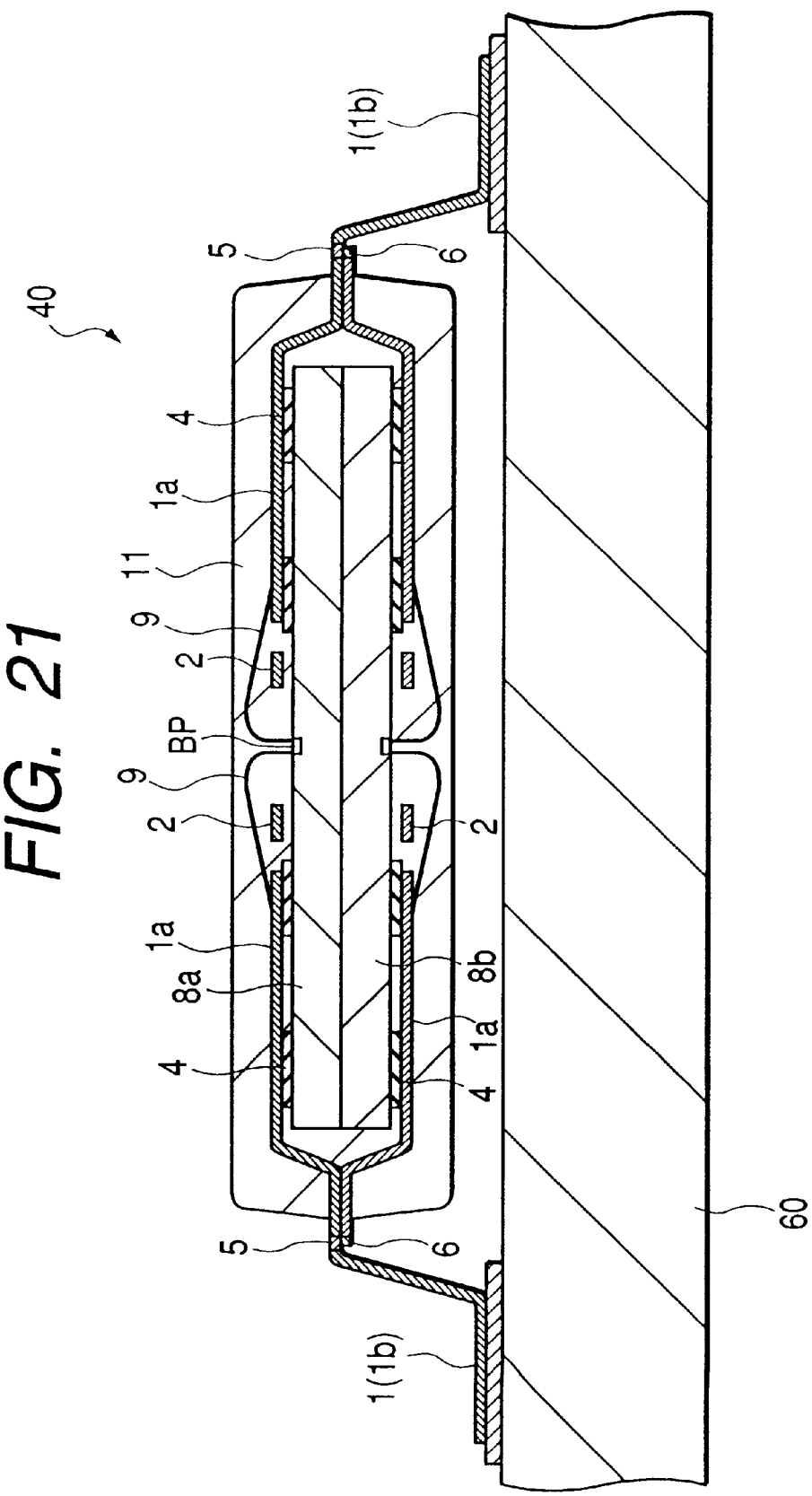
FIG. 21 is a sectional view along a line I—I in FIG. 20.

A plurality of the TSOP40 of this embodiment produced in this way may be mounted on a printed circuit board 60, and used as structural components of an electronic device forming one circuit system, as shown in FIG. 20 (plan view) and FIG. 21 (sectional view through a line I—I of FIG. 20).

(Embodiment 2)

Figure 22A:
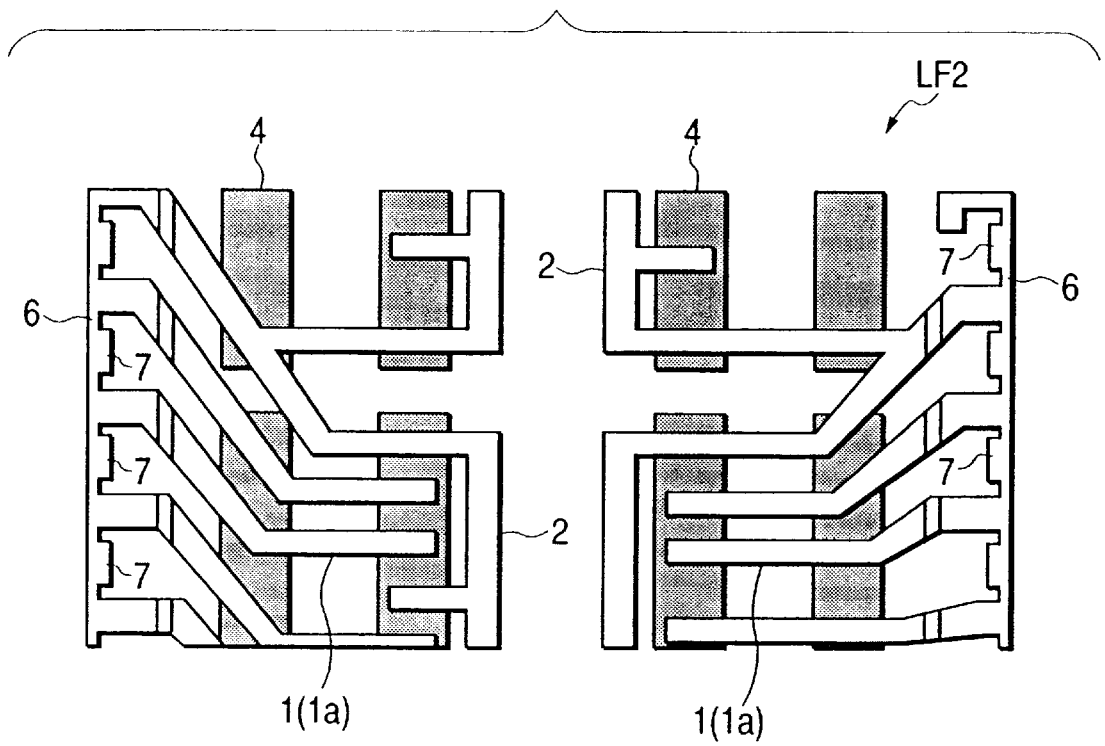
FIG. 22(a) is a plan view showing an enlargement of part of a second lead frame used in a second embodiment of this invention.
Figure 22B:
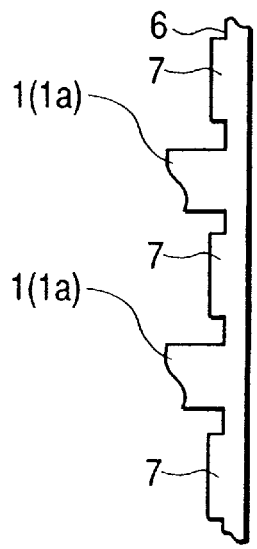
FIG. 22(b) is a plan view showing a further enlargement of part of FIG. 22(a).

In the above-mentioned embodiment, the dummy lead 7 formed in the dam bar 6 of the lead frame LF2 is disposed on the opposite side to the side on which the inner lead parts 1a are interconnected, however this dummy lead 7 maybe disposed on the side on which the inner lead parts 1a are interconnected as shown in FIGS. 22(a) and 22(b).

Figure 23:
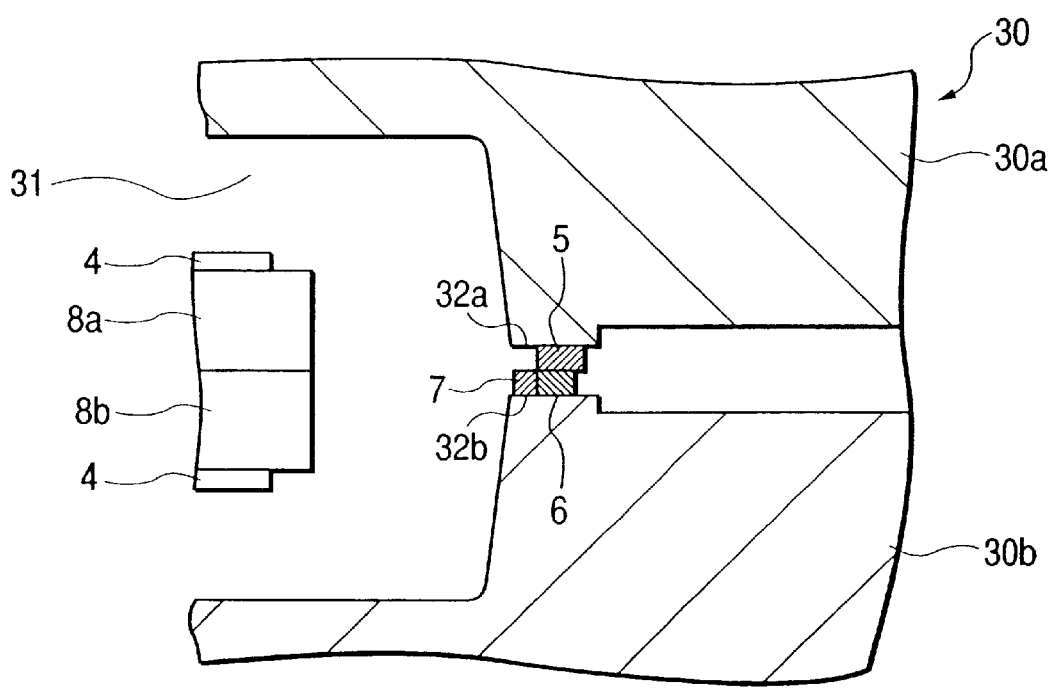
FIG. 23 is a perspective view of an enlargement of essential parts of a mold showing the method of producing the semiconductor device according to the second embodiment of this invention.

In this case also, as the contact area between the clamp surface 32b of the lower die 30b of the mold 30 and the dam bar S effectively increases as shown in FIG. 23, the same effect is obtained as in the above-mentioned embodiment.

According to this embodiment wherein the dummy lead 7 is disposed on the side nearer to the resin body 11, the amount of resin remaining in the gap between the side face of the resin body 11 and the dam bar 6 is reduced, so deburring is easy.

(Embodiment 3)

Figure 24A:
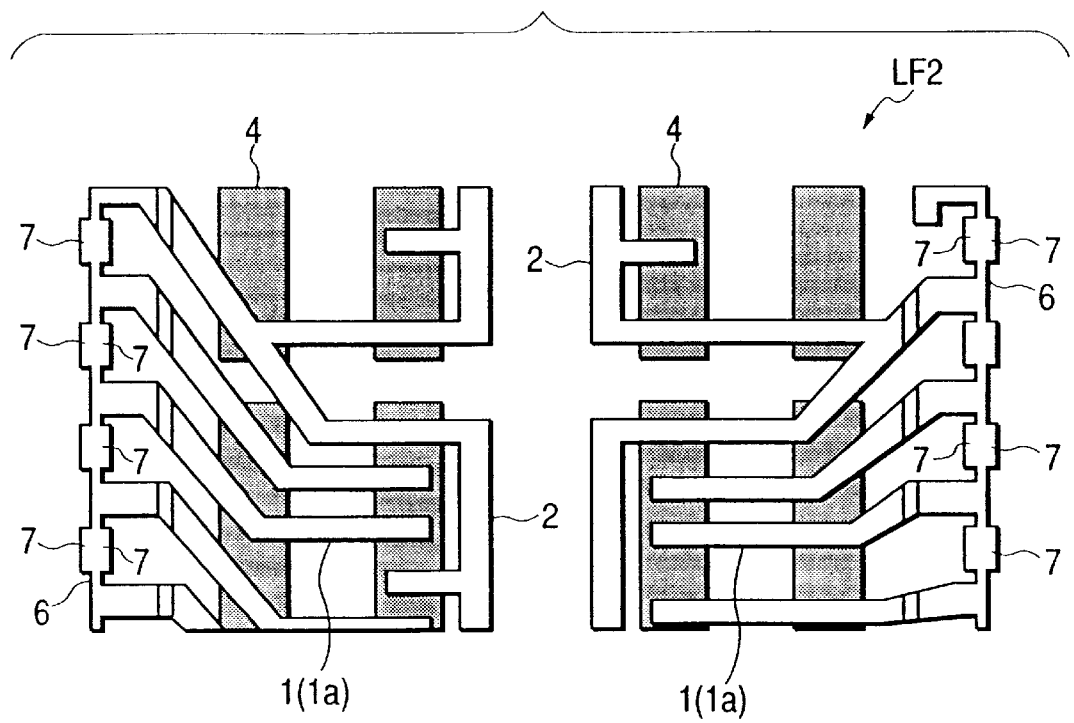
FIG. 24(a) is a plan view showing an enlargement of part of a second lead frame used in a third embodiment of this invention.
Figure 24B:
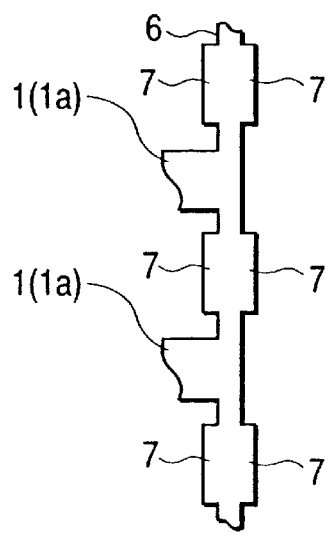
FIG. 24(b) is a plan view showing a further enlargement of part of FIG. 24(a).
Figure 25:
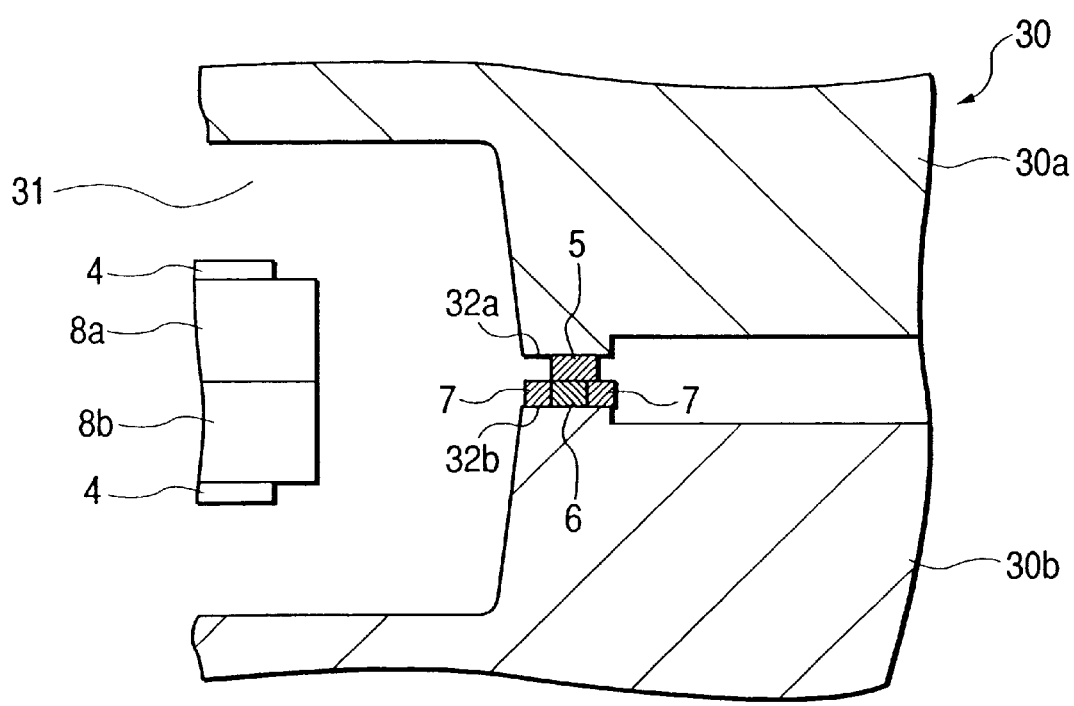
FIG. 25 is a perspective view of an enlargement of essential parts of a mold showing the method of producing the semiconductor device according to the third embodiment of this invention.

The dummy lead 7 may also be formed on both sides of the dam bar 6 of the lead frame LF2, as shown in FIGS. 24(a) and 24(b). In this case, as the contact area between the clamp surface 32b of the lower die 30b of the mold 30 and the dam bar 6 is further increased, as shown in FIG. 25, the dam bar 5 of the lead frame LF1 and the dam bar 6 of the lead frame LF2 are still more firmly fixed between the clamp surface 32a of the upper die 30a, and the clamp surface 32b of the lower die 30b.

In the above-mentioned embodiment, the inner lead parts of the leads and the semiconductor chips were joined via an insulating film, but the inner lead parts of the leads and the semiconductor chips may be joined directly by an adhesive.

In the above-mentioned embodiment, the outer lead parts of the first lead frame were bent toward the dam bar of the second lead frame, but they may be bent in the opposite direction.

In the above-mentioned embodiment, an example was described of application to the production of a TSOP type semiconductor device, but this invention is widely applicable to production of semiconductor devices in which two semiconductor chips are resin-sealed using two lead frames.

Embodiment 4

Figure 26:
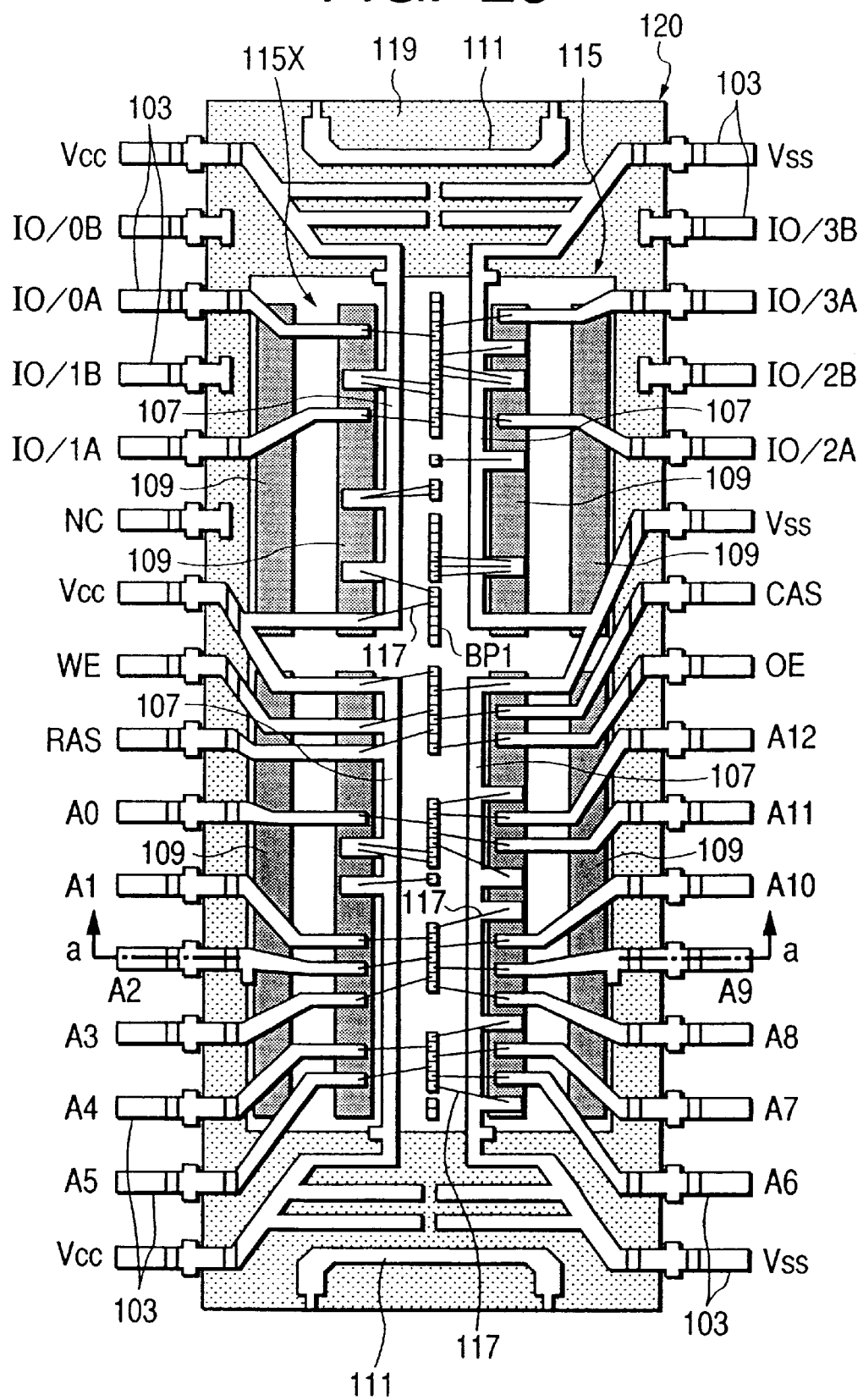
FIG. 26 is a plan view of a resin body of a semiconductor device according to a fourth embodiment of this invention with the upper part removed.
Figure 27:
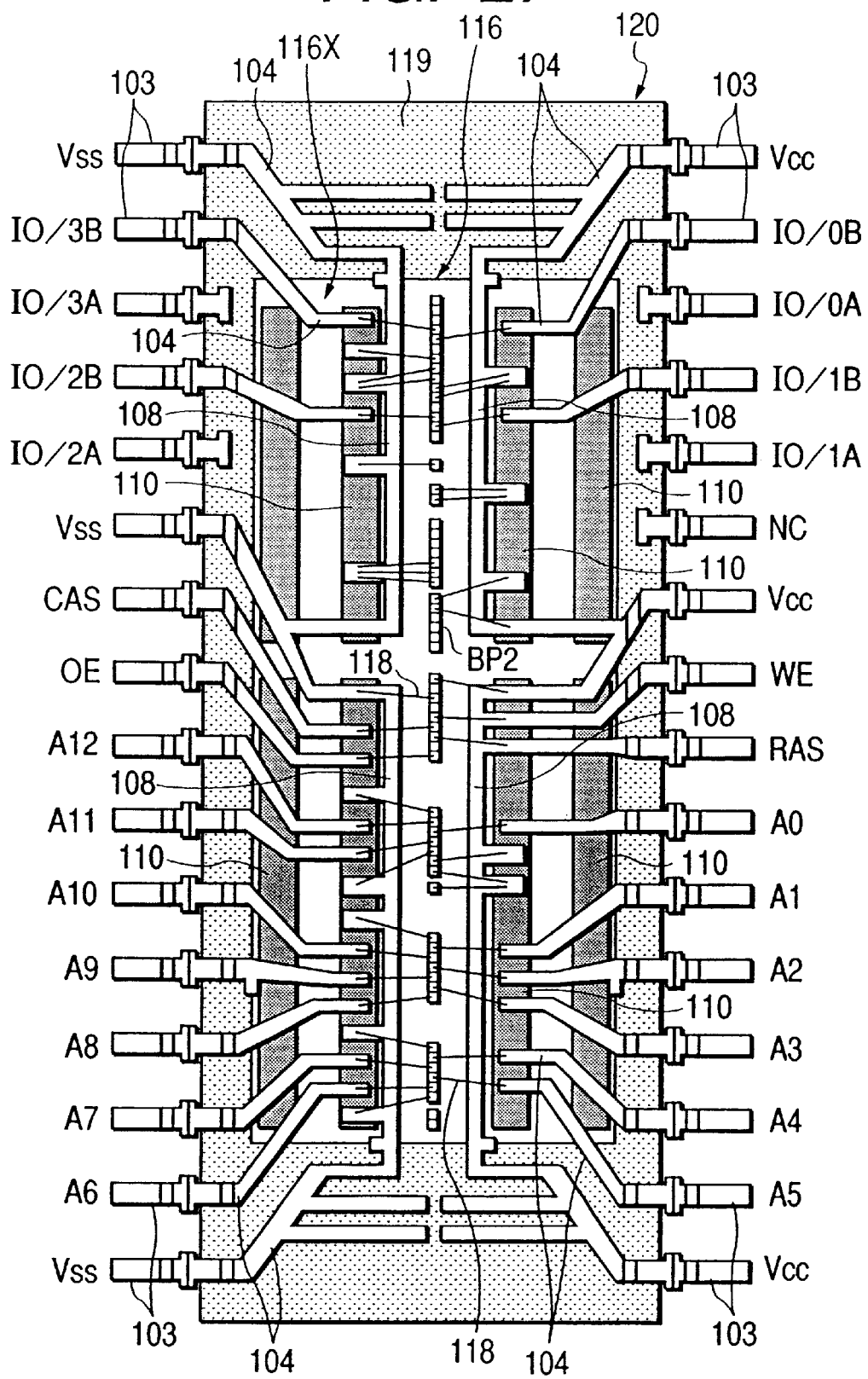
FIG. 27 is a plan view of a resin body of a semiconductor device according to the fourth embodiment of this invention with the lower part removed.
Figure 28:
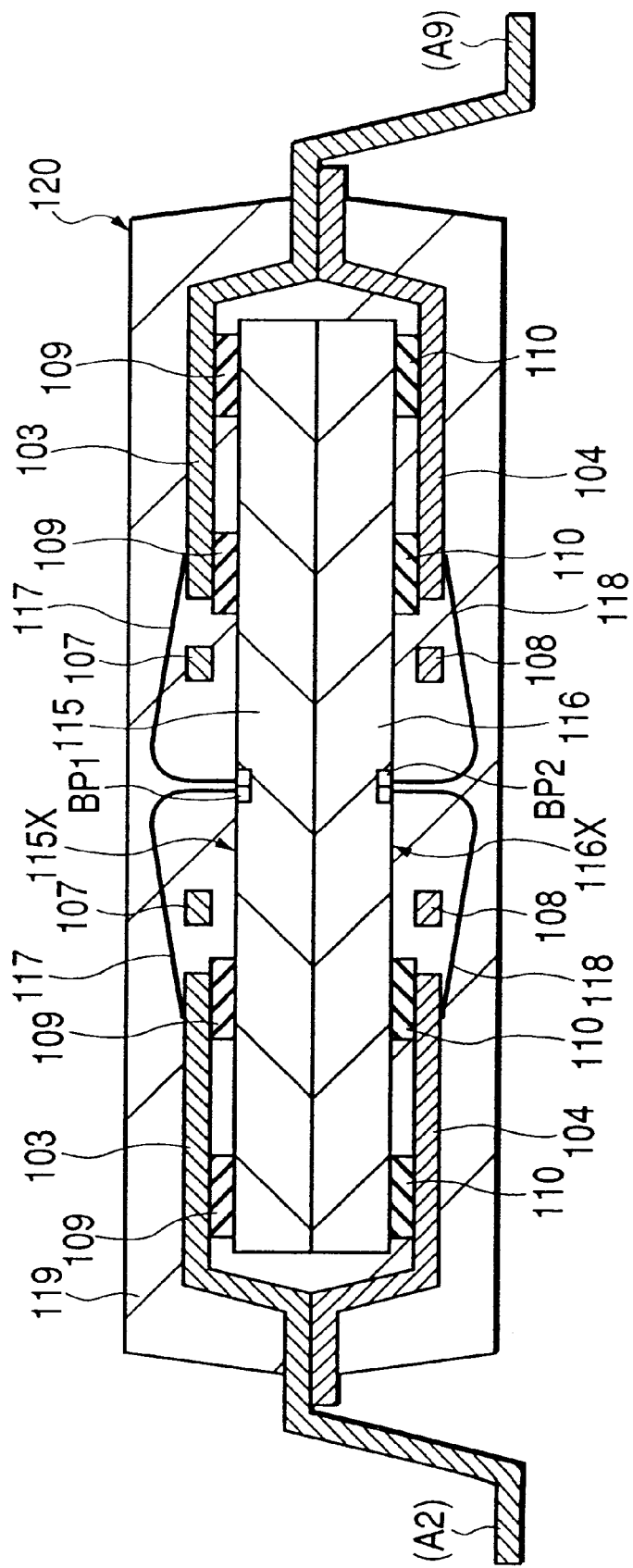
FIG. 28 is a sectional view along a line a—a of FIG. 26.
Figure 29:
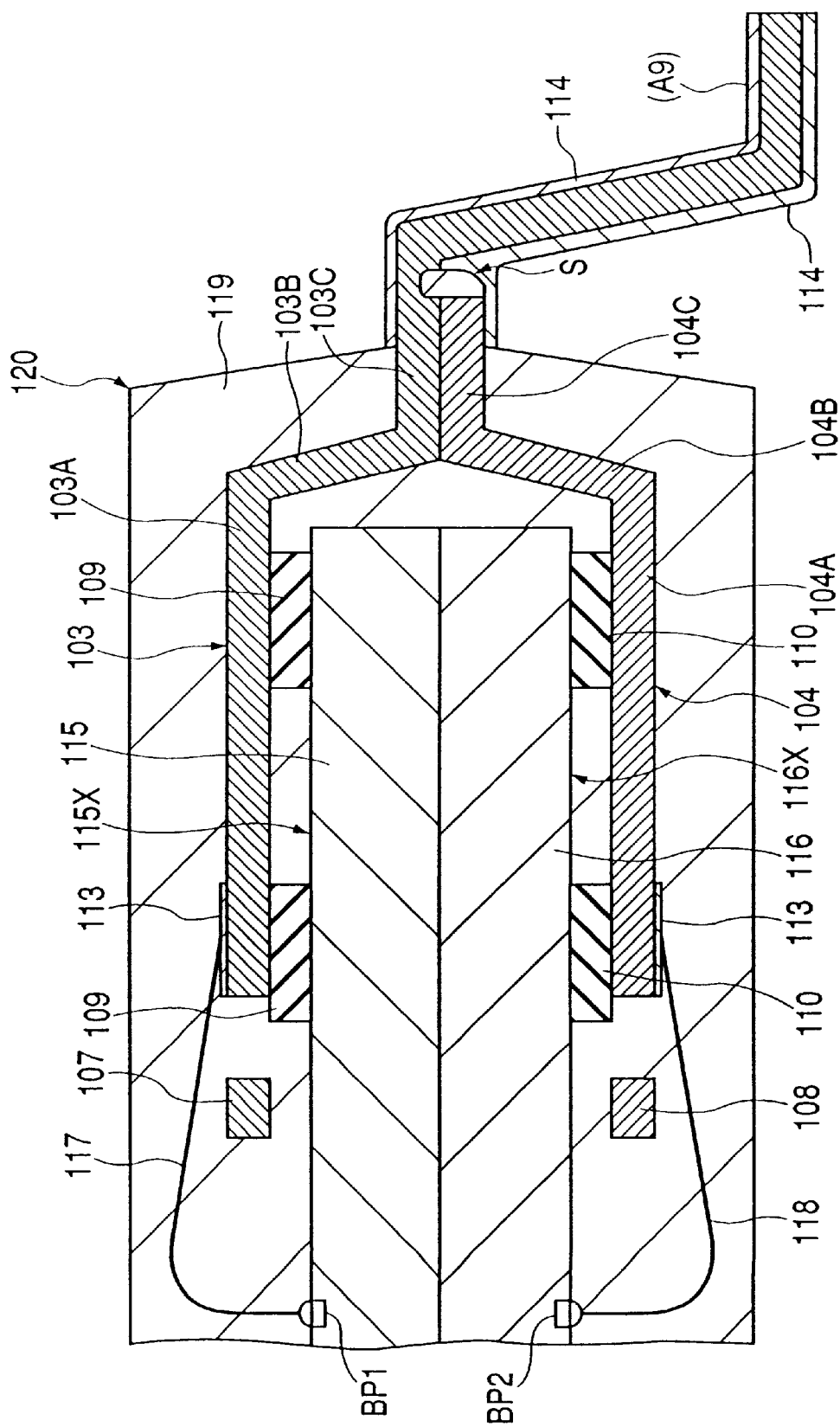
FIG. 29 is a sectional view showing the schematic construction of a semiconductor chip incorporated in the semiconductor device according to the fourth embodiment of this invention.
Figure 30:
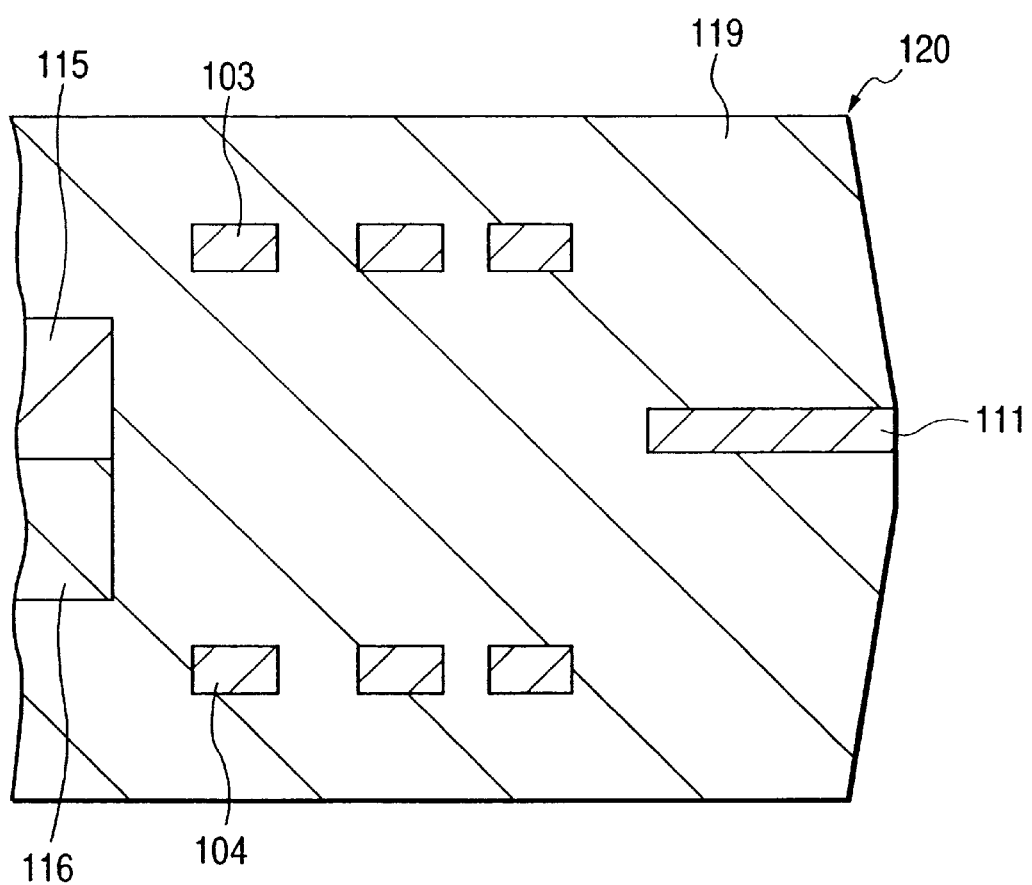
FIG. 30 is a sectional view of an enlargement of part of FIG. 28.
Figure 31:
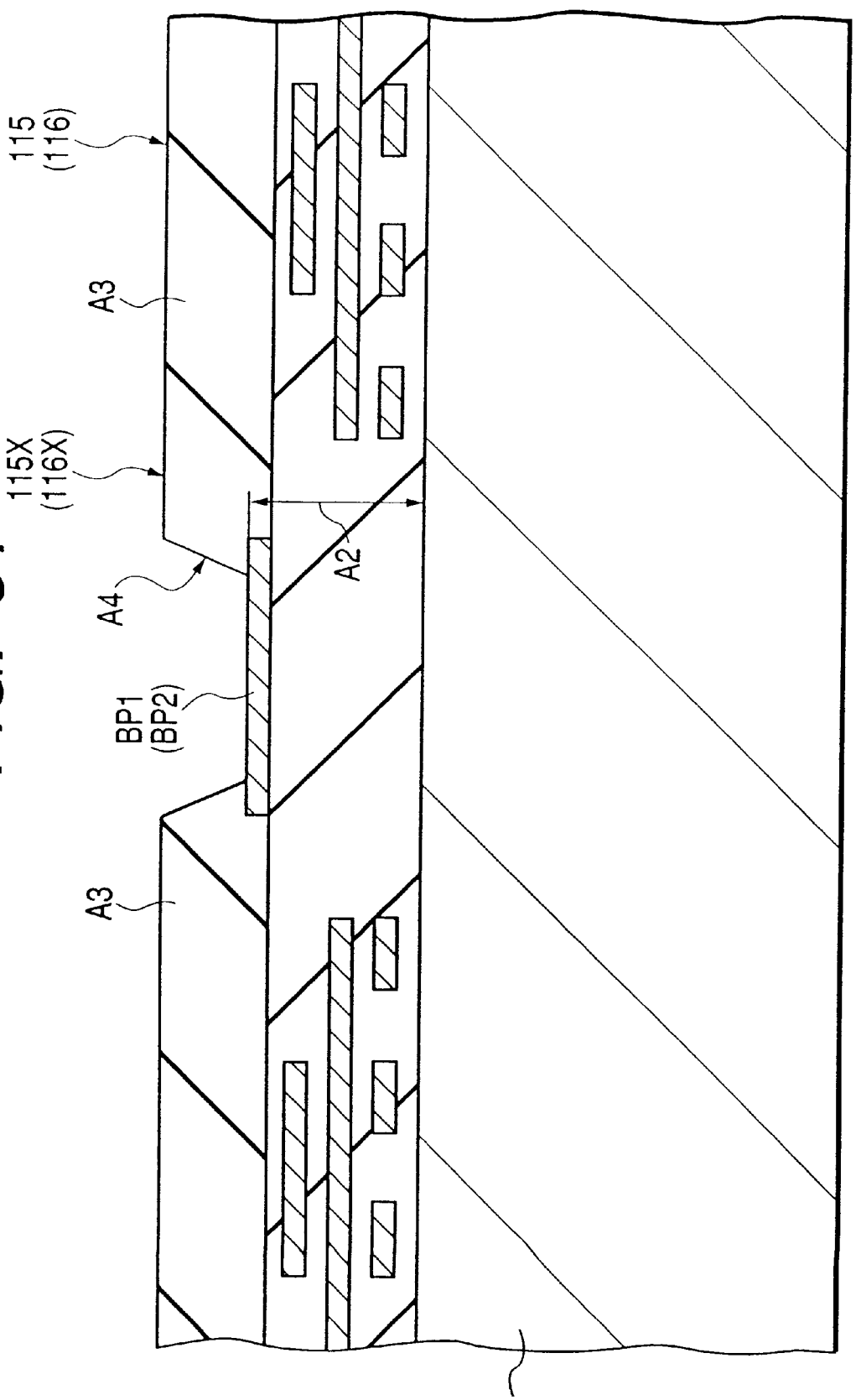
FIG. 31 is a sectional view of the essential parts of the semiconductor device according to the fourth embodiment of this invention.

FIG. 26 is a plan view of a state where the upper part of a resin body of a semiconductor device according to the fourth embodiment of this invention is removed, FIG. 27 is a bottom plan view of a state where the lower part of a resin body of the above-mentioned semiconductor device is removed, FIG. 28 is a sectional drawing along a line a—a of FIG. 26, FIG. 29 is sectional view of an enlargement of part of FIG. 28, FIG. 30 is a sectional view of the essential parts of the above-mentioned semiconductor device, and FIG. 31 is a sectional view of essential parts showing the schematic structure of the semiconductor chip assembled in the above-mentioned semiconductor device.

In addition, in FIGS. 26 and 27, the lead group on the left-hand side shown in FIG. 26 corresponds to the lead group on the right-hand side shown in FIG. 27, and the lead group on the right-hand side shown in FIG. 26 corresponds to the lead group on the left-hand side shown in FIG. 27.

As shown in FIGS. 26, 27 and 28, the semiconductor device 120 of this embodiment has a structure wherein a semiconductor chip 115 and semiconductor chip 116 are laminated in the vertical direction, and this semiconductor chip 115 and semiconductor chip 116 are sealed by one resin body 119.

The semiconductor chips 115 and 116 are laminated with the lower surfaces (other surfaces) of their respective upper and lower surfaces (one main surface and another opposite main surface) facing each other. The semiconductor chips 115 and 116 are formed with identical external dimensions. Moreover, the flat surface of each of the semiconductor chips 115 and 116 is formed in a rectangular shape, and in this embodiment is formed in the shape of a rectangle. The semiconductor chips 115, 116 may for example comprise a 64-megabit DRAM (Dynamic Random Access Memory) as a storage circuit system.

Each of the semiconductor chips 115 and 116 has a structure essentially comprising a semiconductor substrate A1, an insulating layer formed on the circuit-forming surface of this semiconductor substrate A1, a multi-interconnection layer comprising plural interconnection layers superimposed on each other, and a surface protection layer A3 (final protection layer) formed so as to cover the multi-interconnection layer A2. The semiconductor substrate A1 is formed for example by single crystal silicon, the insulating layer is formed for example by a silicon oxide film, and the interconnection layer is formed for example by a metal films such as aluminum (Al) or an aluminum alloy. Also, the surface protection layer A3 is formed for example from polyimide resin which can offer improved alpha ray resistance in the memory, and can provide better adhesion with the resin of a resin body 119.

As shown in FIGS. 26, 28 and 31, plural electrodes (bonding pads) BP1 arranged in the direction of the long side are formed in the center of a circuit-forming surface 115X which is the upper surface (a main surface) of the upper and lower surfaces (main surface and another main surface which are opposite each other), of the semiconductor chip 115. The plural electrodes BP1 are formed in the uppermost interconnection layer of the multi-interconnection layer A2 of the semiconductor chip 115. The uppermost interconnection layer is covered by the surface protection layer A3 formed above it, and a bonding aperture A4 which exposes the upper surface of the electrodes BP1 is formed in this surface protection layer A3.

As shown in FIGS. 27, 28 and 31, plural electrodes (bonding pads) BP2 arranged in the direction of the long side are formed in the center of a circuit-forming surface 116X which is the upper surface (a main surface) of the upper and lower surfaces (main surface and another main surface which are opposite each other), of the semiconductor chip 116. The plural electrodes BP2 are formed in the uppermost interconnection layer of the multi-interconnection layer A2 of the semiconductor chip 115. The uppermost interconnection layer is covered by the surface protection layer A3 formed above it, and a bonding aperture A4 which exposes the upper surface of the electrodes BP2 is formed in this surface protection layer A3.

The DRAM circuit pattern built into the semiconductor chip 115 is an identical circuit pattern to the DRAM circuit pattern built into the semiconductor chip 116. Moreover, the pattern of the electrodes BP1 formed on the circuit-forming surface 115X of the semiconductor chip 115 is identical to the pattern of the electrodes BP2 formed on the circuit-forming surface 116X of the semiconductor chip 116. That is, the semiconductor chip 115 and semiconductor chip 116 have an identical structure.

As shown in FIGS. 26, 27 and 28, the flat surface of the resin body 119 is rectangular, and in this embodiment is formed in the shape of a rectangle. Plural leads 103 and plural leads 104 are respectively arranged along the long sides, which are opposite sides, of the resin body 119. The plural leads 103 and plural leads 104 extend inside and outside the resin body 119, and comprise inner lead parts situated inside the resin body 119, and outer lead parts situated outside the resin body 119. The outer lead parts of the plural leads 103 are bent in a gull-wing type lead configuration which is one type of surface-mounted lead configuration. The outer lead parts of the plural leads 104 are formed in a length shorter than that of the outer lead parts of the leads 103.

The leads 103 and leads 104 are laminated so that part of each is superimposed in the vertical direction (the direction of lamination of the semiconductor chip). Parts of the leads 103 and leads 104 extend inside and outside the resin body 119, and are electrically and mechanically connected by melt joining using laser welding outside the resin body 119. Specifically, the outer lead parts of the leads 103 are used as outer connection terminals shared by the two semiconductor chips (115, 116).

Terminal names are assigned to the outer lead parts of the plural leads 103. A terminal Vcc is a power supply potential terminal which is fixed at a power supply potential (for example, 5 [V]). A terminal Vss is a reference potential terminal which is fixed at a reference potential (for example, 0 [V]).

A terminal IO/0A, terminal IO/0, terminal IO/1A, terminal IO/1B, terminal IO/2A, terminal IO/2B, terminal IO/3A terminal and terminal IO/3B are data input/output terminals. Terminals A0–A12 are address input terminals. A terminal RAS is a row address strobe terminal. A terminal CAS is a column address strobe terminal. A terminal WE is a read/write enable terminal. A terminal OE is an output enable terminal. A terminal NC is an open terminal.

Of the leads 103 which are address input terminals (A0–A12), a lead 103 which is an RAS terminal, a lead 103 which is a CAS terminal, and a lead 103 which is an OE terminal, the inner lead parts which are situated inside the resin body 119 are bonded to the circuit-forming surface 115X of the semiconductor chip 115 via an insulating film 109, and electrically connected to the electrodes BP1 of the circuit-forming surface 115X via electrically conducting wires 117, as shown in FIG. 26.

The inner lead parts of the lead 103 which is the terminal Vcc and the lead 103 which is the terminal Vss, and which are situated inside the resin body 119, are formed in one piece with the bus bar lead 107 disposed on the circuit-forming surface 115X of the semiconductor chip 115, as shown in FIG. 26. The bus bar lead 107 extends between the ends of the inner lead parts of the other leads 103 and the electrodes BP1 in the alignment direction of the electrodes BP1. The bus bar lead 107 is formed in one piece with branch leads which are bonded to the circuit-forming surface 115X of the semiconductor chip 115 via the insulating film 109, and these branch leads are electrically connected to the electrodes BP1 of the semiconductor chip 115 via the electrically conducting wires 117.

The inner lead parts of the terminal IO/0A, terminal IO/1A, terminal IO/2A and terminal IO/3A situated inside the resin body 119 are bonded to the circuit-forming surface 115X of the semiconductor chip 115 via the insulating film 109, and are electrically connected to the electrodes BP1 of the semiconductor chip 115 via the electrically conducting wires as shown in FIG. 26.

The inner lead parts of the terminal IO/0B, terminal IO/1B, terminal IO/2B and terminal IO/3B situated inside the resin body 119 are disposed outside the boundary of the semiconductor chip 115, and are not electrically connected to the electrodes BP1 of the semiconductor chip 115.

The inner lead parts of leads 104 respectively connected with the leads 103 which are the terminals A0–A12, a lead 104 connected with the lead 103 which is the terminal RAS, a lead 104 connected with the lead 103 which is the terminal CAS, a lead 104 connected with the lead 103 which is the terminal WE, a lead 104 connected with the lead 103 which is the terminal OE, are bonded to the circuit-forming surface 116X of the semiconductor chip 116 via the insulating film 110, and are electrically connected to the electrodes BP2 of the semiconductor chip 116 via the electrically conducting wires 118, as shown in FIG. 27.

The inner lead parts of the lead 104 connected to the lead 103 which is the terminal Vcc, and the lead 104 connected to the lead 103 which is the terminal Vss, which are situated inside the resin body 119, are formed in one piece with the bus bar lead 108 disposed on the circuit-forming surface 116X of the semiconductor chip 116, as shown in FIG. 27. The bus bar lead 108 extends between the ends of the inner lead parts of the other leads 104 and the electrodes BP2 in the alignment direction of the electrodes BP2. The bus bar lead 108 is formed in one piece with branch leads which are bonded to the circuit-forming surface 116X of the semiconductor chip 116 via the insulating film 110, and these branch leads are electrically connected to the electrodes BP2 of the semiconductor chip 116 via the electrically conducting wires 118.

The inner lead parts of the leads 104 connected to the respective leads 103 which are the terminal IO/0B, terminal IO/1B, terminal IO/2B and terminal IO/3B situated inside the resin body 119 are bonded to the circuit-forming surface 116X of the semiconductor chip 116 via the insulating film 110, and are electrically connected to the electrodes BP2 of the semiconductor chip 116 via the electrically conducting wires 118, as shown in FIG. 27.

The inner lead parts of the leads 104 connected to the respective leads 103 which are the terminal IO/0A, terminal IO/1A, terminal IO/2A and terminal I0/3A situated inside the resin body 119 are disposed outside the boundary of the semiconductor chip 116, and are not electrically connected to the electrodes BP2 of the semiconductor chip 116.

That is, the semiconductor device 120 of this embodiment consists of a laminated structure in which the semiconductor chip 115 and the semiconductor chip 116 are laminated over each other, is an LOC (Lead On Chip) structure in which the leads 103 and the bus bar leads 107 are disposed on the circuit-forming surface 115X of the semiconductor chip 115, and the leads 104 and the bus bar leads 108 are disposed on the circuit-forming surface 116X of the semiconductor chip 116.

The inner lead parts of the leads 103, which are electrically connected to the electrodes BP1 of the semiconductor chip 115, essentially comprise a first part 103A which crosses one side of the semiconductor chip 115 and extends over the circuit-forming surface 115X, a second part 103B which is bent from this first part 103A to the lower surface side of the semiconductor chip 115, and a third part 103C which extends from this second part 103B in the same direction as the first part 103A, as shown in FIG. 29. The first part 103A is bonded to the circuit-forming surface 115X of the semiconductor chip 115 via the insulating film 109, and its end is disposed near the electrodes BP1 of the semiconductor chip 115. The third part 103C extends inside and outside the resin body 119, and its outer lead part which is bent in a gull-wing shape extending from the resin body 119, comprises a shoulder (base part).

The inner lead parts of the leads 104, which are electrically connected to the electrodes BP2 of the semiconductor chip 116, essentially comprise a first part 104A which crosses one side of the semiconductor chip 116 and extends over the circuit-forming surface 116X, a second part 104B which bends from this first part 104A to the lower surface side of the semiconductor chip 116, and a third part 104C which extends from this second part 104B in the same direction as the first part 104A, as shown in FIG. 29. The first part 104A is bonded to the circuit-forming surface 116X of the semiconductor chip 116 via the insulating film 110, and its end is disposed near the electrodes BP2 of the semiconductor chip 116. The third part 104C extends inside and outside the resin body 119, and the part extending from the resin body 119 forms an outer lead part.

The inner lead parts of the leads 103 not electrically connected to the electrodes BP1 of the semiconductor chip 115 mainly comprise the third part 103C. Also, the inner lead parts of the leads 104 not electrically connected to the electrodes BP2 of the semiconductor chip 116 mainly comprise the third part 104C.

The third parts (103C, 104C) of the leads 103 and the leads 104 are superimposed in the vertical direction, and are joined by welding outside the resin body 119. Welding is performed at a location distant from the resin body 119, specifically at an end S of the third part 104C. As described in detail later, the welding is accomplished by forming the resin body 119, and then irradiating the end part S by laser light from above the outer lead parts of the leads 104.

To improve bondability of the leads and wires (117, 118) at the wire connection in the first part 103A of the lead 103, and the wire connection in the first part 104A of the lead 104, a metal layer 113 comprising a silver (Ag) film formed for example by non-electrolytic plating may be provided, and the wires (117, 118) connected via this metal layer 113. The metal layer 113 is provided also in the wire connections of the branch lead joined to the bus bar lead (107, 108).

The outer lead parts of the leads 103 and the leads 104 are coated with an electrically conducting film 114 which comprises for example a lead (Pb)-tin (Sn) composition, in order to improve solder leak properties during mounting and improvement in anti-corrosion properties. The electrically conducting film 114 will be described in detail later. It is formed by electroplating wherein the film thickness can be easily controlled, and which is suitable for fine leads.

Trailing leads 111 inside the resin body 119 are disposed on the outside of the two opposite short sides of the semiconductor chip 115, as shown in FIG. 26. The trailing leads 111 are for supporting the resin body 119 in the frame body of the lead frame in the assembly process used to produce the semiconductor device 120. As described in detail later, the trailing leads 111 are provided in one of the two lead frames, but not in the other. That is, there are no adjacent surfaces formed by superimposing two trailing leads inside the resin body 119, as shown in FIG. 30.

The resin body 119 comprises an epoxy resin to which, for example, a phenolic curing agent, silicone rubber and a filler may be added to reduce stress. Silicone rubber has the effect of reducing the elastic modulus and the thermal expansion coefficient of the epoxy resin. The filler is formed of spherical particles of silicon oxide, and also has the effect of reducing thermoelasticity. The resin body 119 is formed by a suitable transfer molding method for mass production. The transfer molding method is a method using a mold equipped with a pot, runner, inflow gate and cavity, in which a resin body is formed by pressure injecting a resin into the cavity through the runner and inflow gate from the pot.

The insulating film (109, 110) may, for example, be a resin film obtained by forming a polyimide resin adhesive layer on both sides (upper surface and lower surface) of polyimide resin substrate. The electrically conducting wire (117, 118), may for example, be a gold (Au) wire, and it may be connected by bonding using, for example, thermocompression together with ultrasonic vibration.

In the semiconductor device 120 of this embodiment, the inner lead parts of the leads 103 are bonded to the circuit-forming surface 115X of the semiconductor chip 115 via the insulating film 109, and the inner lead parts of the leads 104 are bonded to the circuit-forming surface 116X of the semiconductor chip 116 via the insulating film 110. The semiconductor chip 115 and semiconductor chip 116 are laminated with their lower surfaces facing each other.

Due to this construction, there are no leads 103 or leads 104 between the semiconductor chip 115 and semiconductor chip 116, therefore, compared to the case where leads are disposed between one semiconductor chip and the other semiconductor chip as in a prior art semiconductor device, the space between the semiconductor chip 115 and the semiconductor chip 116 can be made narrower, so the thickness of the resin body 119 can be made thinner by a corresponding amount.

Moreover, as there are no leads 103 and leads 104 between the semiconductor chip 115 and semiconductor chip 116, compared to the case where leads are disposed between one semiconductor chip and the other semiconductor chip as in a prior art semiconductor device, of the floating capacitance (chip/lead capacitance) applied to the leads 103, floating capacitance produced by the semiconductor chip 116 is effectively eliminated, and, of the floating capacitance (chip/lead capacitance) applied to the leads 104, floating capacitance produced by the semiconductor chip 115 is effectively eliminated. Hence, the floating capacitance added to the leads which comprise the leads 103 bonded to the circuit-forming surface 115X of the semiconductor chip 115 via the insulating film 109, and the leads 104 bonded to the circuit-forming surface 116X of the semiconductor chip 116 via the insulating film 110, can be reduced.

In the semiconductor device 120 of this embodiment, the semiconductor chip 115 and semiconductor chip 116 are laminated with their lower surfaces facing each other. The leads 103 comprise the first part 103A which crosses one side of the semiconductor chip 115 and extends over the circuit-forming surface 115x, the second part 103B which bends from this first part 103A to the lower surface side of the semiconductor chip 115, and the third part 103C which extends from this second part 103B in the same direction as the first part 103A. The leads 104 comprise the first part 104A which crosses one side of the semiconductor chip 116 and extends over the circuit-forming surface 116X, the second part 104B which bends from this first part 104A to the lower surface side of the semiconductor chip 116, and the third part 104C which extends from this second part 104B in the same direction as the first part 104A. The third parts (103C, 104C) of the leads 103 and 104 extend inside and outside the resin body 119, and mutually overlap.

Due to this construction, the leads 103, 104 are branched inside the resin body 119, and adjacent surfaces of the leads 103 and leads 104 do not reach the semiconductor chip (115, 116), therefore moisture from outside is prevented from penetrating deeply inside the resin body 119 through the adjacent surfaces of the lead 103 and lead 104.

In the semiconductor device 120 of this embodiment, the semiconductor chip 115 and semiconductor chip 116 have plural electrodes (BP1, BP2) arranged in the direction of the long side in the center of the circuit-forming surface (115X, 116X).

Due to this construction, electrodes of the semiconductor chips 115, 116 having the same function are aligned opposite to each other even if the semiconductor chips 115, 116 are laminated with their lower surfaces facing each other. Hence, the lead 103 electrically connected to the electrode (for example, the electrode to which an address signal A0 is applied) BP1 of the semiconductor chip 115, and the lead 104 electrically connected to the electrode (for example, electrode to which an address signal A0 is applied) BP2 of the semiconductor chip 116, can easily be joined.

Thus, the semiconductor device 120 of this construction is produced by an assembly process using two lead frames.

Next, the structure of the two lead frames used for production of the semiconductor device 120 will be described referring to FIGS. 32 to 35.

Figure 32:
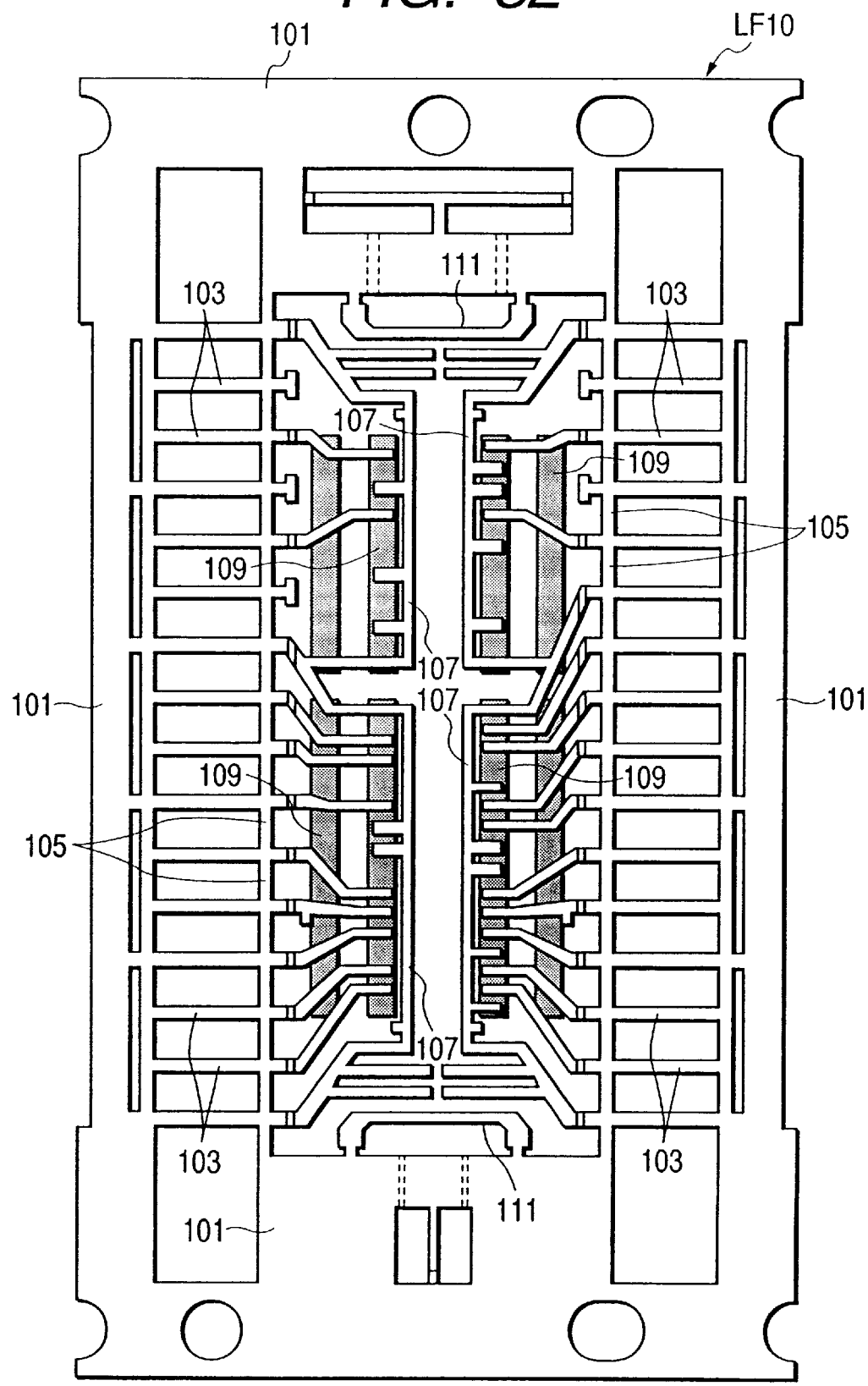
FIG. 32 is a plan view of a first lead frame used in production of the semiconductor device according to the fourth embodiment of this invention.
Figure 33:
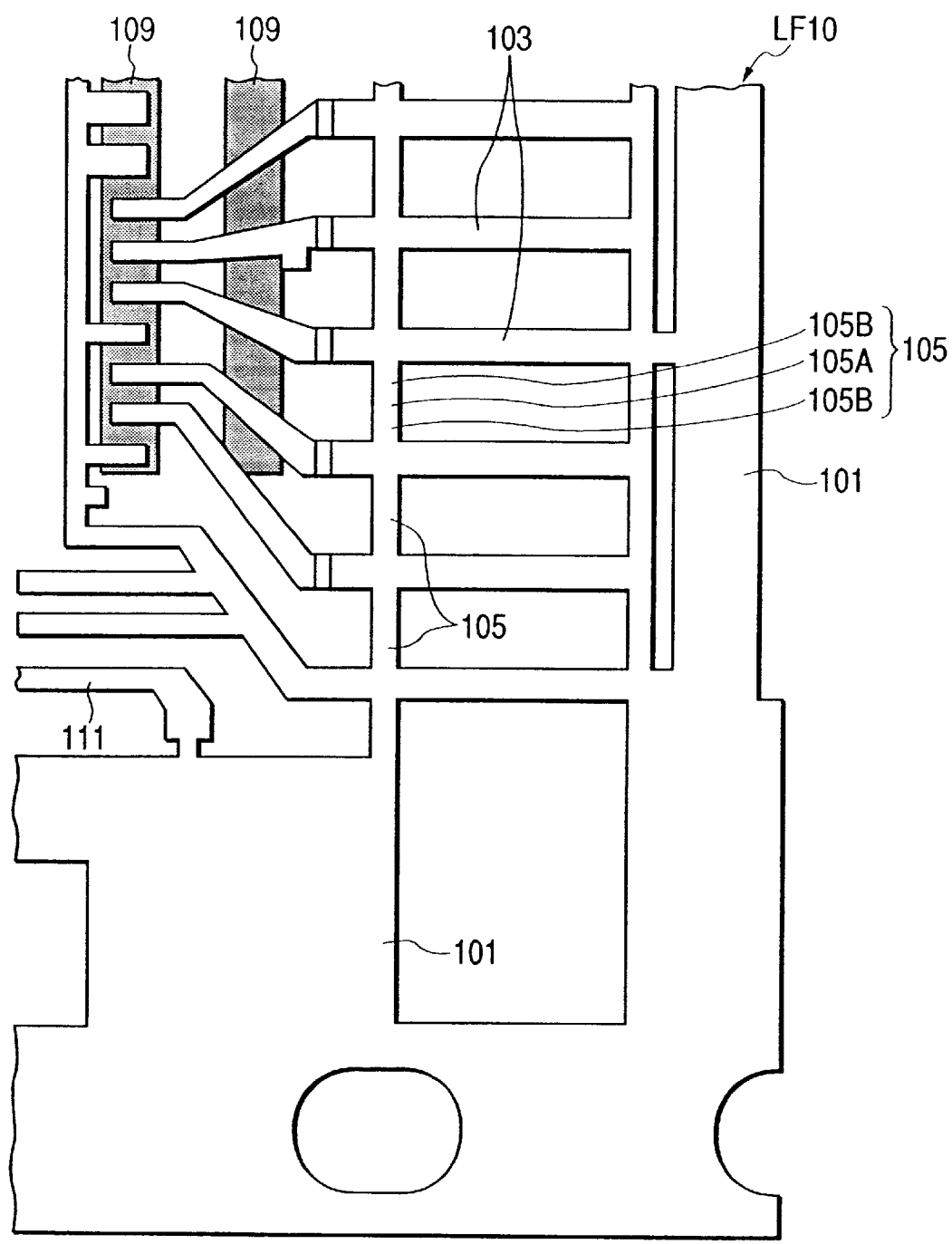
FIG. 33 is a schematic plan view of an enlargement of part of FIG. 32.
Figure 34:
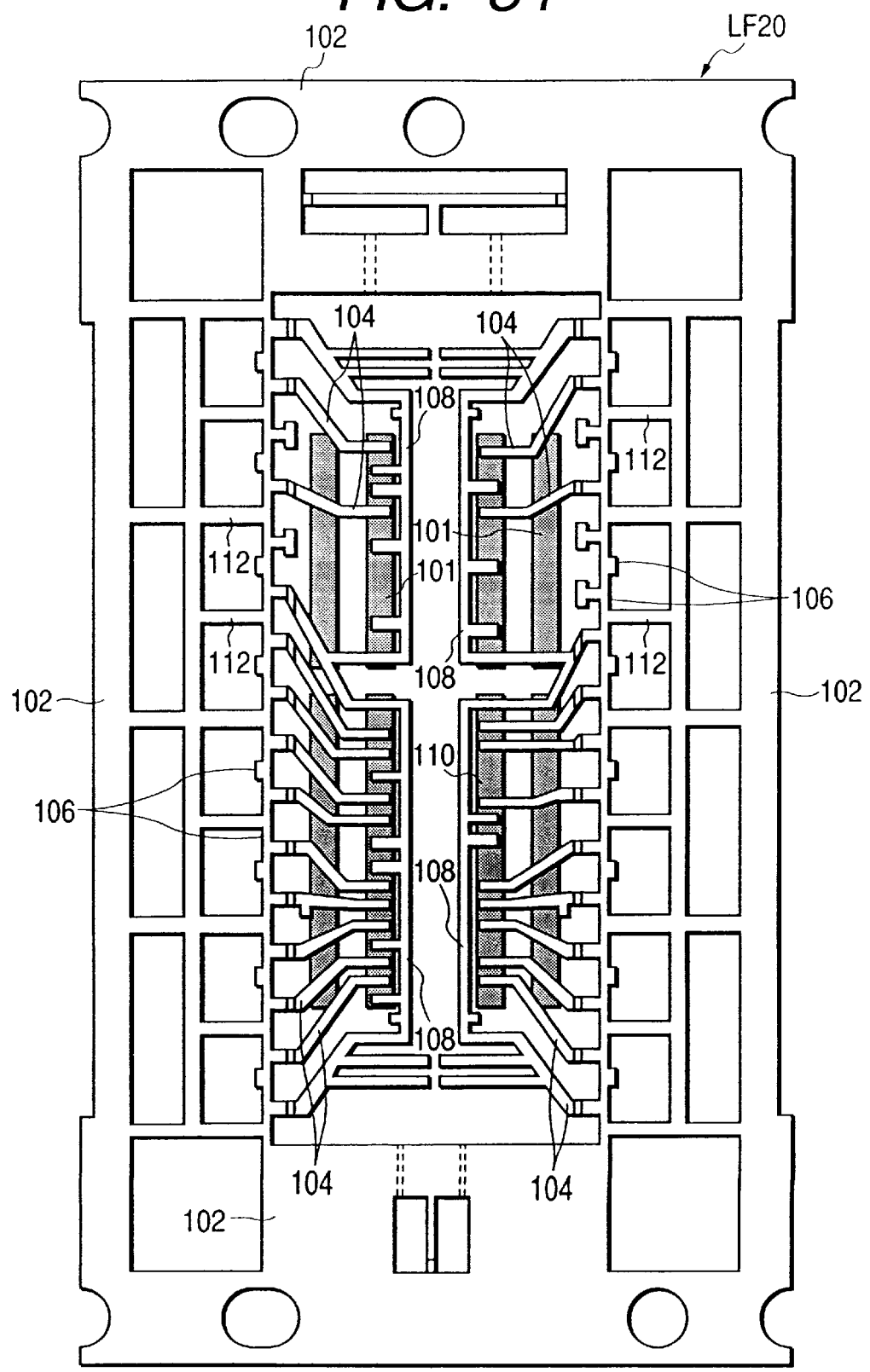
FIG. 34 is a plan view of a second lead frame used in the production of the semiconductor device according to the fourth embodiment of this invention.
Figure 35:
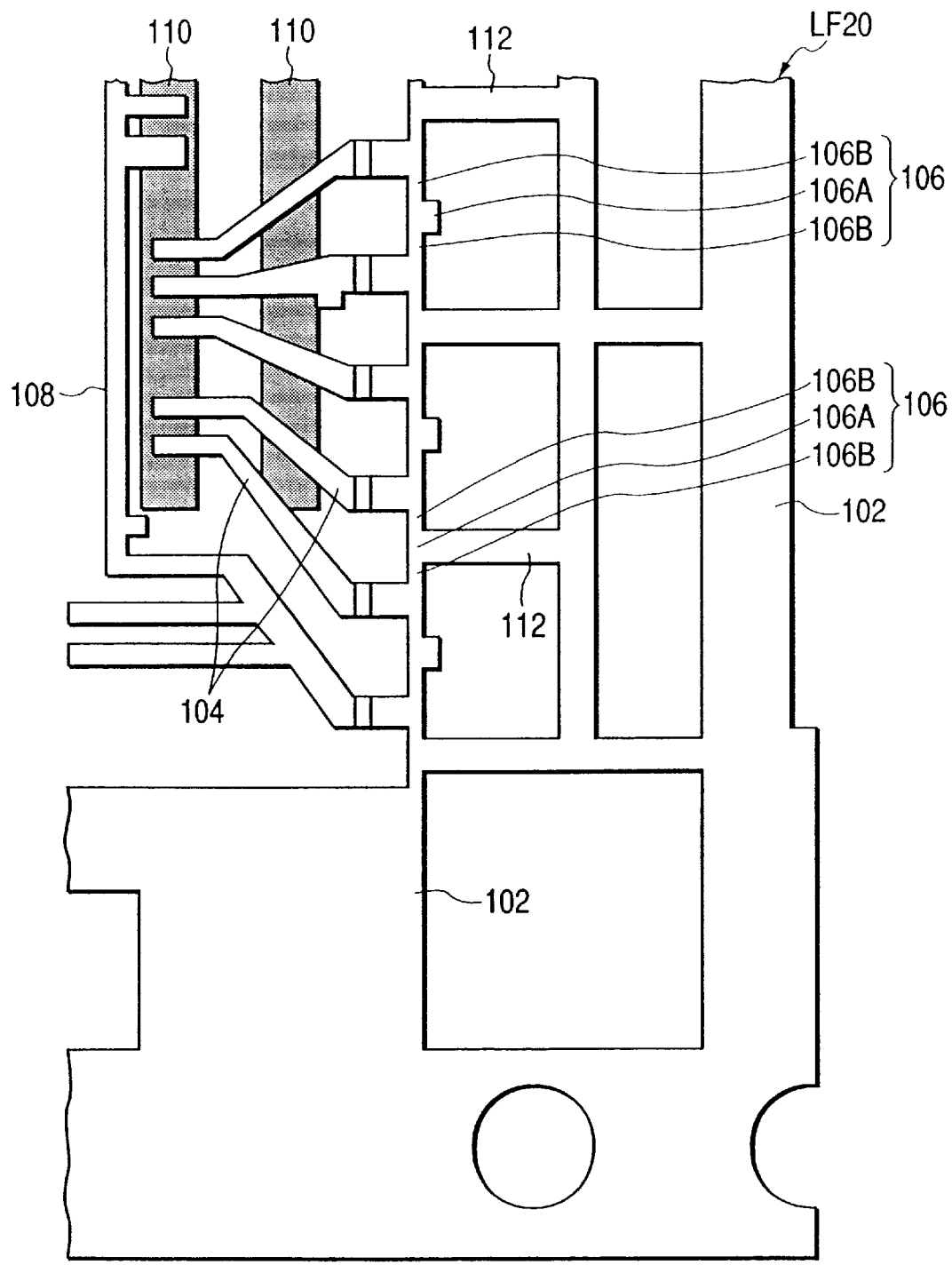
FIG. 35 is a schematic plan view of an enlargement of part of FIG. 34.

FIG. 32 is a plan view of the first lead frame, FIG. 33 is a plan view showing an enlargement of part of FIG. 32, FIG. 34 is a plan view of the second lead frame, and FIG. 35 is a plan view showing an enlargement of part of FIG. 34. It should be noted that although an actual lead frame has a multiple configuration so that plural semiconductor chips can be mounted, FIGS. 32 and 33 show an area for mounting one semiconductor chip to make the drawing clearer.

As shown in FIG. 32, plural (in this embodiment, thirty-two) leads 103, four bus bar leads 107, plural (in this embodiment, eight) insulating films 109 and two trailing leads 111 are disposed in an area enclosed by the frame body 101 which has a flat, rectangular shape.

The plural leads 103 comprise the inner lead parts which are sealed by the resin body, and the outer lead parts which led outside the resin body. The plural leads 103 are divided into two lead groups. The leads 103 of one of the lead groups are arranged in the extending direction of one of the two opposite long side frame parts of the frame body 101, the ends of the outer lead parts being formed in one piece with and supported by this long side frame part. The leads 103 of the other lead group are arranged in the extending direction of the other of the two opposite long side frame parts of the frame body 101, the ends of the outer lead parts being formed in one piece and supported by this other long side frame part. The middle parts of the leads 103 of both lead groups are interconnected by dam bars 105, and formed in one piece with and supported in the frame body 101 by the dam bars 105. That is, the lead frame LF10 has a bi-directional lead arrangement wherein the plural leads 103 are arranged in two rows in the vertical direction of FIG. 32.

Of the four bus bar leads 107, two are connected to the leads 103 in the first stage, middle stage and final stage of the plural leads 103 arranged along the extending direction of one long side framepart of the frame body 101, and are formed in one piece with the inner lead parts of these leads 103. The other two bar leads 107 are connected to the leads 103 in the first stage, middle stage and final stage of the plural leads 103 arranged along the extending direction of the other long side frame part of the frame body 101, and are formed in one piece with the inner lead parts of these leads 103.

The plural insulating films 109 extend across the plural leads 103, and are bonded to the lower surfaces opposite to the wire bonding surfaces of the inner lead parts of these leads 103. The two trailing leads 111 are formed in one piece and supported by the two opposite short sides of the frame body 101.

The inner lead parts of the leads 103, which are electrically connected to the electrodes of the semiconductor chip (115), comprise the first part 103A which crosses one side of the semiconductor chip 115 and extends over the circuit-forming surface 115X, second part 103B which is bent from this first part 103A towards the lower surface of the semiconductor chip 115, and third part 103C which extends from this second part 103B in the same direction as the first part 103A.

The dam bar 105, which is described in detail later, is provided for preventing leakage of molten resin outside the cavity when the resin body is formed according to the transfer molding method. The dam bar 105 of the lead frame LF10 comprises two cutting parts (connecting parts) 105B and a middle part 105A sandwiched between these two cutting parts 105B, and these two cutting parts 105B and middle part 105A are formed in the same width, as shown in FIG. 33.

The first lead frame LF10 is formed by etching or pressing a metal plate comprising, for example, an iron (Fe)-nickel (Ni) alloy (for example, containing 42 or 50 [%]) of Ni) to form a predetermined lead pattern, and then bending the inner lead parts of the leads 103.

The second lead frame LF20 has a structure comprising plural (in this embodiment, thirty-two) leads 104, four bus bars 108, plural (in this embodiment, eight) insulating films 110 and a reinforcing lead 112, disposed in an area enclosed by the flat, rectangular frame body 102, as shown in FIG. 34.

The plural leads 104 comprise the inner lead parts which are sealed by the resin body, and the outer lead parts which are led outside the resin body. The plural leads 104 are divided into two lead groups. The leads 104 of one of the lead groups are arranged in the extending direction of one of the two opposite long side frame parts of the frame body 102. The leads 104 of the other lead group are arranged in the extending direction of the other of the two opposite long side frame parts of the frame body 102. The end parts of the leads 104 of both lead groups are interconnected by dam bars 106, and formed in one piece with and supported in the frame body 102 by the dam bars 106. That is, the lead frame LF20 has a bi-directional lead arrangement wherein the plural leads 104 are arranged in two rows in the vertical direction of FIG. 34.

Of the four bus bar leads 108, two are connected to the leads 104 in the first stage, middle stage and final stage of the plural leads 104 arranged along the extending direction of one long side frame part of the frame body 102, and are formed in one piece with the inner lead parts of these leads 104. The other two bar leads 108 are connected to the leads 104 in the first stage, middle stage and final stage of the plural leads 104 arranged along the extending direction of the other long side frame part of the frame body 102, and are formed in one piece with the inner lead parts of these leads 104.

The plural insulating films 110 extend across the plural leads 104, and are bonded to the lower surfaces opposite to the wire bonding surfaces of the inner lead parts of these leads 104.

The inner lead parts of the leads 104, which are electrically connected to the electrodes of the semiconductor chip (116), comprise the first part 104A which crosses one side of the semiconductor chip 116 and extends over the circuit-forming surface 116X, second part 104B which is bent from this first part 104A towards the lower surface of the semiconductor chip 116, and third part 104C which extends from this second part 104B in the same direction as the first part 104A.

The dam bar 106, which is described in detail later, is provided for preventing leakage of molten resin outside the cavity when the resin body is formed according to the transfer molding method. The dam bar 106 of the lead frame LF20 comprises two cutting parts (connecting parts) 106B and a middle part 106A sandwiched between these two cutting parts 106B. The middle part 106A is formed wider than the width of the dam bar 105 of the lead frame LF10, and the cutting parts 106B are formed narrower than the width of the dam bar 105 of the lead frame LF10.

Of the two reinforcing leads 112, one is disposed in an area specified by the dam bars 6 and one long side frame part of the frame body 102, as shown in FIG. 34. This reinforcing lead 112 is connected to and supported at plural positions on some dam bars 106 of the plural dam bars 106, and the long side frame part of the frame body 102. The other of the two reinforcing leads 112 is disposed in an area specified by the dam bars 106 and the other long side frame part of the frame body 102, as shown in FIG. 34. This other reinforcing lead 112 is connected to and supported at plural positions on some dam bars 106 of the plural dam bars 106, and on the other long side frame part of the frame body 102. Specifically, the rigidity of the second lead frame LF20 is improved by the reinforcing lead 112, and is more difficult to bend compared with a lead frame in which there is no supporting structure in the areas specified by the dam bars and the long side frame parts.

The reinforcing lead 112 is connected with the middle part 106A of the dam bar 106, as shown in FIG. 35. Therefore, the width of a middle part 106A of the dam bar 106 with which the reinforcing lead 112 is connected is larger than the width of the dam bar 105 of the first lead frame LF10.

The second lead frame LF20 is formed by etching or pressing a metal plate comprising, for example, an iron (Fe)-nickel (Ni) alloy (for example, containing 42 or 50 [%]) of Ni) to form a predetermined lead pattern, and then bending the inner lead parts of the leads 104.

The first lead frame LF10 and second lead frame LF20 are described in detail later. They are used in the state where the electrodes of the semiconductor chip and the inner lead parts of the leads are connected by an electrically conducting wire, and the lower surfaces of the chips are superimposed. Therefore, the lead group on the left-hand side of FIG. 32 overlaps with the lead group on the right-hand side of FIG. 34, and the lead group on the right-hand side of FIG. 32 overlaps with the lead group on the left-hand side of FIG. 34. Also, the dam bar 105 on the left-hand side of FIG. 32 overlaps with the dam bar 106 on the right-hand side of FIG. 34, and the dam bar 105 on the right-hand side of FIG. 32 overlaps with the dam bar 106 on the left-hand side of FIG. 34.

The dimensions of the essential parts of the first lead frame LF10 and second lead frame LF20 are as follows, although they are not limited to this.

The thickness of the lead frames LF10 and LF20 is of the order of 0.1 [mm]. The pitch of the leads (103, 104) near the dam bars is of the order of 1.27 [mm]. The width of the leads (103, 104) near the dam bars is of the order of 0.3–0.4 [mm]. The width of the dam bar 105 is of the order of 0.15 [mm]. The width of the cutting part 106B of the a dam bar 106 is of the order of 0.13 [mm]. The width of the middle part 106A of the dam bar 106 with which the reinforcing lead 112 is not connected is of the order of 0.55 [mm].

As described in detail later, the resin body 119 of the semiconductor device 120 is formed such that the lead frames LF10 and LF20 are superimposed. Therefore, as the two overlapping dam bars (105, 106) must be cut simultaneously in the dam bar cutting step which is difficult, simultaneous cutting of the two overlapping dam bars can easily be performed by making the width of the cutting part 106B of the dam bar 106 of the lead frame LF20 narrower than the width of the cutting part 105B of the dam bar 105 of the lead frame LF10, as in this embodiment.

Next, the method of producing the semiconductor device 120 will be described referring to FIGS. 36 to 49.

Figure 37:
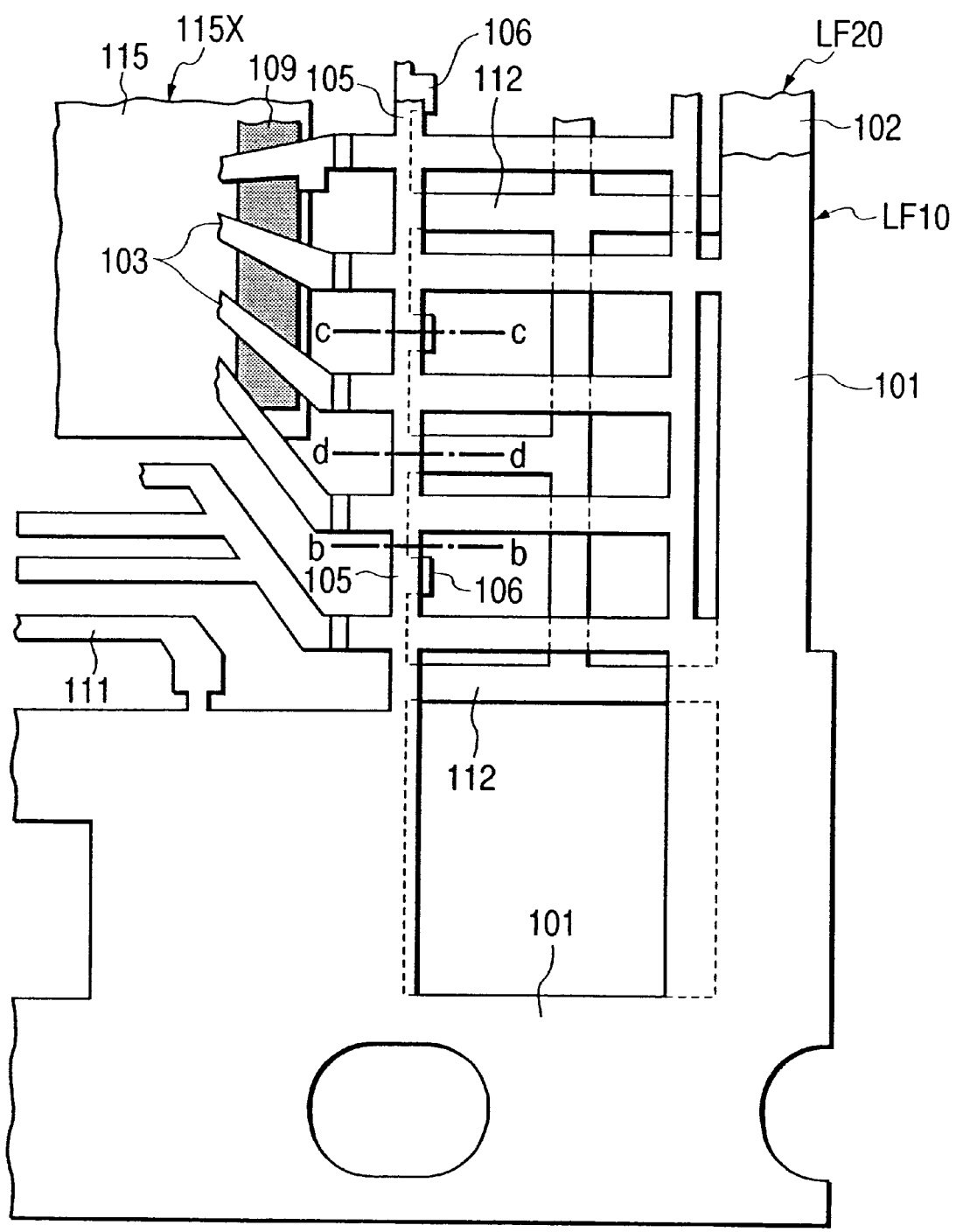
FIG. 37 is a sectional view of essential parts showing the first and second lead frames superimposed in the production of the semiconductor device according to the fourth embodiment of this invention.
Figure 40:
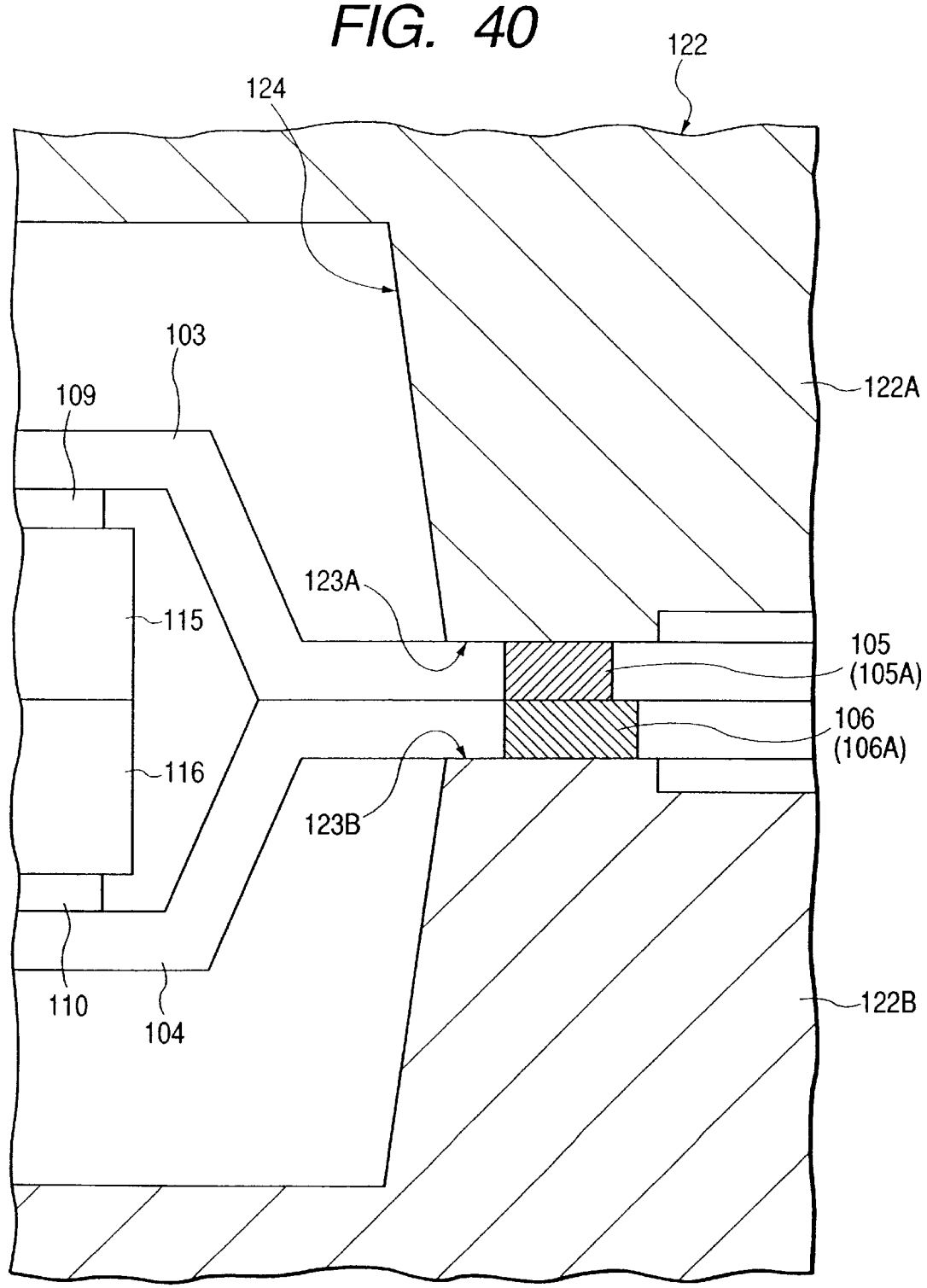
FIG. 40 is a sectional view of essential parts for the purpose of describing the sealing step in the production of the semiconductor device according to the fourth embodiment of this invention.
Figure 41:
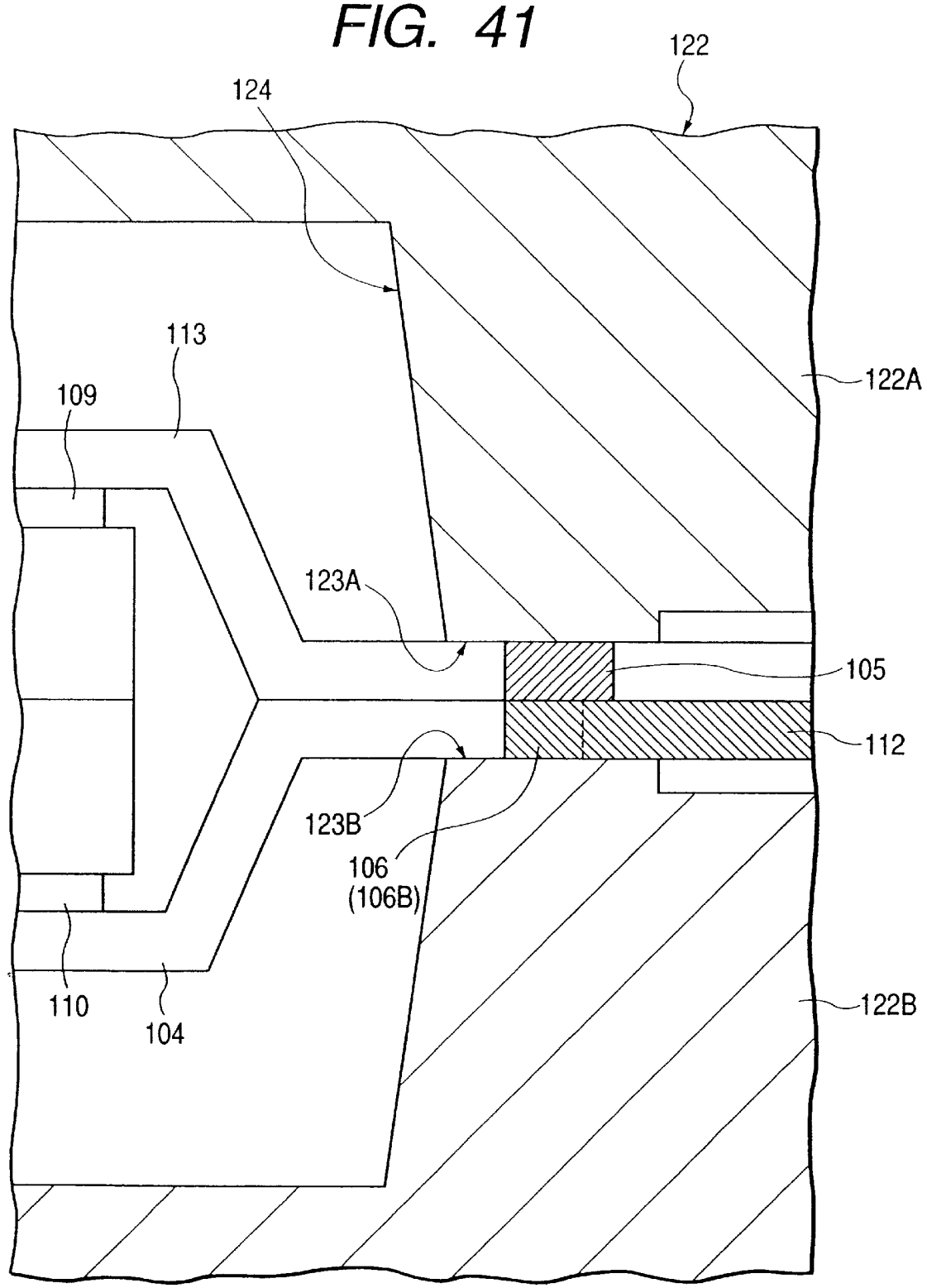
FIG. 41 is a sectional view of essential parts for the purpose of describing the sealing step in the production of the semiconductor device according to the fourth embodiment of this invention.
Figure 42:
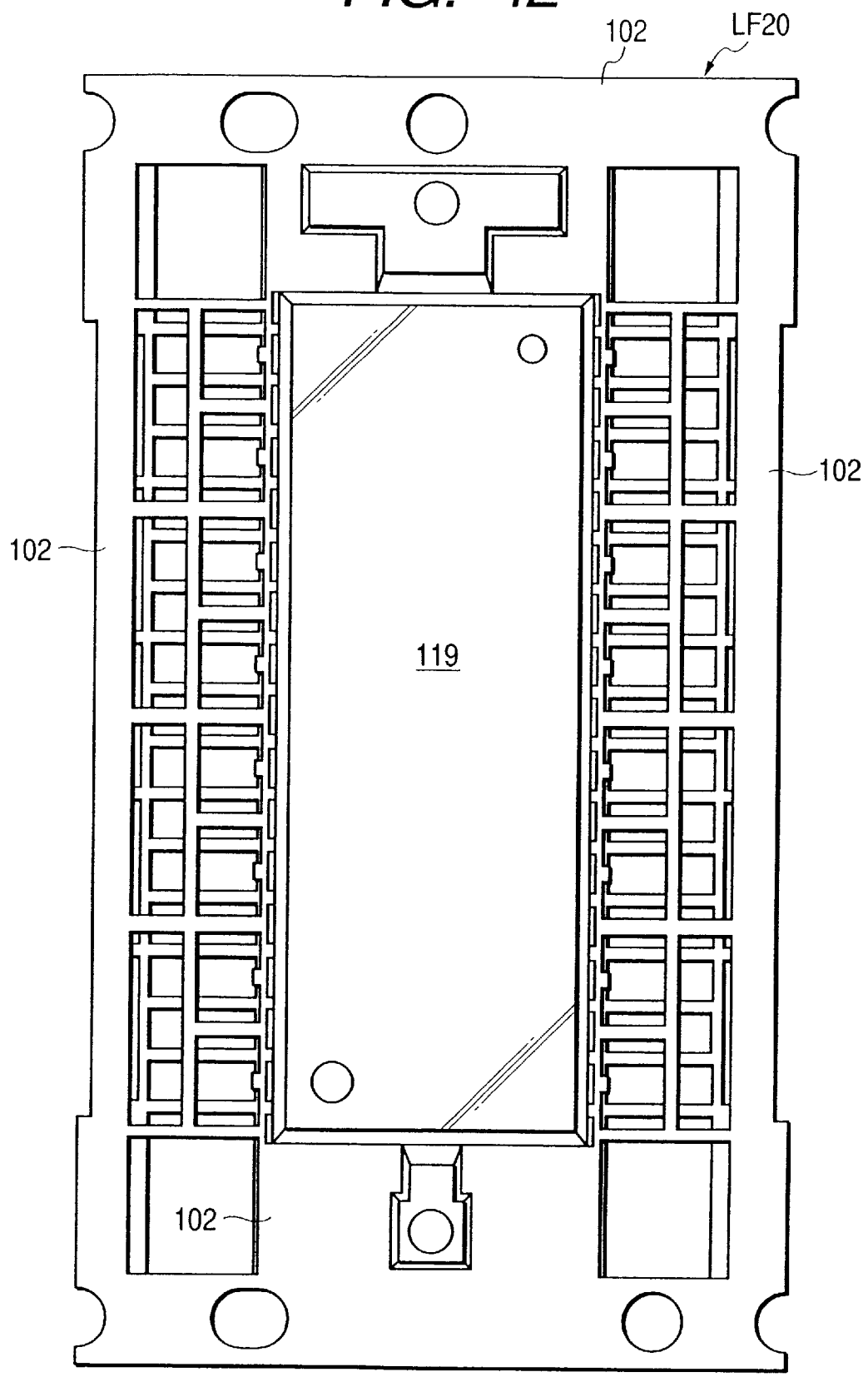
FIG. 42 is a bottom plan view in a state after the sealing step has performed in the production of the semiconductor device according to the fourth embodiment of this invention.
Figure 43:
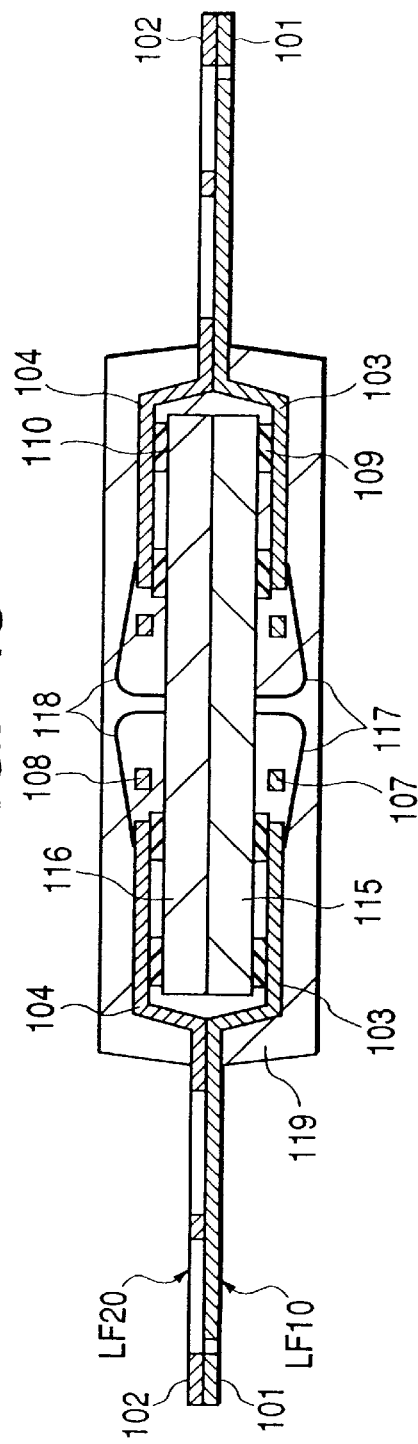
FIG. 43 is a sectional view in a state after the sealing step has performed in the production of the semiconductor device according to the fourth embodiment of this invention.
Figure 44:
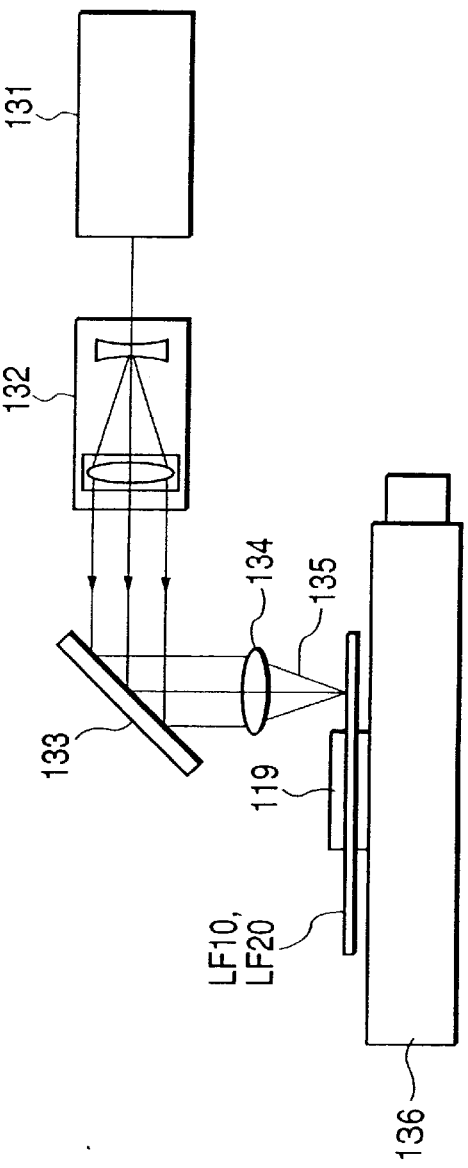
FIG. 44 is a block diagram for the purpose of describing the schematic construction of a laser device laser device used in the production of the semiconductor device according to the fourth embodiment of this invention.
Figure 45:
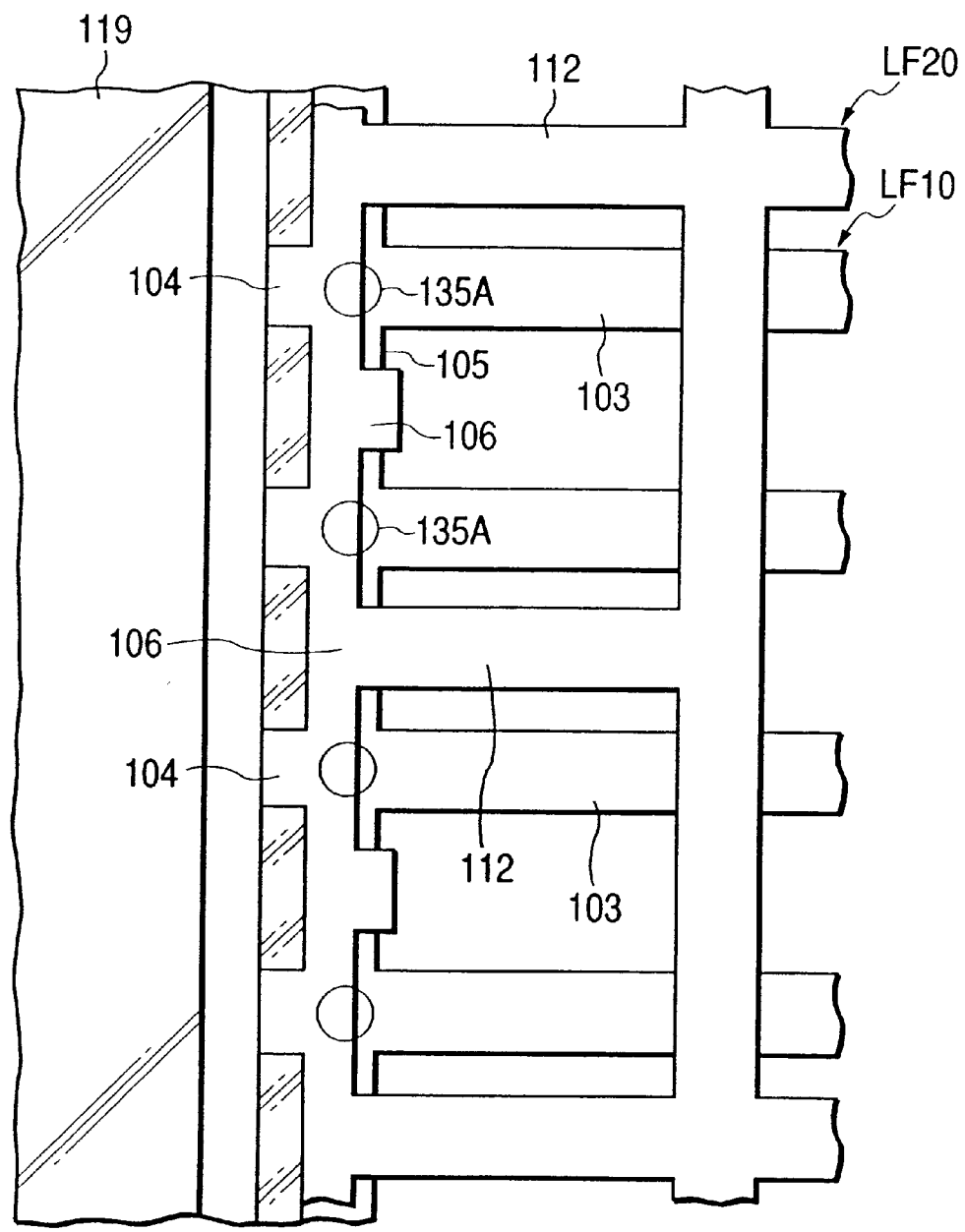
FIG. 45 is an underneath view of essential parts for the purpose of describing a joining step in the production of the semiconductor device according to the fourth embodiment of this invention.
Figure 46:
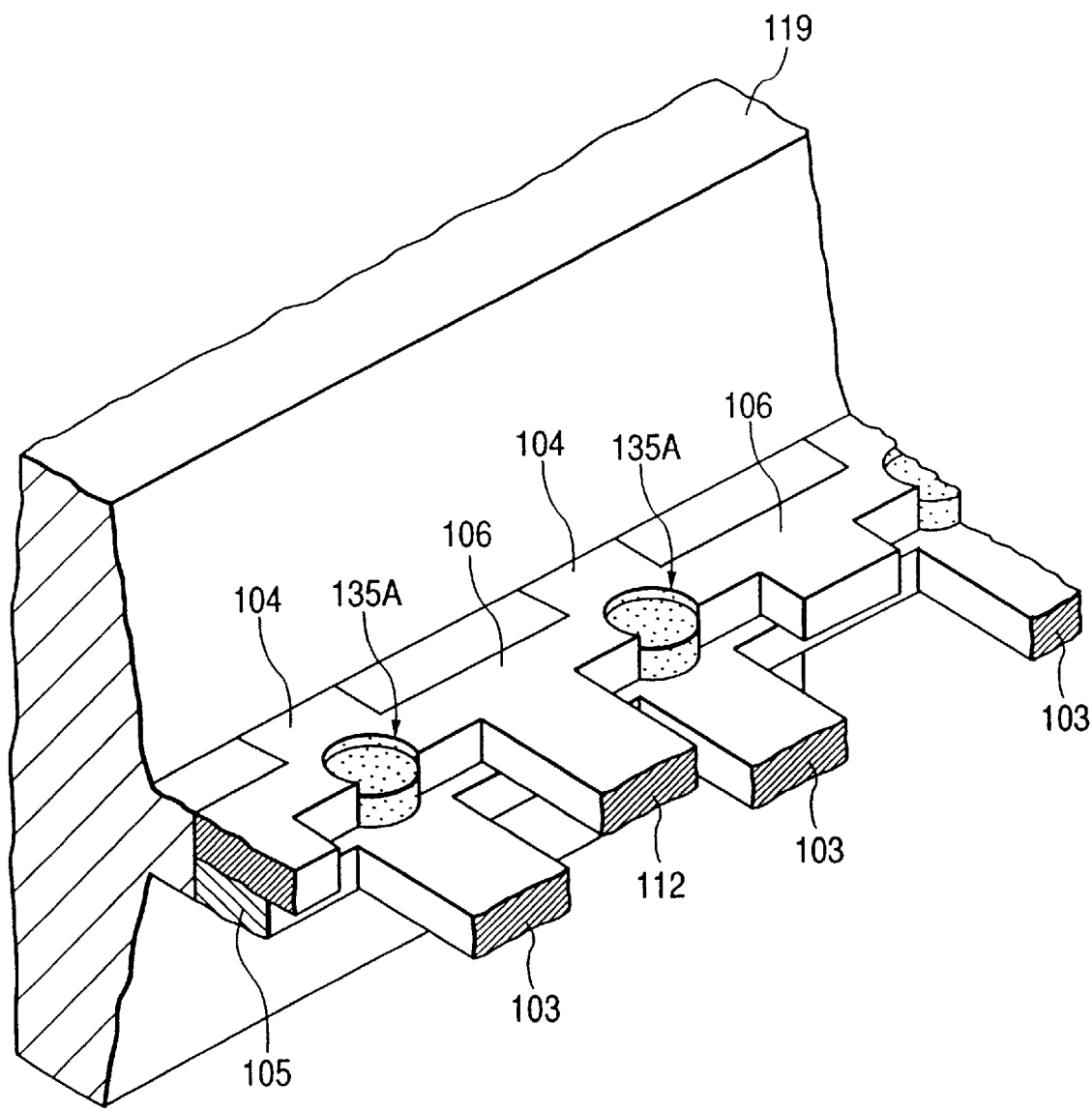
FIG. 46 is a perspective view of essential parts for the purpose of describing a joining step in the production of the semiconductor device according to the fourth embodiment of this invention.
Figure 47:
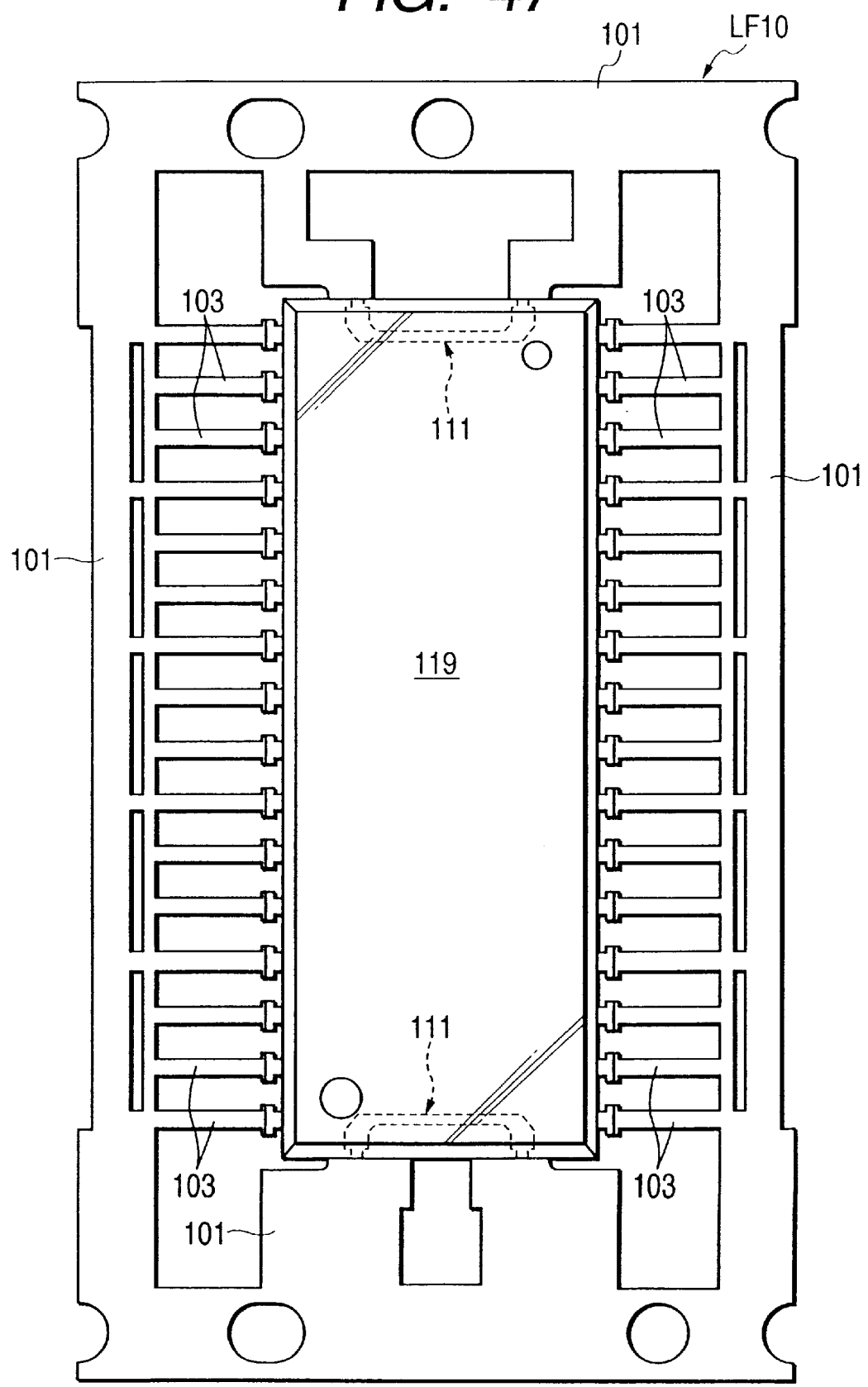
FIG. 47 is an underneath view showing the state where a frame body of the second lead frame has been removed in the production of the semiconductor device according to the fourth embodiment of this invention.
Figure 48:
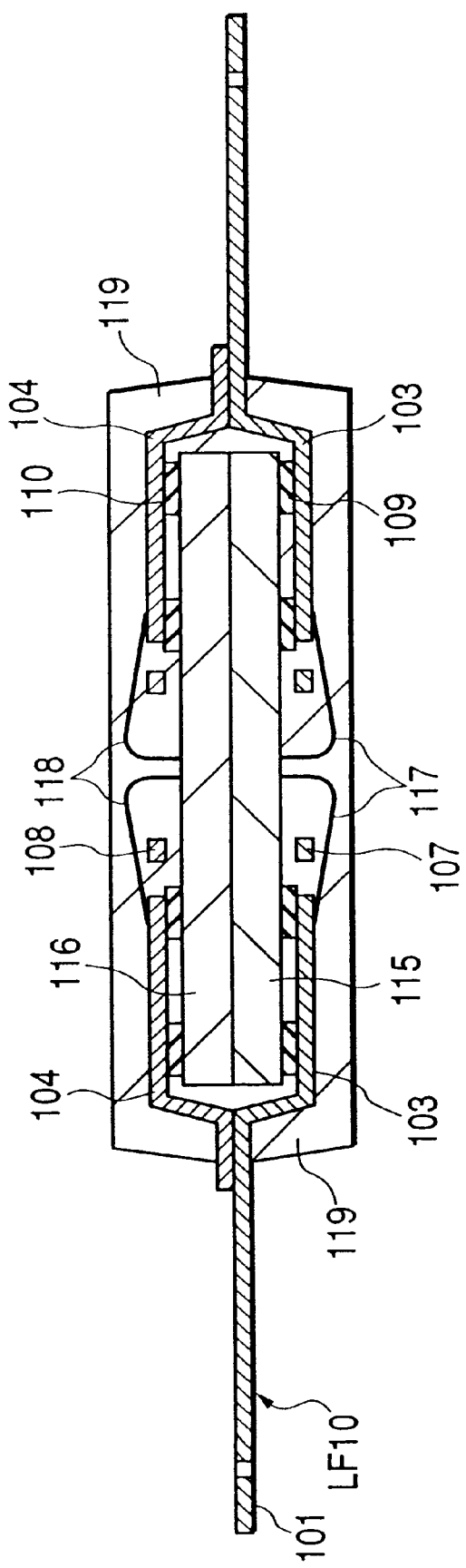
FIG. 48 is a sectional view showing the state where the frame body of the second lead frame has been removed in the production of the semiconductor device according to the fourth embodiment of this invention.
Figure 49:
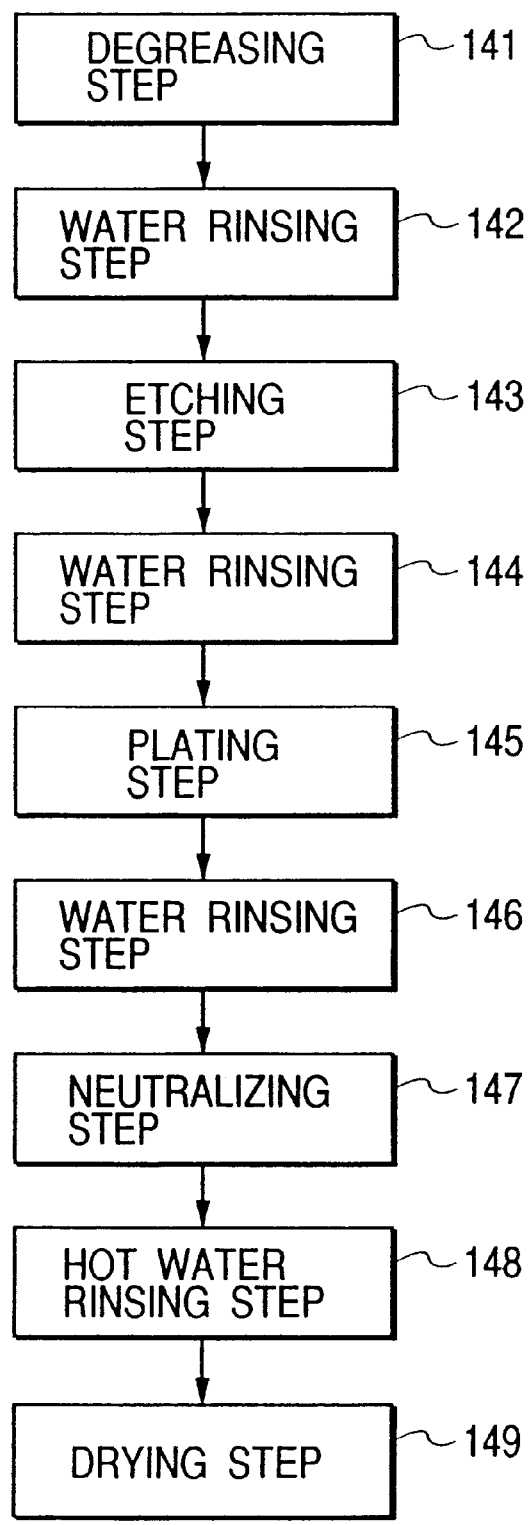
FIG. 49 is a flowchart for the purpose of describing a plating step in the production of the semiconductor device according to the fourth embodiment of this invention.

FIG. 36 is a sectional view of essential parts for describing a wire bonding process, FIG. 37 is a plan view of essential parts showing a state where the first and the second lead frame are superimposed, FIG. 38–FIG. 41 are sectional views of essential parts for describing a sealing step, FIG. 42 is a base plan view showing a state after performing a sealing step, FIG. 43 is a sectional view showing a state after performing the sealing step, FIG. 44 is a block diagram for describing the outline structure of a laser device used in production of a semiconductor device, FIG. 45 is a base plan view of essential parts for describing a joining process, FIG. 46 is a perspective view of essential parts showing a state after performing the joining process, FIG. 47 is a base plan view showing a state after removing the frame body of the second lead frame, FIG. 48 is a sectional view showing a state after removing the frame body of the second lead frame, and FIG. 49 is a flowchart for describing a plating process.

Figure 39:
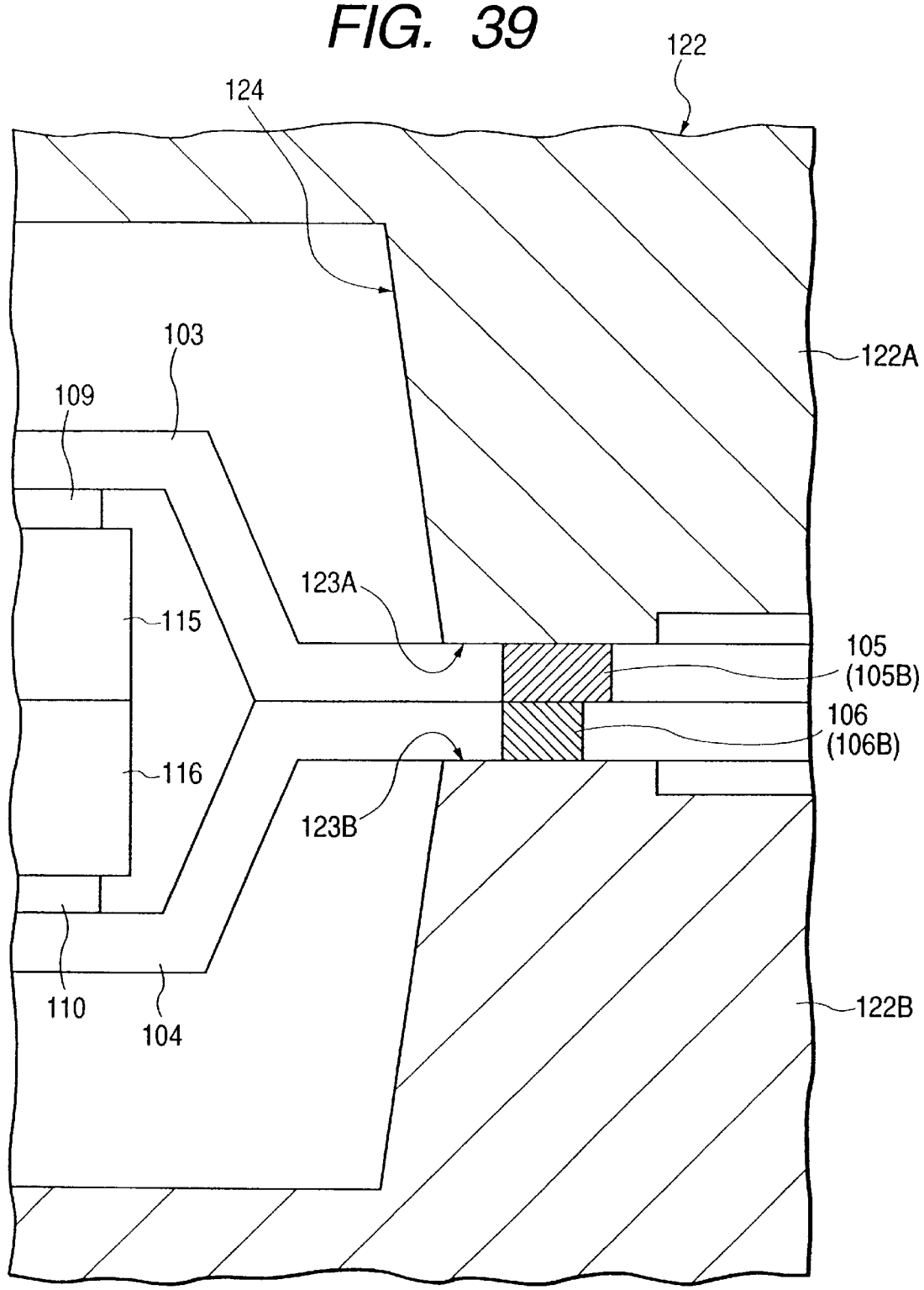
FIG. 39 is a sectional view of essential parts for the purpose of describing the sealing step in the production of the semiconductor device according to the fourth embodiment of this invention.

FIG. 39 is a sectional view of essential parts along a line b—b of FIG. 37, FIG. 40 is a sectional view of essential parts along a line c—c of FIG. 37, and FIG. 41 is a sectional view along a line d—d of FIG. 37.

First, the semiconductor chip 115 and the semiconductor chip 116 which have an identical structure are provided, the lead frame LF10 shown in FIG. 32 is provided, and the lead frame LF20 shown in FIG. 34 is provided.

Next, the semiconductor chip 115 is bonded to the lead frame LF10, and the semiconductor chip 116 is bonded to the lead frame LF20. The lead frame LF10 and these miconductor chip 115 are bonded by thermocompression bonding of the first parts 103A of the leads 103 and the branch leads connected to the bus bar lead 107 to the circuit-forming surface 115X of the semiconductor chip 115 via the insulating film 109. The lead frame LF20 and the semiconductor chip 116 are bonded by thermocompression bonding of the first parts 104A of the leads 104 and the branch leads connected to the bus bar lead 108 to the circuit-forming surface 116X of the semiconductor chip 116 via the insulating film 110.

In this step, as the semiconductor chip 115 is bonded to the leads 103 and the branch leads of the bus bar lead 107, the semiconductor chip 115 is maintained in a stable state in the lead frame LF10. Also, as the semiconductor chip 116 is bonded to the leads 104 and the branch leads of the bus bar lead 108, the semiconductor chip 116 is maintained in a stable state in the lead frame LF20.

Next, the lead frames LF10 and LF20 are transported to a bonding device, the electrodes BP1 of the semiconductor chip 115 are electrically connected to the wire connecting parts (ends) of the inner lead parts of the leads 103 by the electrically conducting wires 117, and the electrodes BP1 of the semiconductor chip 115 are electrically connected to the branch leads of the bus bar lead 107 by the electrically conducting wires 117. Also, the electrodes BP2 of the semiconductor chip 116 are electrically connected to the wire connecting parts (ends) of the inner lead parts of the leads 104 by the electrically conducting wires 118, and the electrodes BP2 of the semiconductor chip 116 are electrically connected to the branch leads of the bus bar lead 108 by the electrically conducting wires 118. The wires (117, 118) are, for example, (Au) wires, and the wires (117, 118) maybe bonded by, for example, ultrasonic vibration in conjunction with thermocompression bonding.

In this step, the leads 103 are bent so that the first parts 103A which are inner lead parts are situated on the circuit-forming surface 115X of the semiconductor chip 115 and the lower surfaces of the third parts 103C which are inner lead parts are situated in the same plane as the lower surface of the semiconductor chip 115, therefore, the lower surface of the semiconductor chip 115 and the lower surface of the third parts 103C of the leads 103 can be brought into contact on a heat stage 121, as shown in FIG. 36(A). As a result, the heat of the heat stage 121 is effectively transferred to the semiconductor chip 115, thereby ensuring the integrity of the connections of the electrodes BP1 of the semiconductor chip 115 to the leads 103 by the wires 117, and the connections of the electrodes BP1 of the semiconductor chip 115 to the branch leads of the bus bar lead 107.

Further, in this step, the leads 104 are bent so that the first parts 104A which are inner lead parts are situated on the circuit-forming surface 116X of the semiconductor chip 116 and the lower surfaces of the third parts 104C which are inner lead parts are situated in the same plane as the lower surface of the semiconductor chip 116, therefore, the lower surface of the semiconductor chip 116 and the lower surface of the third parts 104C of the leads 104 can be brought into contact on the heat stage 121, as shown in FIG. 36(B). As a result, the heat of the heat stage 121 is effectively transferred to the semiconductor chip 116, thereby ensuring the integrity of the connections of the electrodes BP2 of the semiconductor chip 116 to the leads 104 by the wires 118, and the connections of the electrodes BP2 of the semiconductor chip 116 to the branch leads of the bus bar lead 108.

In this step, the ends of the inner lead parts of the leads 103 are disposed near the electrodes BP1 formed in the center of the circuit-forming surface 115X of the semiconductor chip 115, so the length of the wires 117 can be made shorter compared to the case where the ends of the inner lead parts of the leads are disposed outside the semiconductor chip.

Similarly, in this step, the ends of the inner lead parts of the leads 104 are disposed near the electrodes BP2 formed in the center of the circuit-forming surface 116X of the semiconductor chip 116, so the length of the wires 118 can be made shorter compared to the case where the ends of the inner lead parts of the leads are disposed outside the semiconductor chip.

The rigidity of the lead frame LF20 is improved by the reinforcing leads 112, so wobbling of the semiconductor chip 116 causing it to fall out of the lead frame LF20, is suppressed when transporting the lead frame LF20 in the wire bonding step which is a subsequent step after bonding the inner lead parts of the leads 104 to the circuit-forming surface 116X of the semiconductor chip 116.

After this step, the lead frames LF10 and LF20 are laminated with their lower surfaces facing each other, so the left-right orientations of the connections between the electrodes BP2 of the semiconductor chip 116 and the leads 104 are the reverse of those of the connections between the electrodes BP1 and the leads 103 of the semiconductor chip 115.

Further, the connections of the electrodes BP1 of the semiconductor chip 115 to the leads 103 and the connections of the electrodes BP1 of the semiconductor chip 115 to the branch leads of the bus bar lead 107 by the wires 117 are made by jumping over the bus bar lead 107. Similarly, the connections of the electrodes BP2 of the semiconductor chip 116 to the leads 104 and the connections of the electrodes BP2 of the semiconductor chip 116 to the branch leads of the bus bar lead 108 by the wires 118, are made by jumping over the bus bar lead 108.

Next, the lead frames LF10 and LF20 are superimposed so that the respective lower surfaces of the semiconductor chip 115 and the semiconductor chip 116 are facing each other. The state where the lead frames LF10 and LF20 are superimposed is shown in FIG. 37. In this embodiment, the lower surfaces of the semiconductor chips 115 and 116 are brought into mutual contact. Contact of the lower surfaces of the semiconductor chips 115 and 116 is maintained by the elasticity of the leads 103 and 104.

In this step, as the outer lead parts of the leads 104 are formed shorter than the outer lead parts of the leads 103, the lower surfaces of the outer lead parts of the leads 103 are exposed beyond the ends of the outer lead parts of the leads 104.

The rigidity of the lead frame LF20 is improved by the reinforcing leads 112, so wobbling of the semiconductor chip 116 causing it to fall out of the lead frame LF20, is suppressed when transporting the lead frame LF20 in the wire bonding step which is a subsequent step.

Figure 38:
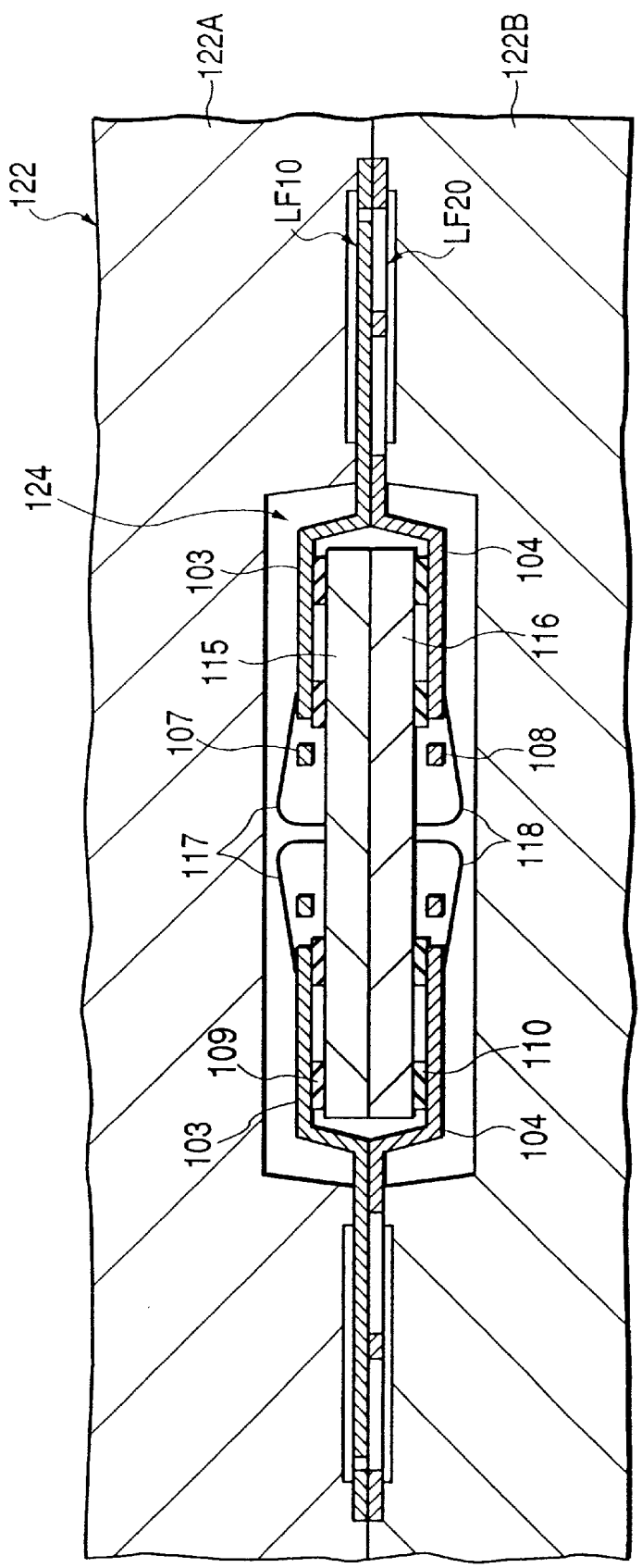
FIG. 38 is a sectional view of essential parts for the purpose of describing a sealing step in the production of the semiconductor device according to the fourth embodiment of this invention.

Next, as shown in FIG. 38, the lead frames LF10 and LF20 are positioned between an upper die 122A and lower die 122B of a mold (transfer mold) 122 in the state where the lead frames LF10, LF20 are superimposed. The semiconductor chips (115, 116), the inner lead parts of the leads 103, the inner lead parts of the leads 104, the films (109, 110), the wires (117, 118) and the trailing leads 111 are disposed inside a cavity 124 formed by the upper die 122A and lower die 122B.

The lead frames LF10, LF20 are fixed to the mold 122 by restraining the dam bar (105, 106) and the connection parts of the leads (103, 104) connected to these dam bars (105, 106) from both the upward and downward directions by a clamp surface 123A of the upper die 122A, and a clamp surface 123B of the lower die 122B, as shown in FIG. 39. Also as shown in FIG. 39, as the width of the cutting part 106B of the a dam bar 106 is narrower than the width of the cutting part 105B of the dam bar 105, the contact area between the cutting part 106B of the dam bar 106 and the clamp surface 123B of the lower die 122B is smaller than the contact area between the cutting part 105B of the dam bar 105 and the clamp surface 123A of the upper die 122A. On the other hand, as the width of the middle part 106A of the dam bar 106 is larger than the width of the middle part 105A of the dam bar 105, the contact area between the middle part 106A of the dam bar 106 and the clamp surface 123B of the lower die 122B is larger than the contact area between the middle part 105A of the dam bar 105, and the clamp surface 123B of the upper die 122A, as shown in FIG. 40. That is, by making the width of the middle part 106A of the dam bar 106 larger than the width of the middle part 105A of the dam bar 105, the contact area between the dam bar 106 and the clamp surface 123B of the lower die 122B can be maintained even if the width of the cutting part 106B of the dam bar 106 is made narrower than the width of the cutting part 105B of the dam bar 105 to facilitate simultaneous cutting of the dam bars, and the dam bar 105 of the lead frame LF10 and the dam bar 106 of the lead frame LF20 can be firmly fixed between the clamp surface 123A of the upper die 122A and the clamp surface 123B of the lower die 122B.

Also in the dam bar 106 wherein the reinforcing lead 112 is connected to the middle part 106B, the contact area of the middle part 106A of the dam bar 106 and clamp surface 123B of the lower die 122B is larger than the contact area between the middle part 105A of the dam bar 105 and the clamp surface 123B of the upper die 122A, so the contact area between the dam bar 106 and the clamp surface 123B of the lower die 122B can be maintained even if the width of the cutting part 106B of the dam bar 106 is made narrower than the width of the cutting part 105B of the dam bar 105 to facilitate simultaneous cutting of the dam bars, and the dam bar 105 of the lead frame LF10 and the dam bar 106 of the lead frame LF20 can be firmly fixed between the clamp surface 123A of the upper die 122A and the clamp surface 123B of the lower die 122B, as shown in FIG. 41.

Next, a fluid resin is pressure injected into the cavity 124 via a runner and inflow gate from the pot of the mold 122 so as to form the resin body 119. The semiconductor chips (115, 116), inner lead parts of the leads 103, the inner lead parts of the leads 104, films (109, 110), wires (117, 118), and the trailing leads 111 are sealed by the resin body 119. The resin is a heat curing epoxy resin to which, for example, a phenolic curing agent, silicone rubber and a filler are added.

In this step, to remove the air bubbles in the resin, a pressure (for example, about 60 kg/cm$^2$) higher than the injection pressure is applied after completing injection of the resin into the cavity 124. At that time, the same high pressure acts on the dam bars 105 and 106 from the cavity toward the outside, but as the dam bars 105 and 106 are firmly fixed between the clamp surface 123A of the upper die 122A and the clamp surface 123B of the lower die 122B, deformation of the dam bar 106 which has a narrow width in the cutting part 106B towards the outside of the cavity 124 is prevented, and a defective resin body 119 due to leakage of resin to the outside of the cavity 124 through the gap between the dam bar 105 and dam bar 106 is definitively prevented.

Further, the dam bar 106 to which the reinforcing lead 112 is connected is supported in the frame body 102 by the reinforcing lead 112, so even if a pressure higher than the injection pressure is applied, it does not deform toward the outside of the cavity 124.

In this step, as the length of the wires (117, 118) is short compared to the case where the wire connections of the leads are connected to the electrodes formed in the centers of the circuit-forming surfaces of the semiconductor chips, wire flow due to by pressure injection of the resin can be suppressed. Also, as the semiconductor chip 115 is maintained in a stable state in the lead frame LF10 and the semiconductor chip 116 is maintained in a stable state in the lead frame LF20, positional displacement of the two semiconductor chips (115, 116) due to the resin which was pressure injected into the cavity 124, is prevented.

Moreover, in this step, the lead frames LF10 and LF20 are maintained by the resin body 119 in a state wherein the lower surfaces are superimposed.

Next, the lead frames LF10, LF20 are removed from the mold 122, and the lead frames LF10, LF20 are reversed so that the lead frame LF20 is facing upwards, as shown in FIG. 42 and FIG. 43.

Next, the lead frames LF10, LF20 are positioned on an XY table 136 with the lead frame body 102 facing upwards, as shown in FIG. 44, and the outer lead parts of the leads 104 of the lead frame LF20 and outer lead parts of the leads 103 of the lead frame LF10 are joined by laser welding. Laser welding is performed using, for example, a YAG laser device equipped with a laser oscillator 131, beam former 132, bending mirror 133 and condenser lens 134. In this embodiment, laser welding is performed by irradiating the upper parts of the leads 104 with laser light 135.

In this step, as the circuit-forming surfaces (115X, 116X) of the semiconductor chip 115 and semiconductor chip 116 are covered by the resin of the resin body 119, defects of the semiconductor chips 115 and 116 which occur due to scattering of material (hot molten material) produced during welding, can be prevented.

Moreover, as the circuit-forming surfaces (115x, 116X) of the semiconductor chip 115 and semiconductor chip 116 are covered by the resin of the resin body 119, surface deterioration of the semiconductor chip 115 and semiconductor chip 116 due to adhesion of out gas (impurities contained in the leads (e.g., sulfur)), which is generated during welding, can be prevented, and reduction of the adhesive force between the semiconductor chip (115, 116) and resin body 119 is suppressed.

In this step, as the junctions of the leads 104 and leads 103 are maintained in close contact by the resin body 119, it is unnecessary to restrain the leads 104 and leads 103 by a fixed jig.

It is desirable that laser welding is performed at a position distant from the resin body 119. This is because, if laser light were to irradiate the resin body 119 due to scatter in positioning accuracy, the resin body 119 would be discolored and its external appearance would be impaired.

It is also desirable that laser welding is performed at the ends (positions marked by the symbol 135A in FIG. 45) of the outer lead parts of the leads 104, specifically, the steps between the leads 104 and leads 103, as shown in FIG. 45. This is because the join state of the leads 104 and leads 103 can be verified, as shown in FIG. 46. Also, if laser welding is performed at the steps, it is desirable that the center of the laser light 135 coincides with the leads 104 and that approximately ⅓ of the area irradiated by the laser light 135 coincides with the leads 103. This is because the center of the laser light 135 has the highest energy, and if the center of the laser light 135 irradiates the leads 104, the join parts of the leads 103 which are lower down may melt and drop off before the join parts of the leads 104 which are further up, melt.

Moreover, it is desirable that the irradiation diameter (spot diameter) of the laser light 135 is smaller than the width in the joins of the leads 104 and leads 103, as shown in FIG. 45. This is to prevent melting of the leads 103 if an error is made in the output setting of the laser light 135. As the lead width of the leads (104, 103) near the dam bars is of the order of 0.3 [mm], laser welding was performed with a smaller irradiation diameter than this, which in this embodiment was of the order of 0.2 [mm].

Next, the cutting parts (106B, 105B) of the dambars (106, 105) are cut simultaneously with a cutting die with the lead frame LF20 facing upwards, the dam bars (106, 105) are removed and the frame body 102 of the lead frame LF20 is removed as shown in FIGS. 47 and 48.

In this step, as the width of the cutting part 106B of the dam bar 106 is narrower than the width of the cutting part 105B of the dam bar 105, simultaneous cutting of the two superimposed dam bars can be easily performed.

Further, as the trailing leads for supporting the resin body 119 are not provided in the lead frame 2, the frame body 102 of the lead frame LF20 can be selectively removed by cutting the two superimposed dam bars (106, 105) in this step.

Still further, as the reinforcing lead 112 is connected to the middle part 106A of the dam bar 106, the frame body 102 of the lead frame LF20 can be selectively removed by cutting the two superimposed dam bars (106, 105) in this step.

Next, the outer lead parts of the leads 104 and leads 103 are plated to form an electrically conducting film (plating film) 114 comprising a lead (Pb)-tin (Sn) composition. The electrically conducting film 114 is formed by electroplating wherein the thickness of the film is easily controlled, and which is suitable for fine leads. Although not limited to this, electroplating may comprise a degreasing step 141, rinsing step 142, etching step 143, rinsing step 144, plating step 145, rinsing step 146, neutralizing step 147, hot water rinsing step 148 and drying step 49, as shown in FIG. 49. The degreasing step 141 is a step which uses, for example, an alkaline processing fluid (reagent) to remove impurities such as oily material adhering to the leads. The etching step 143 uses, for example, a processing fluid such as hydrofluoric acid (HF) or hydrogen peroxide ($H_2O_2$) to make the surface of the leads rough, and improve the adhesion properties of the electrically conducting film.

The plating step 145 is a process which uses, for example, a processing fluid such as an $SO_4$ compound to form the electrically conducting film on the leads. The neutralizing step 147 is a step which use an alkaline processing fluid to neutralize the electrically conducting film formed in the plating step of the preceding stage. The hot water rinsing step 148 is a step which rinses off the processing fluids of the preceding stage with pure hot water. The drying step 149 is a step which vaporizes the moisture adhering to the electrically conducting film 114 and the resin body 119. The rinsing steps 142, 144 and 146 are steps which rinse off the processing fluids of the preceding stages with pure water.

In this step, if plating is performed where the two lead frames are superimposed as in the prior art, processing fluid (reagent) from the preceding stage remains trapped between the frame bodies due to capillary action, and a large amount of processing fluid from the preceding stage will be carried over into the processing fluid (reagent) of the subsequent step. Rinsing out this processing fluid which remains between the two frames is difficult.

According to this embodiment, one of the lead frames (the frame body 102 of the lead frame LF20) of the two lead frames is removed before plating, so processing fluid from the preceding stage does not remain trapped between the two frame bodies due to capillary action. Therefore, the amount of processing fluid carried over from the preceding stage to the next stage is reduced, and plating defects due to carrying over of processing fluid are suppressed.

Moreover, since the amount of processing fluid carried over from the preceding stage to the next stage is reduced, the number of times that processing fluid has to be replaced in the next stage is also reduced.

Next, the ends of the outer lead parts of the leads 103 are cut from the frame body 101 of the lead frame LF10, the outer lead parts of the leads 103 are bent into a gull-wing lead shape which is one type of surface-mounted lead shape, and the trailing leads 111 are cut from the frame body 101 of the lead frame LF10 to effectively give the finished semiconductor device 120 shown in FIG. 26 to FIG. 30.

Subsequently, a heat cycle test which is a type of environmental test on finished products is performed on the semiconductor device 120, and the semiconductor device 120 is assembled in an electronic instrument such as a personal computer or mounted on a board in an assembly step of an electronic devices such as a memory module.

According to this embodiment, the following effects are obtained as described hereabove.

[1] In the production of the semiconductor device 120, the leads 103 and leads 104 are joined by laser welding after forming the resin body 119. Hence, as the circuit-forming surfaces (115x, 116x) of the semiconductor chip 115 and semiconductor chip 116 are covered by the resin of the resin body 119, defects of the semiconductor chips 115 and 116 produced by scattering of scattering material (hot molten material) during welding can be prevented, and consequently, the yield of the semiconductor device 120 can be improved.

Moreover, since the circuit-forming surfaces (15X, 116X) of the semiconductor chip 115 and semiconductor chip 116 are covered by the resin of the resin body 119, surface deterioration of the semiconductor chips 115 and 116 due to adhesion of out gas which occurs during soldering and the decline of adhesive strength between the semiconductor chips (115, 116) and the resin of the resin body 119, can be suppressed. As a result, peeling due to thermal stress resulting from the difference of thermal expansion coefficients of the semiconductor chips (115, 116) and the resin of the resin body 119, accumulation of moisture in the resin of the resin body 119, vaporization and expansion of the accumulated moisture due to heat in heat cycle tests, which are environmental tests on the finished product, or to solder reflow heat when the device is soldered to a printed circuit board, and resultant cracking of the resin body 119, are prevented, so the reliability of the semiconductor device 120 is improved.

Moreover, in joining by laser welding, the join parts of the leads 103 and the leads 104 are maintained close to each other by the resin body 119, so there is no need to restrain the leads 103 and leads 104 with a fixing tool. Consequently, the productivity of the semiconductor device 120 is improved.

[2] In producing the semiconductor device 120, laser welding is performed at a position distant from the resin body 119, so irradiation of the laser light to the resin body 119 due to the variation of positioning accuracy is prevented. Consequently, poor appearance of the resin body 119 due to scatter in positioning accuracy during laser welding is prevented, and the yield of the semiconductor device 120 is improved.

[3] In producing the semiconductor device 120, laser welding is performed at the ends of the outer lead parts of the leads 104. The joining of the leads 104 and the leads 103 can therefore be visually checked, and destructive tests such as peeling away the joins of the leads 104 and leads 103 to check the joining state are unnecessary. Consequently, the productivity of the semiconductor device 120 can be improved.

[4] In producing the semiconductor device 120, the frame body 102 of the lead frame LF20 is removed after forming the resin body 119 but before plating the outer lead parts of the leads 103 and 104. Hence, when plating of the outer lead parts of the leads 103 and leads 104 is performed, the amount of processing fluid (reagent) carried over from the preceding stage into the next stage is reduced, and defective plating due to carrying over processing fluid is suppressed. As a result, the yield of the semiconductor device 120 is improved.

Moreover, as the amount of processing fluid (reagent) of the preceding stage carried over into the next stage is suppressed, the number of times the processing fluid of the next stage has to be replaced, is reduced, and consequently, productivity of the semiconductor device 120 is improved.

[5] In producing the semiconductor device 120, trailing leads for supporting the resin body 119 are not provided. Therefore, there are no adjacent surfaces of two trailing leads superimposed inside the resin body 119, and moisture does not penetrate inside the resin body 119 from outside via adjacent surfaces of trailing leads. This suppresses corrosion of the connections of the electrodes (BP1, BP2) of the semiconductor chips (115, 116) and the wires (117, 118), and the connections of the inner lead parts of the leads (103, 104) and wires (117, 118), and consequently, the reliability of the semiconductor device 120 is improved.

Also, as trailing leads are not provided for supporting the resin body 119 inside the lead frame LF20, the frame body 102 of the lead frame LF20 can be selectively removed by cutting the dam bar 106.

[6] In producing the semiconductor device 120, the lead frame LF20 comprises the reinforcing lead 112. Hence, when the lead frame LF20 is transported in a subsequent step after bonding the inner lead parts of the leads 104 of the lead frame LF20 to the circuit-forming surface 116X of the semiconductor chip 116, wobbling of the semiconductor chip 116 causing it to fall out of the lead frame LF20 is suppressed, and as a result, the yield of the semiconductor device 120 is improved.

[7] In producing the semiconductor device 120, the reinforcing lead 112 of the lead frame LF20 is supported by the middle part 106A of the dam bar 106, and the frame body 102. Hence, the frame body 102 of the lead frame LF20 can be selectively removed by cutting the cutting part 106B of the dam bar 106.

[8] In producing the semiconductor device 120, the width of the cutting part 106B of the dam bar 106 of the lead frame LF20 is narrower than the width of the cutting part 105B of the dam bar 105 of the lead frame LF10, so simultaneous cutting of the two superimposed dam bars (106, 105) can be performed easily.

[9] In producing the semiconductor device 120, the width of middle part 106A of the dam bar 106 of the lead frame LF20 is larger than the width of the middle part 105A of the dam bar 105 of the lead frame LF10. Hence, when forming the resin body 119, the contact area of the middle part 106A of the dam bar 106 and clamp surface 123B of the mold 122 is larger than the contact area of the middle part 105A of the dam bar 105 and clamp surface 123A of the mold 122. This means that even if the width of the cutting part 106B of the dam bar 106 is made narrower than the width of the cutting part 105B of the dam bar 105 so as to easily cut the two dam bars which are superimposed, the contact area of the dam bar 106 and clamp surface 122B of the mold 122 is maintained, and the two dam bars (105, 106) superimposed between the clamp surface 23A and clamp surface 123B of the mold 122 are firmly fixed. Therefore, even if a pressure higher than the injection pressure acts on the dam bar 105 and the dam bar 106 toward the outside from the cavity 124 during resin injection, deforming of the dam bar 106 which has the narrow cutting part 106B toward the outside of the cavity 124 is prevented, and defects in the resin body 119 due to leakage to the outside of the cavity 124 via the gap between the dam bar 105 and dam bar 106 is definitively prevented. As a result, the yield of the semiconductor device 120 is improved.

[10] In producing the semiconductor device 120, the middle part 106A of the dam bar 106 of the lead frame LF20 is supported in the frame body 102 via the reinforcing lead 112, so the same effect as that of [9] above is obtained.

[11] In the semiconductor device 120, the semiconductor chip 115 and the semiconductor chip 116 are laminated with their lower surfaces superimposed. The leads 103 comprise a first part 103A which crosses one side of the semiconductor chip 115 and extends over the circuit-forming surface 115X, a second part 103B which bends from this first part 103A towards the lower surface of the semiconductor chip 115, and a third part 103C which extends from the second part 103B in the same direction as the first part 103A. The leads 104 comprise a first part 104A which crosses one side of the semiconductor chip 116 and extends over the circuit-forming surface 116X, a second part 104B which bends from this first part 104A towards the lower surface of the semiconductor chip 116, and a third part 104C which extends from the second part 104B in the same direction as the first part 104A. Also, the third parts (103C and 104C) of the leads 103 and the leads 104 extend inside and outside the resin body 119, and overlap with each other.

Due to this construction, the leads 103 and leads 104 are branched inside a resin body 119, and the adjacent surfaces of the leads 103 and leads 104 do not reach the semiconductor chips (115, 116), so moisture cannot penetrate deeply inside the resin body 119 from outside via the adjacent surfaces of the leads 103 and leads 104. As a result, corrosion of the connections of the electrodes (BP1, BP2) of the semiconductor chips (115, 116) to the wires (117, 118), and of the inner lead parts of the leads (103, 104) to the wires (117, 118), is suppressed, so reliability of the semiconductor device 120 is improved.

[12] In the semiconductor device 120, the ends of the first parts 103A of the leads 103 are disposed near the electrodes BP1 formed in the center of the circuit-forming surface 115X of the semiconductor chip 115, and the ends of the first parts 104A of the leads 104 are disposed near the electrodes BP2 formed in the center of the circuit-forming surface 116X of the semiconductor chip 116.

Hence, the length of the wires (117, 118) can be shortened compared to the case where the electrodes formed in the center of the circuit-forming surface of the semiconductor chip are electrically connected to the ends of the leads outside the semiconductor chip by wires, and wire flow is suppressed when the resin body 119 is formed in the cavity 124 of the mold 122 by pressure injection of resin. As a result, shorting of adjacent wires is suppressed, and the yield of the semiconductor device 120 is improved.

[13] In the semiconductor device 120, plural electrodes (BP1, BP2) are arranged in the direction of a long side in the center of the circuit-forming surface (115X, 116X) of the semiconductor chip 115 and the semiconductor chip 116.

Due to this construction, electrodes of the semiconductor chips 115 and 116 having identical functions are arranged opposite even if the semiconductor chips 115 and 116 are laminated with their lower surfaces facing each other. The leads 103 electrically connected to the electrodes BP1 (for example, the electrode to which the address signal A0 is applied) of the semiconductor chip 115, and the leads 104 electrically connected to the electrodes BP2 (for example, the electrode to which the address signal A0 is applied) of the semiconductor chip 116, can be easily joined together.

Therefore, there is no need that one of the semiconductor chips 115, 116 is a semiconductor chip with a mirror inverted circuit pattern, so the semiconductor device 120 can be provided at low cost.

According to this embodiment, the case was described where the leads 103 and leads 104 were laser welded by irradiating with laser light from above the leads 104, however the laser light can be irradiated from above the leads 103 although it is difficult to perform laser welding while checking the steps between the leads 103 and leads 104.

Moreover, according to this embodiment, the case was described using a lead frame comprising an Fe—Ni alloy, but a lead frame comprising a copper (Cu) alloy which has excellent electrical conductivity can also be used. In this case, Cu alloy has a higher thermal conductivity than Fe—Ni alloy and the reflectivity of laser light is also high, so welding time is longer than when using Fe—Ni alloy, but if the output of the laser light is increased, welding can be performed with no particular problem.

According to this embodiment, the case was described where a YAG laser device was used, however other laser devices may be used if they can weld the leads 103, 104.

According to this embodiment, the case was described where this invention was applied to a semiconductor device 120 wherein the semiconductor chips 115, 116 were laminated with their lower surfaces opposing each other, and both of the semiconductor chips 115, 116 were sealed by one resin body 119. However, it may be applied also to a semiconductor device wherein the two semiconductor chips are laminated with their circuit-forming surfaces opposing each other, and the two chips then sealed by the resin body.

(Embodiment 5)

Figure 50:
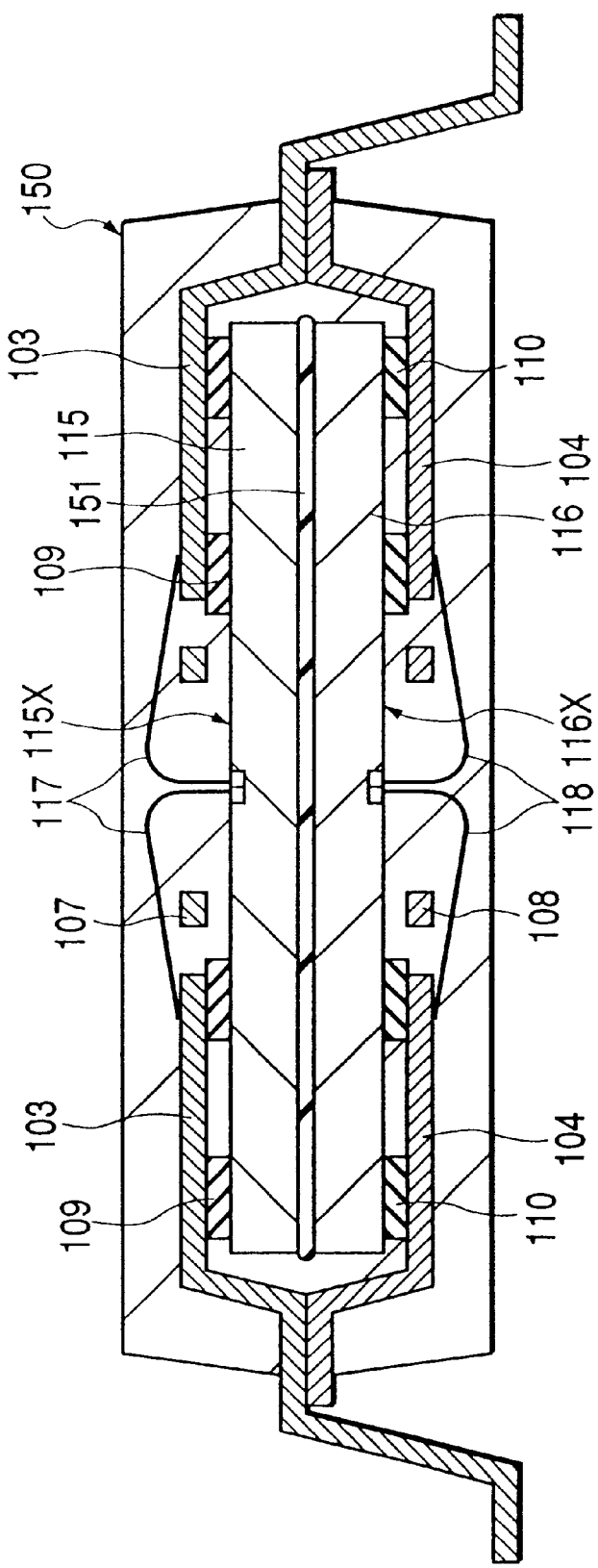
FIG. 50 is a sectional view of a semiconductor device according to a fifth embodiment of this invention.

FIG. 50 is a sectional view of a TSOP type semiconductor device according to a second embodiment of this invention.

As shown in FIG. 50, a semiconductor device 150 of this embodiment basically has the same structure as that of the above-mentioned fourth embodiment, but it differs in the following characteristics.

Specifically, a damper 151 is filled between the lower surface of the semiconductor chip 115, and the lower surface of the semiconductor chip 116. The damper 151 may be, for example, a resin film comprising an adhesive layer of polyimide resin formed on both sides (upper surface and lower surface) of a resin substrate of polyimide resin.

The semiconductor chips 115 and 116 have a structure essentially comprising a semiconductor substrate A1, a multi-interconnection layer A2 comprising plural insulating layers and interconnection layers stacked on the circuit-forming surface of this semiconductor substrate A1, and a surface protecting layer A3 formed so as to cover this multi-interconnection layer as shown in FIG. 31, so the lower surfaces of the semiconductor chips 115, 116 are warped in a convex direction. When these miconductor chips 115 and 116 are laminated with their lower surfaces superimposed, a gap is formed between the semiconductor chip 115 and the semiconductor chip 116 which gradually widens from the center of the chip towards the periphery. This gap can be eliminated by superimposing the semiconductor chips 115, 116 with the damper 151, which easily deforms under a relatively small tightening force, interposed between them. If the gap is eliminated, no spaces occur between the semiconductor chips 115, 116 due to the filler mixed with the resin when the resin body 119 is formed by the transfer molding method, therefore cracking of the semiconductor chips (115, 116) originating from the spaces is prevented.

A space must be left to fill the gap between the lower surface of the semiconductor chip 115 and the lower surface of the semiconductor chip 116 with the damper 151, and this increases the thickness of the resin body 119, however according to this embodiment, the semiconductor chips 115 and 116 are made thinner, so the increase in the thickness of the resin body 119 is suppressed.

Hereafter, the method of producing a semiconductor device 150 will be described using FIG. 51 to FIG. 53.

FIG. 51 is a sectional view of essential parts for describing a wire bonding step, FIG. 52 is a sectional view of essential parts showing the first and second lead frames superimposed, and FIG. 53 is a sectional view of essential parts for describing a sealing step.

First, the semiconductor chip 115 and semiconductor chip 116 having an identical structure are provided, and the lead frame LF10 shown in FIG. 32 and the lead frame LF20 shown in FIG. 34 are provided.

Next, the semiconductor chip 115 is bonded to the lead frame LF10, and the semiconductor chip 116 is bonded to the lead frame LF20.

Next, the electrodes BP1 of the semiconductor chip 115 and the wire connecting parts (ends) of the inner lead parts of the leads 103 are electrically connected by the electrically conducting wires 117, the electrodes BP1 of the semiconductor chip 115 and the branch leads of the bus bar lead 107 are electrically connected by the electrically conducting wires 117, the electrodes BP2 of the semiconductor chip 116 and the wire connecting parts (ends) of the inner lead parts of the leads 104 are electrically connected by the electrically conducting wires 118, and the electrodes BP2 of the semiconductor chip 116 and the branch leads of the bus bar lead 108 are electrically connected by the electrically conducting wires 118.

In this step, the thickness of the semiconductor chips 115 and 116 is less than in the case of the above-mentioned fourth embodiment, so a step 152A is left between the chip mounting part and the lead mounting part of a heat stage 152, as shown in FIG. 51, by the amount that the thickness of the semiconductor chips 115, 116 was reduced. Due to this, the lower surfaces of the semiconductor chips 115, 116 can be brought in contact with the third parts (103C, 104C) of the leads (103, 104).

Next, the lead frames LF10 and LF20 are superimposed so that the lower surfaces of the semiconductor chip 115 and the semiconductor chip 116 face each other. The lead frames LF10 and LF20 are superimposed with a damper 151, which deforms under a relatively small tightening force, interposed between the semiconductor chip 115 and the semiconductor chip 116. The damper 151 may be, for example, a resin film comprising an adhesive layer of polyimide resin formed on both sides (upper surface and lower surface) of a resin substrate of polyimide resin.

In this step, the gap formed due to the curvature of the semiconductor chips 115 and 116 is filled by the damper 151, so the gap between the semiconductor chip 115 and semiconductor chip 116 is eliminated. FIG. 52 shows a state where the lead frames LF10 and LF20 are superimposed.

Next, the lead frames LF10 and LF20 are positioned between the upper die 122A and lower die 122B of the mold 122 of the transfer mold device. At this time, the semiconductor chips (115, 116), inner lead parts of the leads 103, inner lead parts of the leads 104, films (109, 110), wires (117, 118) and trailing leads 111 are disposed inside the cavity 124 formed by the upper die 122A and lower die 122B.

Next, a fluid resin is pressure injected into the cavity 124 via the runner and inflow gate from the pot of the mold 122 so as to form the resin body 119. The semiconductor chips (115, 116), inner lead parts of the leads 103, inner lead parts of the leads 104, films (109, 110), wires (117, 118) and the trailing leads 111 are thereby sealed by the resin body 119. The resin may be, for example, a thermosetting epoxy resin to which a phenolic curing agent, silicone rubber and a filler have been added.

In this step, the gap between the lower surface of the semiconductor chip 115 and the lower surface of the semiconductor chip 116 is filled by the damper 151, so the resin of the resin body 119 does not penetrate between the lower surface of the semiconductor chip 115 and the lower surface of the semiconductor chip 116. As spaces between the semiconductor chip 115 and 116 due to the filler mixed with the resin do not occur, cracking of the semiconductor chips (115, 116), originating from such spaces when a pressure higher than the injection pressure (e.g., about 60 kg/cm$^2$) is applied after completing injection of the resin into the cavity 124 to remove air bubbles in the resin, is prevented.

Subsequently, the semiconductor device 50 shown in FIG. 50 is effectively finished by performing the same steps as in the above-mentioned fourth embodiment.

In this way, in producing the semiconductor device 50, the semiconductor chip 115, semiconductor chip 116, inner lead parts of the leads 103, inner lead parts of the leads 104 and wires (117, 118) are disposed in the cavity 124 of the mold 122 with the damper 151 between the lower surface of the semiconductor chip 115 and the lower surface of the semiconductor chip 116, and resin is pressure injected into the cavity 124 to form the resin body 119.

As the gap between the lower surface of the semiconductor chip 115 and the lower surface of the semiconductor chip 116 is filled by the damper, the resin of the resin body 119 does not penetrate between the lower surface of the semiconductor chip 115 and the lower surface of the semiconductor chip 116. Therefore, spaces between the semiconductor chip 115, 116 due to the filler mixed with the resin do not occur, and cracking of the semiconductor chips (115, 116), originating from such spaces when a pressure higher than the injection pressure is applied after completing injection of the resin into the cavity 124 to remove air bubbles in the resin, is prevented. As a result, the yield of the semiconductor device 150 is improved.

(Embodiment 6)

Figure 54:
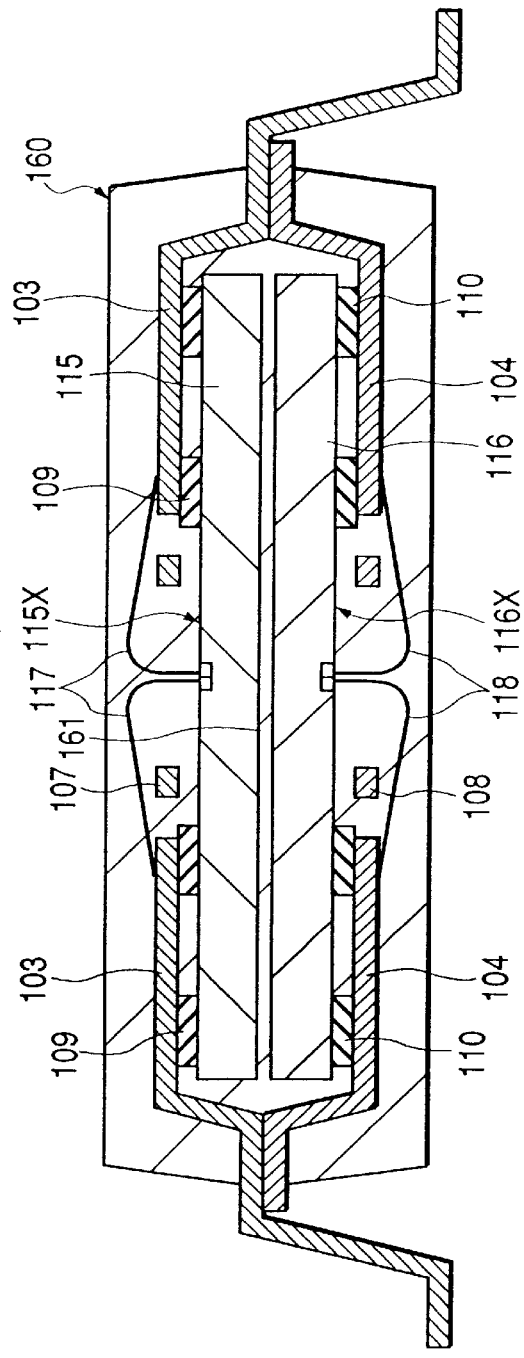
FIG. 54 is a sectional view of a semiconductor device according to a sixth embodiment of this invention.

FIG. 54 is a sectional view of a TSOP type semiconductor device according to the third embodiment of this invention. As shown in FIG. 54, a semiconductor device 160 of this embodiment basically has the same structure as that of the above-mentioned fourth embodiment, but differs in the following characteristics.

Specifically, the semiconductor chip 115 and semiconductor chip 116 are laminated leaving a space 161 between the lower surface of the semiconductor chip 115 and lower surface of the semiconductor chip 116, and the space 161 is filled with the resin of the resin body 119. A large number of fillers are mixed with the resin of the resin body 119 in order to attain low stress. By leaving the space 161 larger than the maximum particle diameter of the fillers between the lower surface of the semiconductor chip 115 and the lower surface of the semiconductor chip 116, flow of resin improves when forming the resin body based on the transfer molding method, so spaces due to the fillers mixed in the resin are not formed between the semiconductor chips 115 and 116.

Due to the space 161 between the lower surface of the semiconductor chip 115 and the lower surface of the semiconductor chip 116, the resin body 119 becomes thicker, however according to this embodiment, as in the aforesaid second embodiment, increase in the thickness of the resin body is suppressed by making the semiconductor chips 115, 116 thinner.

Next, the method of producing the semiconductor device 160 will be described referring to FIG. 55 and FIG. 56.

Figure 55:
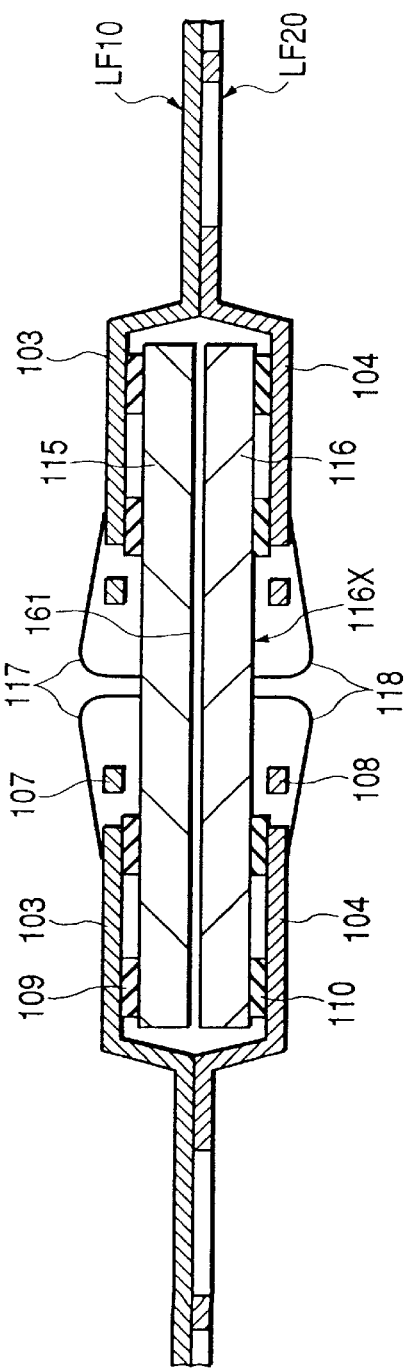
FIG. 55 is a sectional view of essential parts showing a state where first and second lead frames are superimposed in the production of the semiconductor device according to the sixth embodiment of this invention.
Figure 56:
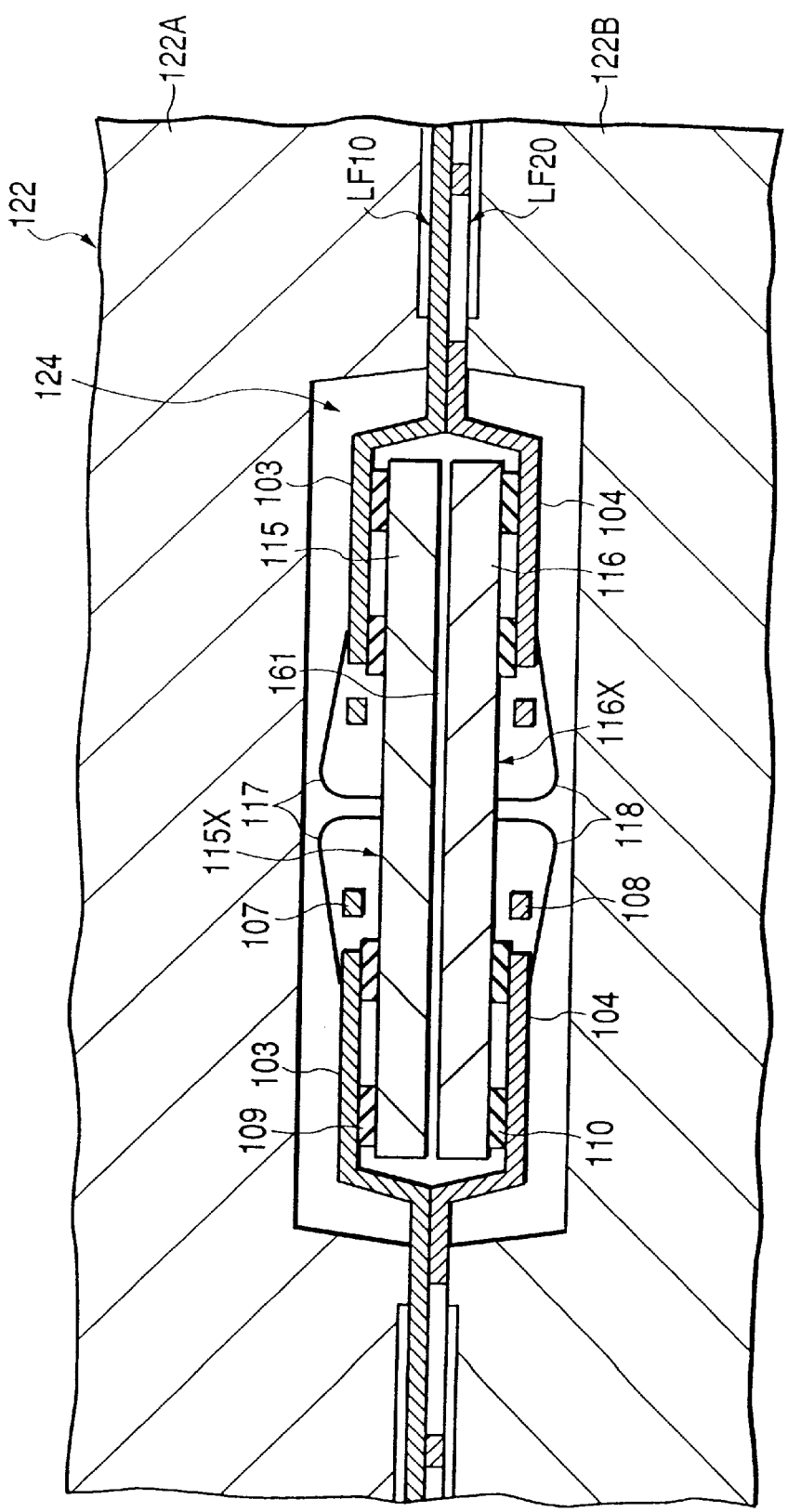
FIG. 56 is a sectional view of essential parts for the purpose of describing a sealing step in the production of the semiconductor device according to the sixth embodiment of this invention.
Figure 57:
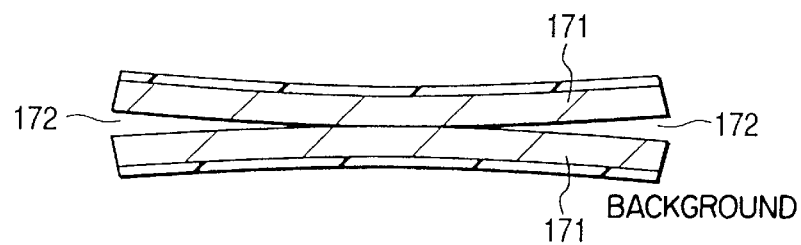
FIG. 57 is a sectional view for the purpose of describing problems in the prior art.
Figure 58:
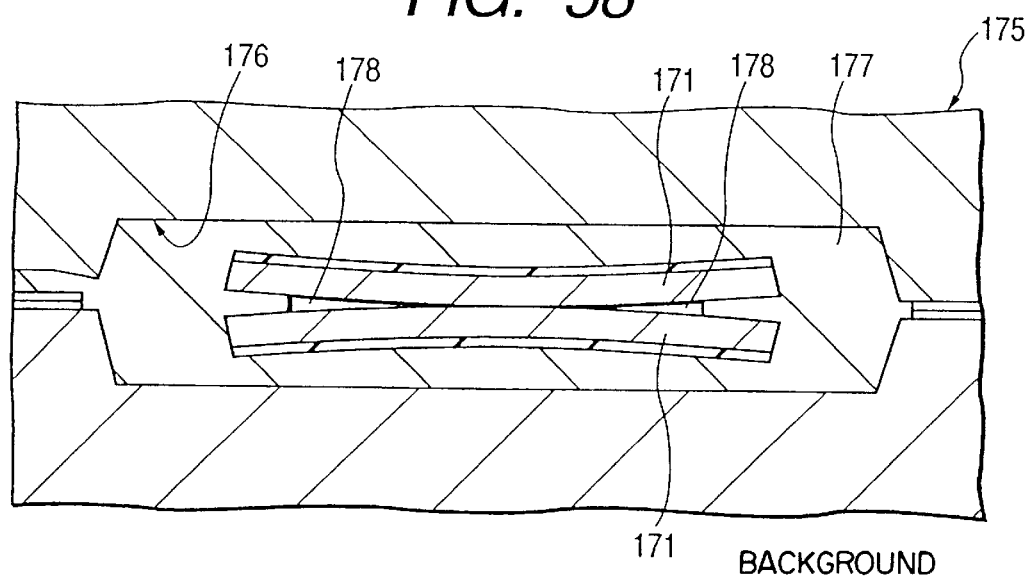
FIG. 58 is a sectional view for the purpose of describing problems in the prior art.

FIG. 55 is a sectional view of essential parts showing the state where the first and second lead frames are superimposed, and FIG. 56 is a sectional view of essential parts for describing a sealing step.

First, the semiconductor chip 115 and the semiconductor chip 116 of identical construction are provided, and the lead frame LF10 shown in FIG. 32 and the lead frame LF20 shown in FIG. 34 are provided.

Next, the semiconductor chip 115 is bonded to the lead frame LF10, and the semiconductor chip 116 is bonded to the lead frame LF20.

Next, the electrodes BP1 of the semiconductor chip 115 and the wire connecting parts (ends) of the inner lead parts of the leads 103 are electrically connected by the electrically conducting wires 117, the electrodes BP1 of the semiconductor chip 115 and the branch leads of the bus bar lead 107 are electrically connected by the electrically conducting wires 117, the electrodes BP2 of the semiconductor chip 116 and the wire connecting parts (ends) of the inner lead parts of the leads 104 are electrically connected by the electrically conducting wires 118, and the electrodes BP2 of the semiconductor chip 116 and the branch leads of the bus bar lead 108 are electrically connected by the electrically conducting wires 118.

In this step, as the thickness of the semiconductor chips 115, 116 is thinner than in the case of the above-mentioned fourth embodiment, the step 152A is left between the chip mounting part and the lead mounting part of the heat stage 152, as shown in FIG. 51, by the amount that the thickness of the semiconductor chips 115, 116 was reduced. Due to this, the lower surfaces of the semiconductor chips 115, 116 can be brought in contact with the third parts (103C, 104C) of the leads (103, 104).

Next, the lead frames LF10 and LF20 are superimposed so that the lower surfaces of the semiconductor chip 115 and the semiconductor chip 116 face each other. The lead frames LF10 and LF20 are superimposed leaving the space 161 between the semiconductor chips 115 and 116, as shown in FIG. 55. The space 161 is wider than the particle diameter of the fillers mixed with the resin used to form the resin body. According to this embodiment, a thermosetting epoxy resin is used with which a large number of fillers of average particle diameter 3 to 5 $\mu$m and maximum particle diameter 25 $\mu$m are mixed, so the space 161 is made wider than the maximum particle diameter of these fillers.

As the semiconductor chips 115, 116 are curved in such a direction that their lower surfaces are convex, when the semiconductor chips 115, 116 are superimposed with their lower surfaces facing each other, the gap between the semiconductor chips 115, 116 is narrowest between the center part of the semiconductor chip 115 and the center part of the semiconductor chip 116, so the gap 161 between the center part of the lower surface of the semiconductor chip 115 and the center part of the lower surface of the semiconductor chip 116 must be made larger than the maximum particle diameter of the fillers.

Next, the lead frames LF10 and LF20 are positioned between the upper die 122A and lower die 122B of the mold 122 of the transfer mold device with the lead frames LF10, LF20 superimposed, as shown in FIG. 55. At this time, the semiconductor chips (115, 116), inner lead parts of the leads 103, inner lead parts of the leads 104, films (109, 110), wires (117, 118) and trailing leads 111 are disposed inside the cavity 124 formed by the upper die 122A and lower die 122B.

Next, a fluid resin is pressure injected into the cavity 124 via the runner and inflow gate from the pot of the mold 122 so as to form the resin body 119. The semiconductor chips (115, 116), inner lead parts of the leads 103, inner lead parts of the leads 104, films (109,110), wires (117, 118) and trailing leads 111 are sealed by the resin body 119.

In this step, as the spacing 161 larger than the maximum particle diameter of the fillers mixed with the resin is left between the lower surface of the semiconductor chip 115 and the lower surface of the semiconductor chip 116, spaces between the semiconductor chips 115, 116 do not occur due to the fillers. Therefore, when a pressure higher than the injection pressure is applied after completing injection of the resin into the cavity 124 in order to remove air bubbles trapped in the resin, cracking of the semiconductor chips (115, 116) originating in the spaces can be prevented.

Subsequently, the semiconductor device 160 shown in FIG. 54 is effectively finished by the same process as in the above-mentioned fourth embodiment.

Hence, in producing the semiconductor device 160, the semiconductor chip 115, semiconductor chip 116, inner leads of the leads 103, inner leads of the leads 104 and wires (117, 118) are disposed in the cavity 124 of the mold 122 leaving the spacing 161 which is larger than the maximum particle diameter of the fillers between the lower surface of the semiconductor chip 115 and the lower surface of the semiconductor chip 116, and then resin containing a large number of fillers is pressure injected into the cavity 124 to form the resin body 119.

As resin passes easily between the lower surface of the semiconductor chip 115 and the lower surface of the semiconductor chip 116, spaces due to fillers mixed with the resin do not occur between the semiconductor chips 115 and 116. Therefore, when a pressure higher than the injection pressure is applied after completing injection of the resin into the cavity 124 in order to remove air bubbles trapped in the resin, cracking of the semiconductor chips (115, 116) originating in the spaces can be prevented, and as a result, the yield of the semiconductor device 160 is improved.

In the fifth and sixth embodiments, cases were described where the semiconductor chips 115, 116 were made thinner so as to leave a gap between the lower surface of the semiconductor chip 115 and the lower surface of the semiconductor chip 116, however a gap can be left between the lower surface of the semiconductor chip 115 and the lower surface of the semiconductor chip 116 also by bending the leads 103 and the leads 104.

The invention conceived by the inventor has been described in detail based on the aforesaid embodiments, however it will be understood that the invention is not limited to the aforesaid embodiments, various modifications being possible within the scope and spirit of the appended claims.

For example, this invention may be applied to a semiconductor device such as a SIP (Single In-Line Package) or ZIP (Zigzag In-Line Package) wherein the leads are arranged in one direction.

This invention may also be applied to a semiconductor device such as a SOJ (Small Out-line J-leaded Package) or SOP (Small Out-line Package) wherein the leads are arranged in two directions.

Further, this invention maybe applied to a semiconductor device such as a QFP (Quad Flatpack Package) or QFJ (Quad Flatpack J-Leaded Package) wherein the leads are arranged in four directions.

What is claimed is:

1. A method of producing a semiconductor device comprising the steps of:

providing first and second semiconductor chips each having a main surface comprising a semiconductor element and a plurality of external terminals, and a lower surface opposing said main surface, wherein said first and second semiconductor chips are warped, providing a first lead frame comprising outer portions and inner portions extending from said outer portions, and a second lead frame comprising outer portions and inner portions extending from said outer portions, fixing the main surface of said first semiconductor chip to the inner portions of said first lead frame, electrically connecting the plurality of external terminals of said first semiconductor chip to the inner portions of said first lead frame, fixing the main surface of said second semiconductor chip to the inner portions of said second lead frame, and electrically connecting the plurality of external terminals of said second semiconductor chip to the inner portions of said second lead frame, disposing said first and second semiconductor chips, and the inner portions of said first lead frame and said second lead frame, within the interior of a mold cavity such that the lower surfaces of said first and second semiconductor chips are facing each other, and pressure injecting a resin comprising a mixture of fillers into said mold cavity so as to form a seal, wherein:

a gap between the lower surface of said first semiconductor chip and the lower surface of said second semiconductor chip is maintained wider than a diameter of a largest particle of said fillers.

2. A method of producing a semiconductor device according to claim 1, wherein, in the steps of electrically connecting an external terminal of the first semiconductor chip to an inner portion of the first lead frame and electrically connecting an external terminal of the second semiconductor chip to an inner portion of the second lead frame, the electrical connections between said first and second semiconductor chips, and the inner portions of said first and second lead frames, are made by electrically conducting wires.

3. A method of producing a semiconductor device comprising the steps of:

providing first and second semiconductor chips each having a main surface comprising a semiconductor element and a plurality of external terminals, and a lower surface opposing said main surface, wherein said first and second semiconductor chips are warped, providing a first lead frame comprising outer portions and inner portions extending from said outer portions, and a second lead frame comprising outer portions and inner portions extending from said outer portions, fixing the main surface of said first semiconductor chip to the inner portions of said first lead frame, electrically connecting the plurality of external terminals of said first semiconductor chip to the inner portions of said first lead frame, fixing the main surface of said second semiconductor chip to the inner portions of said second lead frame, and electrically connecting the plurality of external terminals of said second semiconductor chip to the inner portions of said second lead frame, disposing said first and second semiconductor chips, and the inner portions of said first lead frame and said second lead frame, within the interior of a mold cavity such that the lower surfaces of said first and second semiconductor chips are facing each other, and pressure injecting a resin comprising a mixture of fillers into said mold cavity so as to form a seal, wherein:

a damping material is provided between the lower surfaces of the first and second semiconductor chips, in the step of disposing said first and second semiconductor chips, and the inner portions of said first lead frame and said second lead frame, within the interior of the mold cavity.

4. A method of producing a semiconductor device according to claim 3, wherein said damping material is a resin film.

* * * * *